(12) United States Patent
Kunita

(10) Patent No.: US 6,875,557 B2
(45) Date of Patent: Apr. 5, 2005

(54) PLATE-MAKING METHOD OF PRINTING PLATE

(75) Inventor: Kazuto Kunita, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 27 days.

(21) Appl. No.: 10/230,088

(22) Filed: Aug. 29, 2002

(65) Prior Publication Data

US 2003/0190554 A1 Oct. 9, 2003

(30) Foreign Application Priority Data

Aug. 29, 2001 (JP) ..................................... P. 2001-259725
Aug. 29, 2001 (JP) ..................................... P. 2001-259726

(51) Int. Cl.⁷ ............................ G03F 7/027; G03F 7/09; G03F 7/32
(52) U.S. Cl. .................... 430/302; 430/288.1; 430/306; 430/927
(58) Field of Search .............................. 430/288.1, 302, 430/306, 927

(56) References Cited

U.S. PATENT DOCUMENTS

| 4,530,747 A | | 7/1985 | Dönges et al. |
| 5,738,971 A | * | 4/1998 | Suzuki et al. ............ 430/288.1 |

FOREIGN PATENT DOCUMENTS

| EP | 1 091 247 A2 | 4/2001 |
| EP | 1 096 314 A1 | 5/2001 |
| FR | 2 454 642 A | 11/1980 |
| GB | 1 532 196 A | 11/1978 |
| JP | 02 161441 A | 6/1990 |
| JP | 04 122941 A | 4/1992 |

\* cited by examiner

Primary Examiner—Richard L. Schilling
(74) Attorney, Agent, or Firm—Burns, Doane, Swecker & Mathis, L.L.P.

(57) ABSTRACT

A plate-making method of a printing plate comprising exposing a printing plate precursor having a photosensitive layer comprising a photopolymerizable composition containing (i) a crosslinking agent having two ethylenic polymerizable groups and (ii) a crosslinking agent having three or more ethylenic polymerizable groups, and development processing the exposed printing plate precursor with an alkali developer having a pH of not more than 12.5.

31 Claims, No Drawings

PLATE-MAKING METHOD OF PRINTING PLATE

FIELD OF THE INVENTION

The present invention relates to a plate-making method of a printing plate. More particularly, it relates to a plate-making method using a printing plate precursor for a lithographic printing plate or a letterpress printing plate, which can be used in a so-called direct plate-making method wherein a printing plate is directly prepared based on digital signal, for example, from a computer using various kinds of lasers, and a developer in combination.

BACKGROUND OF THE INVENTION

A solid laser, semiconductor laser and gas laser having a large output and a small size, which radiate an ultraviolet ray, visible light or infrared ray having a wavelength of from 300 to 1,200 nm, have become easily available, and these lasers are very advantageous for a recording light source used in the direct plate-making based on digital signal, for example, from a computer.

Various investigations on recording materials sensitive to such laser beams have been made. Representative examples of the recording material include first recording materials capable of being recorded with an infrared laser having a wavelength of not less than 760 nm, for example, positive working recording materials as described in U.S. Pat. No. 4,708,925 and negative working recording materials of acid catalyst crosslinking type described in JP-A-8-276558 (the term "JP-A" as used herein means an "unexamined published Japanese patent application"), and second recording materials responsive to an ultraviolet ray or visible light laser having a wavelength of from 300 to 700 nm, for example, negative working recording materials of radical polymerization type as described in U.S. Pat. No. 2,850,445 and JP-B-44-20189 (the term "JP-B" as used herein means an "examined Japanese patent publication").

On the other hand, recording materials responsive to light having a short wavelength of not more than 300 nm are especially important for photoresist materials. In recent years, the degree of integration is more and more increased in integrated circuits, and the fabrication of super-fine patterns composed of lines having a width of finer than a half micron has been required in the production of semiconductor substrate, for example, VLSI. In order to fulfill such requirements, the wavelength of light source for an exposure apparatus used in photolithography is more and more shortened and the use of a far ultraviolet ray or an excimer laser (e.g., XeCl, KrF or ArF) has been investigated. Further, the formation of super-fine patterns by an electron beam has been started to investigate. Particularly, the electron beam is regarded as a promising light source for the next generation pattern formation techniques.

A problem common to all of these image recording materials is that how much an ON-OFF of the image can be enlarged in the exposed area with various kinds of energy and unexposed area. In other words, how a balance between high sensitivity and good preservation stability of the image recording material can be achieved.

In order to resolve the problem, it is known to use various high sensitive photo-radical polymerizable compositions. In particular, photo-radical polymerizable compositions comprising a radical polymerizable crosslinking agent and a polymer binder are applied to printing plates such as lithographic printing plates and letterpress printing plates.

As the radical polymerizable crosslinking agent, a polyfunctional crosslinking agent having at least two polymerizable groups in its molecule is ordinarily employed in order to enhance crosslinking efficiency. Although an image recording material containing such a polyfunctional crosslinking agent exhibits high sensitivity, the crosslinking agent tends to crystallize in case of using the solid compound or a phenomenon, for example, surface tackiness of the recording material occurs in case of using the liquid compound because of oozing thereof onto the surface, when the recording material is allowed to stand under high temperature and high humidity conditions. Therefore, techniques to further improve preservation stability of the recording material have been desired.

With respect to a printing plate, durability (printing durability) of the printing plate at printing is an extremely important factor. The printing durability is widely varied depending on a photosensitive layer, specifically, the kind of a photo-radical polymerizable composition used, and is largely dominated by the degree of crosslinking after exposure and the hardness of crosslinked film obtained. As a result of recent investigations, it is reported that a factor of the decrease in hardness of crosslinked film due to penetration of developer into the crosslinked film is also important.

SUMMARY OF THE INVENTION

Therefore, an object of the present invention is to provide a printing plate precursor having a photosensitive layer comprising a polymerizable composition satisfying both high sensitivity and excellent preservation stability, among photo-radical polymerizable compositions that are promising in image forming techniques due to the highest sensitivity, and a plate-making method of a printing plate using the printing plate precursor.

Another object of the present invention is to provide a plate-making method of a printing plate using a printing plate precursor capable of performing direct plate-making based on digital data, for example, from a computer by recording using a solid laser or semiconductor laser radiating an ultraviolet ray, visible light or infrared ray.

Other objects of the present invention will become apparent from the following description.

As a result of the intensive investigations, it has been found that a printing plate obtained by using a photo-radical polymerizable composition comprising a mixture of crosslinking agents and a developer in combination meets the requirements of high sensitivity, preservation stability and good printing durability.

Specifically, the present invention includes the following items.

(1) A plate-making method of a printing plate comprising exposing a printing plate precursor having a photosensitive layer comprising a photopolymerizable composition containing (i) a crosslinking agent having two ethylenic polymerizable groups and (ii) a crosslinking agent having three or more ethylenic polymerizable groups, and development processing the exposed printing plate precursor with an alkali developer having a pH of not more than 12.5.

(2) A plate-making method of a printing plate comprising exposing a printing plate precursor having a photosensitive layer comprising a photopolymerizable composition containing (i) a crosslinking agent having two ethylenic polymerizable groups, (ii) a crosslinking agent having three ethylenic polymerizable groups and (iii) a crosslinking agent having 4 to 8 ethylenic polymerizable groups and satisfying a ratio of the crosslinking agents represented by formulae (A) and (B) shown below, and development processing the exposed printing plate precursor with an alkali developer having a pH of not more than 12.5.

$$a+b+c=100 \quad (A)$$

$$0.4 \leq a/(b+c) \leq 3.0 \quad (B)$$

wherein a represents % by weight of the crosslinking agent of (i), b represents % by weight of the crosslinking agent of (ii), and c represents % by weight of the crosslinking agent of (iii).

(3) The plate-making method of a printing plate as described in item (1) or (2) above, wherein the crosslinking agent of (i) is a compound represented by the following formula (I):

$$Q^1\text{-}R\text{-}Q^2 \quad (I)$$

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—).

(4) The plate-making method of a printing plate as described in item (3) above, wherein $Q^1$ and $Q^2$ in formula (I) each independently represent a group represented by formula (a) or (b) shown below, and R in formula (I) represents a linking group represented by formula (c) shown below.

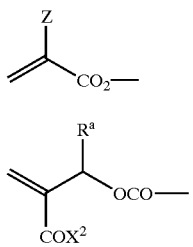

$$-R^1\text{-}T^1\text{-}R^2\text{-}T^2\text{-}R^3\text{-}T^3\text{-}R^4\text{-}T^4\text{-}R^5- \quad (c)$$

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —$CO_2$—, —CO—, —$OCO_2$— or a single bond, provided that all of $T^1$ to $T^4$ do not represent single bonds, and $R^a$ and $R^b$ each independently represent a hydrogen atom or a hydrocarbon group.

(5) A photopolymerizable composition containing a crosslinking agent represented by the following formula (I):

$$Q^1\text{-}R\text{-}Q^2 \quad (I)$$

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—).

(6) The photopolymerizable composition as described in item (5) above, wherein $Q^1$ and $Q^2$ in formula (I) each independently represent a group represented by formula (a) or (b) shown below, and R in formula (I) represents a linking group represented by formula (c) shown below.

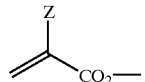

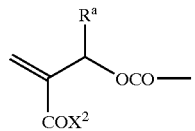

$$-R^1\text{-}T^1\text{-}R^2\text{-}T^2\text{-}R^3\text{-}T^3\text{-}R^4\text{-}T^4\text{-}R^5- \quad (c)$$

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —$CO_2$—, —CO—, —$OCO_2$— or a single bond, provided that all of $T^1$ to $T^4$ do not represent single bonds, and $R^a$ and $R^b$ each independently represent a hydrogen atom or a hydrocarbon group.

DETAILED DESCRIPTION OF THE INVENTION

According to the plate-making method of a printing plate of the present invention, it is believed that the compatibility of high sensitivity and good preservation stability can be achieved by using particularly a difunctional crosslinking agent having the specific structure in the specific amount together with a trifunctional crosslinking agent and a polyfunctional crosslinking agent and in addition, the good printing durability is also achieved due to the synergistic effect based on the use of specific developer. Further, a photopolymerizable composition suitable for a printing plate precursor capable of performing direct plate-making based on digital data, for example, from a computer by recording using a solid laser or semiconductor laser radiating an ultraviolet ray, visible light or infrared ray is provided.

Although the mechanism is not clear in detail, it is believed that the high compatibility of the specific difunctional crosslinking agent with a polymer binder improves the preservation stability and the increase in polymerization rate resulting from the depression of gel point due to the difunctional crosslinking agent and high concentration of polymerizable groups due to the trifunctional crosslinking agent and tetrafunctional crosslinking agent having polymerizable groups in high density in a film are synergistically act to increase an efficiency of polymerization crosslinking reaction, whereby the sensitivity increases. Further, owing to the uniform distribution of the crosslinking agents in the film based on the high compatibility, the polymer binder is well intertwined to form a substantially strong, low developer permeable and dense crosslinked film at the photo-radical polymerization, and the use of the film in combination with a development processing step, in which damage due to a developer is small, using the specific developer of low permeability makes it possible to achieve the good printing durability.

It is also found that the photopolymerizable composition containing the difunctional crosslinking agent represented by formula (I) according to the present invention can attain both high sensitivity and good preservation stability.

The photopolymerizable composition containing the crosslinking agent represented by formula (I) can be applied to image forming materials, for example, stereolithography, holography, lithographic printing plate precursors, color proofs, photoresists and color filters, and photosetting resin materials, for example, ink, paint and adhesive. In particular, it is preferably used for the preparation of a lithographic printing plate precursor that is capable of being subjected to a so-called direct plate-making, in which the plate-making is directly conducted based on digital signals, for example, from a computer using various kinds of lasers.

In the photopolymerizable composition according to the present invention, the crosslinking agents represented by formula (I) may be used individually or in combination of two or more thereof. It is also possible to use the crosslinking agent represented by formula (I) together with a hitherto known compound having an addition polymerizable ethylenically unsaturated bond described below.

A proportion of the crosslinking agent represented by formula (I) is ordinarily from 5 to 100% by weight, preferably from 10 to 90% by weight, and more preferably from 30 to 70% by weight based on the total amount of compounds having a polymerizable group.

Although a mechanism of the fact that the photopolymerizable composition containing the crosslinking agent represented by formula (I) according to the present invention can attain both high sensitivity and good preservation stability is not clear in detail, it is believed that due to the specificity of functional group present on the linking group that connects two polymerizable groups, the compatibility of the crosslinking agent with the polymer binder is increased and thus the preservation stability is improved. Owing to the increase in polymerization rate resulting from the depression of gel point due to the difunctional crosslinking agent and the uniform distribution of the crosslinking agents in the film based on the high compatibility, the polymer binder is well intertwined to form a substantially strong crosslinked film at the photo-radical polymerization to achieve the high sensitivity.

Further, the photopolymerizable composition suitable for preparing a printing plate precursor capable of performing direct plate-making based on digital data, for example, from a computer by recording using a solid laser or semiconductor laser radiating an ultraviolet ray, visible light or infrared ray is provided.

The plate-making method of a printing plate of the present invention will be described in detail below.

<Photosensitive Layer>

The photosensitive layer, which is a feature of the printing plate precursor according to the present invention, contains (i) a crosslinking agent having two ethylenic polymerizable groups, (ii) a crosslinking agent having three or more ethylenic polymerizable groups, a photopolymerization initiator, a linear organic high molecular polymer and other components. The photosensitive layer is preferably formed from a photopolymerizable composition containing (i) a crosslinking agent having two ethylenic polymerizable groups, (ii) a crosslinking agent having three ethylenic polymerizable groups and (iii) a crosslinking agent having 4 to 8 ethylenic polymerizable groups and satisfying a ratio of the crosslinking agents represented by the following formulae (A) and (B):

$$a+b+c=100 \quad (A)$$

$$0.4 \leq a/(b+c) \leq 3.0 \quad (B)$$

wherein a represents % by weight of the crosslinking agent of (i), b represents % by weight of the crosslinking agent of (ii), and c represents % by weight of the crosslinking agent of (iii).

The ratio represented by formula (B) is more preferably $0.6 \leq a/(b+c) \leq 2.0$, and most preferably $0.8 \leq a/(b+c) \leq 1.5$.

In the photopolymerizable composition, the difunctional crosslinking agent having two ethylenic polymerizable groups per molecule, the trifunctional crosslinking agent having three ethylenic polymerizable groups per molecule and the polyfunctional crosslinking agent having 4 to 8 ethylenic polymerizable groups per molecule are not particularly restricted, and include hitherto known compounds, for example, compounds having addition polymerizable ethylenically unsaturated bonds including, for example, an ester of an unsaturated carboxylic acid (e.g., acrylic acid, methacrylic acid, itaconic acid, crotonic acid, isocrotonic acid or maleic acid) with an aliphatic polyhydric alcohol compound, and an amide of the above-described unsaturated carboxylic acid with an aliphatic polyvalent amine compound.

Specific examples of monomers, which are the esters of aliphatic polyhydric alcohol compounds with the unsaturated carboxylic acids, include an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, or a polyester acrylate oligomer; a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, or bis[p-(methacryloxyethoxy)phenyl]dimethylmethane; an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate, or sorbitol tetraitaconate; a crotonic acid ester, for example, ethylene glycol dicrotonate, tetramethylene glycol dicrotonate, pentaerythritol dicrotonate, or sorbitol tetracrotonate; an isocrotonic acid ester, for example, ethylene glycol diisocrotonate, pentaerythritol diisocrotonate, or sorbitol tetraisocrotonate; and a maleic acid ester, for example, ethylene glycol dimaleate, triethylene glycol dimaleate, pentaerythritol dimaleate, or sorbitol tetramaleate. A mixture of the ester monomers is also employed. Specific examples of monomers, which are the amides of aliphatic polyvalent amine compounds with the unsaturated carboxylic acids, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, and xylylene bismethacrylamide.

Other examples of the monomers include vinylurethane compounds having at least two polymerizable vinyl groups per molecule obtained by adding a vinyl monomer containing a hydroxyl group represented by formula (A) shown below to a polyisocyanate compound having at least two isocyanate groups in a molecule thereof as described, for example, in JP-B-48-41708.

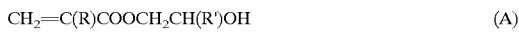

$CH_2=C(R)COOCH_2CH(R')OH$ (A)

wherein, R and R' each represent H or $CH_3$.

Also, urethane acrylates as described in JP-A-51-37193, polyester acrylates as described in JP-A-48-64183, JP-B-49-43191 and JP-B-52-30490, and polyfunctional acrylates and methacrylates, for example, epoxy acrylates obtained by reacting an epoxy resin with (meth)acrylic acid may be used. Further, photocurable monomers and oligomers as described in *Nippon Secchaku Kyokai-Shi,* Vol. 20, No. 7, pages 300 to 308 (1984) can be used. In the present invention, such a monomer may also be used in the chemical form of a prepolymer, for example, a dimer or a trimer, an oligomer, a mixture thereof, or a copolymer thereof.

In addition, α-heteromethacryl compounds having structures represented by formula (I) described in JP-A-2001-92127 are also preferably used.

Particularly, preferred examples of the difunctional crosslinking agent include the crosslinking agent represented by formula (I) of the present invention.

<Crosslinking Agent Represented by Formula (I) of the Present Invention>

Preferred examples of the difunctional crosslinking agent for use in the present invention include a difunctional crosslinking agent having a structure represented by formula (I) shown below and containing two ethylenic polymerizable groups per molecule.

$Q^1\text{-R-}Q^2$ (I)

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—).

The radical polymerizable terminal group represented by $Q^1$ or $Q^2$ includes a group having a polymerizable group in the terminal thereof, for example, an acryl group, a methacryl group, a crotonyl group, an itaconyl group, an α-hetero-substituted methacryl group, a styrene group, an α-methylstyrene group, a vinylamido group and a vinyloxy group.

Still more preferably, $Q^1$ and $Q^2$ in formula (I) each independently represent a group represented by formula (a) or (b) shown below, and R in formula (I) represents a linking group represented by formula (c) shown below.

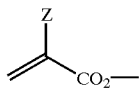
(a)

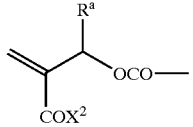
(b)

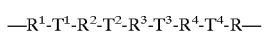
—$R^1$-$T^1$-$R^2$-$T^2$-$R^3$-$T^3$-$R^4$-$T^4$-R— (c)

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —$CO_2$—, —CO—, —$OCO_2$— or a single bond, provided that all of $T^1$ to $T^4$ do not represent single bonds, and $R^a$ and $R^b$ each independently represent a hydrogen atom or a hydrocarbon group.

In formula (I), R represents a divalent hydrocarbon linking group connected with at least one member selected from the group consisting of an ester linking group (—OC(=O)—), a carbonic acid ester linking group (—OC(=O)O—) and a carbonyl linking group (—C(=O)—), and more preferably a linking group represented by formula (c) shown above.

Most preferably, in formula (I), the divalent hydrocarbon linking group represented by R includes two or more ester groups and the radical polymerizable terminal groups represented by $Q^1$ and $Q^2$ are both acrylate groups or different groups each other, since these compounds are especially excellent in the reactivity and compatibility.

The groups represented by $X^1$ or $X^2$, the aliphatic hydrocarbon linking group represented by any one of $R^1$ to $R^5$ and the hydrocarbon group represented $R^a$ or $R^b$ are describe in detail below.

$X^1$ and $X^2$ each independently represent a substituted oxy group, a substituted amino group or a substituted thio group.

The aliphatic hydrocarbon linking group represented by any one of $R^1$ to $R^5$ is a divalent linking group obtained by eliminating one hydrogen atom from an alkyl group or a substituted alkyl group.

The hydrocarbon group represented by $R^a$ or $R^b$ is a hydrocarbon group which may have a substituent and may contain an unsaturated bond.

Each of the substituents included in $X^1$, $X^2$, $R^1$, $R^2$, $R^3$, $R^4$, $R^5$, $R^a$ and $R^b$ in formula (I) is described below.

The hydrocarbon group which may have a substituent and/or an unsaturated bond includes an alkyl group, a substituted alkyl group, an aryl group, a substituted aryl group, an alkenyl group, a substituted alkenyl group, an alkynyl group and a substituted alkynyl group.

The alkyl group includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The substituted alkyl group is composed of a substituent bonding to an alkylene group. The substituent includes a monovalent non-metallic atomic group exclusive of a hydrogen atom. Preferred examples of the substituent for the alkyl group include a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxy group and a conjugate base group thereof (hereinafter, referred to as a carboxylato group), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO₃H) and a conjugate base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group (—SO₂NHSO₂(alkyl)) and a conjugate base group thereof, an N-arylsulfonylsulfamoyl group (—SO₂NHSO₂(aryl)) and a conjugate base group thereof, an N-alkylsulfonylcarbamoyl group (—CONHSO₂(alkyl)) and a conjugate base group thereof, an N-arylsulfonylcarbamoyl group (—CONHSO₂(aryl)) and a conjugate base group thereof, an alkoxysilyl group (—Si(O-alkyl)₃), an aryloxysilyl group (—Si(O-aryl)₃), a hydroxysilyl group (—Si(OH)₃) and a conjugate base group thereof, a phosphono group (—PO₃H₂) and a conjugate base group thereof (hereinafter, referred to as a phosphonato group), a dialkylphosphono group (—PO₃(alkyl)₂), a diarylphosphono group (—PO₃(aryl)₂), an alkylarylphosphono group (—PO₃(alkyl) (aryl)), a monoalkylphosphono group (—PO₃H(alkyl)) and a conjugate base group thereof (hereinafter, referred to as an alkylphosphonato group), a monoarylphosphono group (—PO₃H(aryl)) and a conjugate base group thereof (hereinafter, referred to as an arylphosphonato group), a phosphonoxy group (—OPO₃H₂) and a conjugate base group thereof (hereinafter, referred to as a phosphonatoxy group), a dialkylphosphonoxy group (—OPO₃(alkyl)₂), a diarylphosphonoxy group (—OPO₃(aryl)₂), an alkylarylphosphonoxy group (—OPO₃(alkyl) (aryl)), a monoalkylphosphonoxy group (—OPO₃H(alkyl)) and a conjugate base group thereof (hereinafter, referred to as an alkylphosphonatoxy group), a monoarylphosphonoxy group (—OPO₃H(aryl)) and a conjugate base group thereof (hereinafter, referred to as an arylphosphonatoxy group), a cyano group, a nitro group, an aryl group, an alkenyl group and an alkynyl group.

Specific examples of the alkyl group in the substituents include those described above. Specific examples of the aryl group in the substituents include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, penoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophehyl, phosphonophenyl and phosphonatophenyl groups. Specific examples of the alkenyl group include vinyl, 1-propenyl, 1-butenyl, cinnamyl and 2-chloro-1-ethenyl groups. Specific examples of the alkynyl group include ethynyl, 1-propynyl, 1-butynyl, trimethylsilylethynyl and phenylethynyl groups.

In the acyl group (R⁴CO—) described above, R⁴ represents a hydrogen atom, or the above-described alkyl group, aryl group, alkenyl group or alkynyl group.

In the substituted alkyl group, an alkylene group includes a divalent organic residue obtained by eliminating any one of hydrogen atoms on the alkyl group having from 1 to 20 carbon atoms described above, and preferably a straight chain alkylene group having from 1 to 12 carbon atoms, a branched alkylene group having from 3 to 12 carbon atoms and a cyclic alkylene group having from 5 to 10 carbon atoms. Specific preferred examples of the substituted alkyl group include chloromethyl, bromomethyl, 2-chloroethyl, trifluoromethyl, methoxymethyl, methoxyethoxyethyl, allyloxymethyl, phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl) carbamoylethyl, N-methyl-N-(sulfophenyl) carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl,

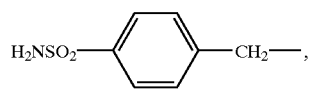

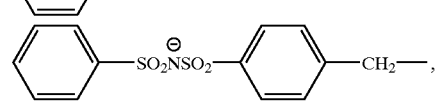

HS—CH₂CH₂CH₂CH₂—, 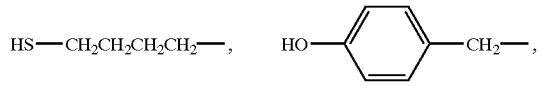

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups.

The aryl group includes a condensed ring of one to three benzene rings and a condensed ring of a benzene ring and a 5-membered unsaturated ring. Specific examples of the aryl group include phenyl, naphthyl, anthryl, phenanthryl, indenyl, acenaphthenyl and fluorenyl groups. A phenyl group and a naphthyl group are preferred.

The substituted aryl group is a group formed by bonding a substituent to an aryl group and includes groups having a monovalent non-metallic atomic group exclusive of a hydrogen atom, as a substituent, on the ring-forming carbon atom of the above-described aryl group. Examples of the substituent include the above-described alkyl and substituted alkyl group and the substituents for the substituted alkyl group. Specific preferred examples of the substituted aryl group include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl) carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl) sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups.

The alkenyl group includes that described above. The substituted alkenyl group is a group formed by replacing a hydrogen atom of the alkenyl group with a substituent. Examples of the substituent include the substituents for the substituted alkyl group described above, and the alkenyl group is that described above. Preferred examples of the substituted alkenyl group include the following groups:

CH₃O₂CCH₂CH=CHCH₂—, CH₃C(CO₂CH₃)=CH—CH₂—,

HO₂CCH₂CH=CHCH₂—,

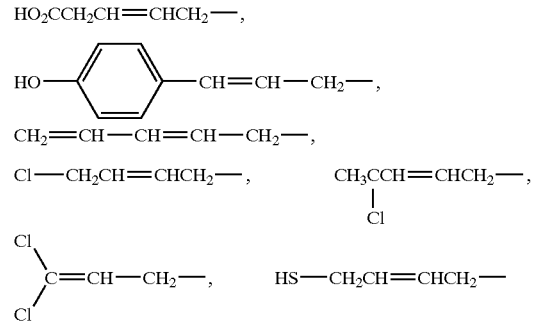

CH₂=CH—CH=CH—CH₂—,

Cl—CH₂CH=CHCH₂—, CH₃CCl(H)CH=CHCH₂—,

Cl₂C=CH—CH₂—, HS—CH₂CH=CHCH₂—

The alkynyl group includes that described above. The substituted alkynyl group is a group formed by replacing a hydrogen atom of the alkynyl group with a substituent. Examples of the substituent include the substituents for the substituted alkyl group described above, and the alkynyl group is that described above.

The heterocyclic group includes a monovalent group formed by eliminating one hydrogen atom on the hetero ring and a monovalent group (a substituted heterocyclic group) formed by further eliminating one hydrogen atom from the above-described monovalent group and bonding a substituent selected from the substituents for the substituted alkyl group described above. Preferred examples of the hetero ring are set forth below.

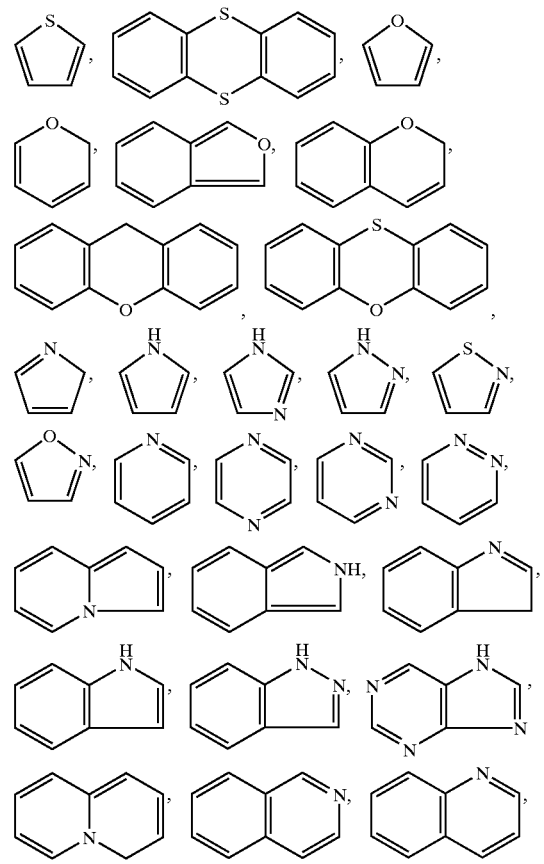

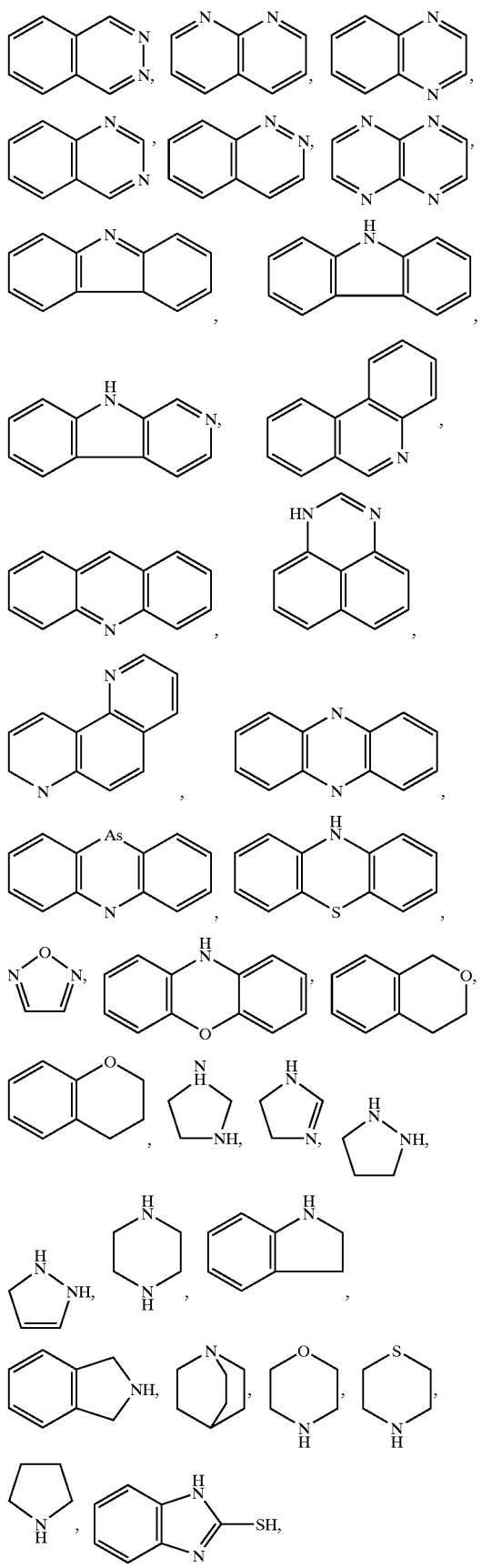
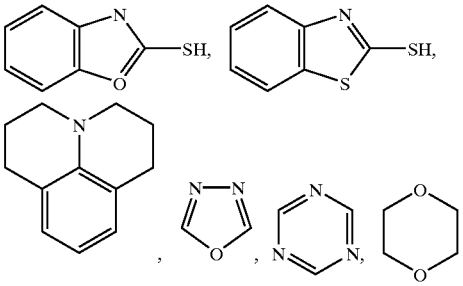

In the substituted oxy group (R⁵O—) described above, $R^5$ represents a monovalent non-metallic atomic group excusive of a hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and aryl group in the above-described substituted oxy group include those described for the alkyl group, substituted alkyl group, aryl group and substituted aryl group above. In an acyl group ($R^6CO$—) in the acyloxy group described above, $R^6$ represents the alkyl group, substituted alkyl group, aryl group and substituted aryl group described above. Of the substituted oxy groups, an alkoxy group, an aryloxy group, an acyloxy group and an arylsulfoxy group are more preferred. Specific preferred examples of the substituted oxy group include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonatoxy groups.

In the substituted thio group ($R^7S$—) described above, $R^7$ represents a monovalent non-metallic atomic group excusive of a hydrogen atom. Preferred examples of the substituted thio group include an alkylthio group, an arylthio group, an alkyldithio group, an aryldithio group and an acylthio group. The alkyl group and aryl group in the above-described substituted thio group include those described for the alkyl group, substituted alkyl group, aryl group and substituted aryl group above. In an acyl group ($R^6CO$—) in the acylthio group described above, $R^6$ has the same meaning as described above. Of the substituted thio groups, an alkylthio group and an arylthio group are more preferred. Specific preferred examples of the substituted thio group include methylthio, ethylthio, phenylthio, ethoxyethylthio, carboxyethylthio and methoxycarbonylthio groups.

In the substituted amino group ($R^8NH$— or $(R^9)(R^{10})N$—) described above, $R^8$, $R^9$ and $R^{10}$ each represents a monovalent non-metallic atomic group excusive of a hydrogen atom. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group.

The alkyl group and aryl group in the above-described substituted amino group include those described for the alkyl group, substituted alkyl group, aryl group and substituted aryl group above. In an acyl group ($R^6CO-$) in the acylamino group, N-alkylacylamino group or N-arylacylamino group described above, $R^6$ has the same meaning as described above. Of the substituted amino groups, an N-alkylamino group, an N,N-dialkylamino group, an N-arylamino group and an acylamino group are more preferred. Specific preferred examples of the substituted amino group include methylamino, ethylamino, diethylamino, morpholino, piperidino, pyrrolidino, pihenylamino, benzoylamino and acetylamino groups.

Specific examples of the compound having a structure represented by formula (I), the crosslinking agent having three ethylenic polymerizable groups and the crosslinking agent having 4 to 8 ethylenic polymerizable groups are set forth below, but the present invention should not be construed as being limited thereto.

ii) Difunctional Type

TABLE 3

Group C

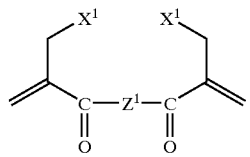

| No. | $X^1$ | $Z^1$ |
|---|---|---|
| C-1 | OH | 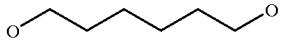 |
| C-2 | OH |  |
| C-3 | OCOCH$_3$ | 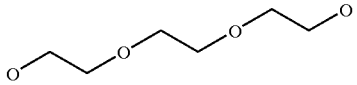 |
| C-4 | OCOCH$_3$ | 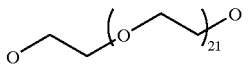 (average usage) |
| C-5 | OH |  |
| C-6 | OH | 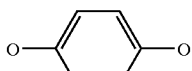 |
| C-7 | OH |  |
| C-8 | OH | 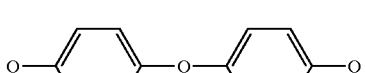 |
| C-9 | OCH$_3$ | 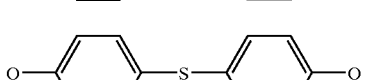 |

TABLE 3-continued
Group C
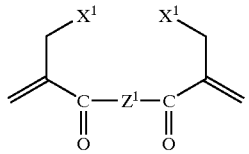
| No. | X$^1$ | Z$^1$ |
|---|---|---|
| C-10 | 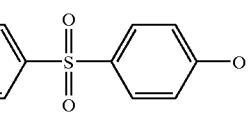 | 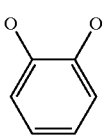 |
| C-11 | OCOC$_2$H$_5$ | 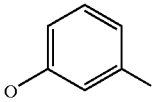 |
| C-12 | OCOC$_2$H$_5$ | 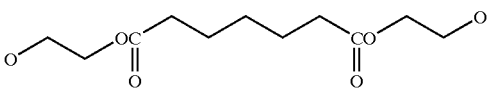 |
| C-13 | OH | 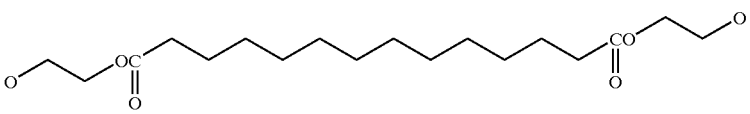 |
| C-14 | OCOCH$_3$ | 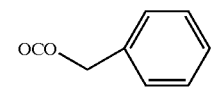 |
| C-15 | 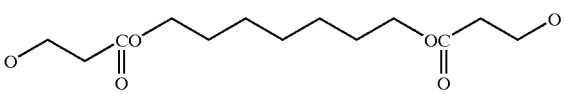 | 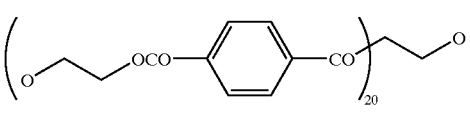 |
| C-16 | OH | 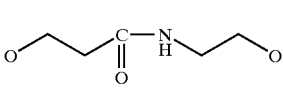 (average number) |
| C-17 | OH | 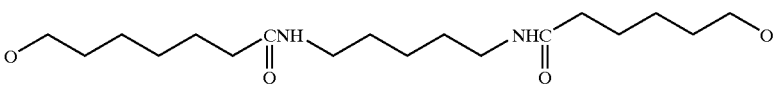 |
| C-18 | OH | 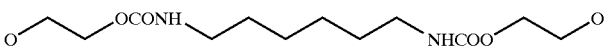 |
| C-19 | OCOCH$_3$ | 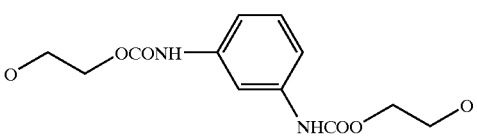 |
| C-20 | OCOCH$_3$ |  |
| C-21 | OCO(n)Pr | |

TABLE 3-continued

Group C

[Structure: CH2=C(CH2X1)-C(=O)-Z1-C(=O)-C(CH2X1)=CH2]

| No. | X¹ | Z¹ |
|---|---|---|
| C-22 | OCO(n)Pr | -O-(CH2)3-NHCO-(CH2)3-CONH-(CH2)3-O- |
| C-23 | OCOPh | -O-(CH2)3-NHCO-(m-C6H4)(CONH-(CH2)3-O-) |
| C-24 | SCH₃ | -O-(CH2)8-O- |
| C-25 | 2-benzothiazolylthio | -O-(CH2)10-O- |
| C-26 | SCOCH₃ | -O-(CH2)8-O- |
| C-27 | OSO₂CH₃ | -O-CH2-C(CH2OH)2-CH2-O- |
| C-28 | OSO₂-(p-tolyl) | -O-(2-chloro-1,4-phenylene)-O- |
| C-29 | N(CH₃)₂ | -O-(1,4-phenylene)-O- |
| C-30 | morpholino | -O-(CH2)4-O- |
| C-31 | piperidino | -NHSO2-(m-C6H4)-SO2NH- |
| C-32 | F | -O-(CH2)4-O- |
| C-33 | NHCOCH₃ | piperazine-1,4-diyl |

TABLE 3-continued

Group C

[Structure: CH₂=C(CH₂X¹)-C(=O)-Z¹-C(=O)-C(CH₂X¹)=CH₂]

| No. | X¹ | Z¹ |
|---|---|---|
| C-34 | 4-(NHSO₂)-C₆H₄-CH₂- | HN-(CH₂)₃-NH |
| C-35 | C₆H₅-NHCO₂- | NH-CH₂CH₂-O-CH₂CH₂-O-CH₂CH₂-NH |

TABLE 4

Group D

[Structure: X²OC(=O)-C(=CH₂)-CH₂-Z²-CH₂-C(=CH₂)-C(=O)OX²]

| No. | X² | Z² |
|---|---|---|
| D-1 | OCH₃ | O-(CH₂)₆-O |
| D-2 | OCH₃ | O-(CH₂)₁₂-O |
| D-3 | OC₂H₅ | O-CH₂CH₂-O-CH₂CH₂-O-CH₂CH₂-O |
| D-4 | OC₂H₅ | O-CH₂CH₂-(O-CH₂CH₂)₂₁-O (average usage) |
| D-5 | O-CH₂-CH=CH₂ | O-CH₂-C₆H₄-CH₂-O (para) |
| D-6 | O-CH₂-C₆H₅ | O-C₆H₄-O (para) |
| D-7 | OCH₃ | OCO-(CH₂)₃-COO |
| D-8 | OCH₃ | OCO-(CH₂)₈-COO |
| D-9 | O(n)C₄H₉ | OCO-C₆H₄-COO (para) |
| D-10 | O(n)C₄H₉ | OCO-CH₂-C₆H₄-CH₂-COO (para) |

TABLE 4-continued

| | | |
|---|---|---|
| D-11 | O-CH₂CH₂-OCH₃ | cyclohexane-1,4-diyl with OCO- and -COO substituents |
| D-12 | O-CH₂CH₂-N(CH₃)₂ | -OCONH-(CH₂)₆-NHCOO- |
| D-13 | OCH₃ | 1,3-phenylene with -OCONH and -NHCOO substituents |
| D-14 | OCH₃ | -OCONH-C₆H₄-C(CH₃)₂-C₆H₄-NHCOO- |
| D-15 | OCH₃ | -OSO₂-(CH₂)₄-SO₂O- |
| D-16 | O(n)C₁₂H₂₅ | trimethylphenylene with -OSO₂ and -SO₂O- substituents |
| D-17 | OCH₃ | -OCO-(CH₂)₄-COO-(CH₂)₄-OCO-(CH₂)₄-COO- |
| D-18 | OCH₃ | -OCO-(CH₂)₄-CONH-(CH₂)₆-NHCO-(CH₂)₄-COO- |
| D-19 | OCH₃ | -OCO-CH₂CH₂-CO-(O-CH₂CH₂-OCO-C₆H₄-CO)₂₀-O-CH₂CH₂-OCO-CH₂CH₂-COO- (average number) |
| D-20 | OC₂H₅ | -OCO-CH₂CH₂-CONH-(CH₂)₄-O- |
| D-21 | OCH₃ | -OCO-(CH₂)₄-O- |
| D-22 | SCH₃ | -OCO-(CH₂)₃-OCO- |
| D-23 | S-C₆H₅ | -OCO-CH₂CH₂-OCO- |
| D-24 | 5-chloro-2-benzothiazolylthio | -OCO-CH₂CH₂-OCO- |
| D-25 | N(CH₃)(C₂H₅) | -OCO-(CH₂)₄-OCO- |

TABLE 4-continued

| | | |
|---|---|---|
| D-26 |  | 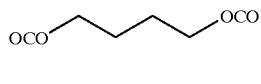 |
| D-27 | NH(n)C$_{12}$H$_{25}$ | 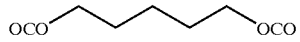 |
| D-28 | OCH$_3$ | 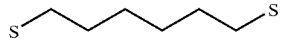 |
| D-29 | 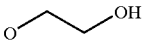 | 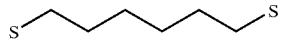 |
| D-30 | 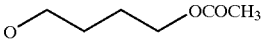 | 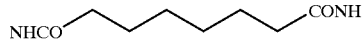 |
| D-31 | OCH$_3$ | 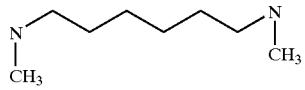 |
| D-32 | OCH$_3$ | 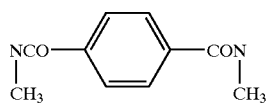 |
| D-33 | OCH$_3$ |  |
| D-34 | OCH$_3$ | 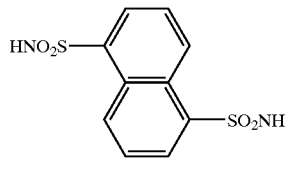 |
| D-35 | OC$_2$H$_5$ | O |

| | | $Q^1$—$R^1$—$T^1$—$R^2$—$T^2$—$R^3$—$T^3$—$R^4$—$T^4$—$R^5$—$Q^2$ | | | | | |
|---|---|---|---|---|---|---|---|
| No. | $Q^1$ | $R^1$ | $T^1$ | $R^2$ | $T^2$ | $R^3$ | $T^3$ |
| I-t | 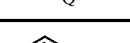 | —(CH$_2$)$_2$— | —OCO— | —(CH$_2$)$_2$— | —CO$_2$— | —(CH$_2$)$_2$— | — |
| I-2 |  | —(CH$_2$)$_3$— | —OCO— | —(CH$_2$)$_2$— | —CO$_2$— | —(CH$_2$)$_2$— | — |
| I-3 | 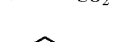 | —(CH$_2$)$_4$— | —OCO— | —(CH$_2$)$_8$— | —CO$_2$— | —(CH$_2$)$_4$— | — |
| I-4 |  | —(CH$_2$)$_2$— | —OCO— | —(CH$_2$)$_4$— | —CO$_2$— | —(CH$_2$)$_2$— | — |
| I-5 |  | —CH$_2$CH(CH$_3$)— | —OCO— | —(CH$_2$)$_4$— | —CO$_2$— | —CH(CH$_3$)CH$_2$— | — |
| I-6 |  | —(CH$_2$)$_8$— | —OCO— | —(CH$_2$)$_2$— | —CO$_2$— | —(CH$_2$)$_8$— | — |
| I-7 | 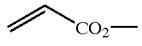 | —(CH$_2$)$_2$— | —OCO— | —(CH$_2$)$_4$— | —CO$_2$— | —(CH$_2$)$_4$— | — |
| I-8 | 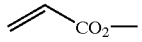 | —(CH$_2$)$_2$— | —OCO— | —(CH$_2$)$_2$— | —CO$_2$— | —(CH$_2$)$_3$— | —OCO— |
| I-9 | 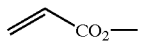 | —(CH$_2$)$_2$— | —OCO— | —(CH$_2$)$_2$— | —CO— | —(CH$_2$)$_3$— | —CO— |
| I-10 | 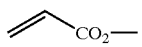 | —(CH$_2$)$_2$— | —OCO— | —(CH$_2$)$_2$— | —OCO$_2$— | —(CH$_2$)$_3$— | —OCO$_2$— |
| I-11 | 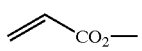 | —(CH$_2$)$_2$— | —OCO$_2$— | —(CH$_2$)$_2$— | —OCO$_2$— | —(CH$_2$)$_3$— | —CO$_2$— |

TABLE 4-continued

| ID | Vinyl | | | | | | |
|---|---|---|---|---|---|---|---|
| I-12 | CH₂=CH—CO₂— | —(CH₂)₂— | —CO— | —(CH₂)₂— | —OCO— | —(CH₂)₃— | —CO₂— |
| I-13 | CH₂=CH—CO₂— | —(CH₂)₂O(CH₂)₂— | —OCO— | —(CH₂)₂— | —CO₂— | —(CH₂)₃— | —OCO— |
| I-14 | CH₂=CH—CO₂— | —(CH₂)₂O(CH₂)₂— | —OCO— | —(CH₂)₂— | —CO₂— | —(CH₂)₂O(CH₂)₂— | — |
| I-15 | CH₂=CH—CO₂— | —C₃H₆OC₃H₆— | —OCO— | —(CH₂)₂— | —CO₂— | —C₃H₆OC₃H₆— | — |
| I-16 | CH₂=CH—CO₂— | —(CH₂)₂— | —CO₂— | —(CH₂)₂— | — | — | — |
| I-17 | CH₂=CH—CO₂— | —(CH₂)₂— | —CO— | —(CH₂)₂— | — | — | — |
| I-18 | CH₂=CH—CO₂— | —(CH₂)₂— | —OCO₂— | —(CH₂)₂— | — | — | — |
| I-19 | CH₂=CH—CO₂— | —(CH₂)₂— | —CO₂— | —(CH₂)₄— | —CO— | —(CH₂)₃— | — |
| I-20 | CH₂=CH—CO₂— | —(CH₂)₂— | —CO₂— | —(CH₂)₄— | —OCO₂— | —(CH₂)₃— | — |
| I-21 | CH₂=CH—CO₂— | —(CH₂)₂— | —OCO₂— | —(CH₂)₄— | —OCO₂— | —(CH₂)₄— | — |
| I-22 | CH₂=CH—CO₂— | —C₃H₆OC₃H₆— | —OCO₂— | —(CH₂)₄— | —OCO₂— | —C₃H₆OC₃H₆— | — |
| I-23 | CH₂=C(CH₃)—CO₂— | —(CH₂)₂— | —OCO— | —(CH₂)₂— | —CO₂— | —(CH₂)₂— | — |
| I-24 | CH₂=C(CH₃)—CO₂— | —(CH₂)₂— | —OCO— | —(CH₂)₂— | —CO₂— | —(CH₂)₂— | —OCO— |
| I-25 | CH₂=C(CH₃)—CO₂— | —(CH₂)₂— | —OCO— | —(CH₂)₂— | —CO₂— | —(CH₂)₂— | —CO₂— |
| I-26 | CH₂=C(CH₃)—CO₂— | —(CH₂)₂— | —OCO— | —(CH₂)₂— | —CO— | —(CH₂)₂— | —CO₂— |
| I-27 | CH₂=C(CH₃)—CO₂— | —(CH₂)₂— | —OCO— | —(CH₂)₂— | —OCO₂— | —(CH₂)₂— | —CO₂— |
| I-28 | CH₂=CH—CO₂— | —(CH₂)₂— | —OCO— | —(CH₂)₂— | —OCO₂— | —(CH₂)₄— | — |
| I-29 | CH₂=CH—CO₂— | —(CH₂)₂— | —OCO— | —(CH₂)₃— | — | — | — |
| I-30 | CH₂=C(CH₃)—CO₂— | —(CH₂)₂— | —OCO— | —(CH₂)₄— | — | — | — |
| I-31 | CH₂=C(CH₃)—CO₂— | —(CH₂)₂— | —OCO— | —(C₃H₆OC₃H₆)— | — | — | — |

TABLE 4-continued

| | Structure | | | | | | |
|---|---|---|---|---|---|---|---|
| I-32 | CH₂=C(CH₂OCH₃)(CO₂–) | –(CH₂)₂– | –CO– | –(CH₂)₂– | — | — | — |
| I-33 | CH₂=C(CH₂Cl)(CO₂–) | –(CH₂)₂– | –CO– | –(CH₂)₂– | — | — | — |
| I-34 | CH₂=C(CH₂OCH₃)(CO₂–) | –(CH₂)₂– | –CO– | –(CH₂)₂– | — | — | — |
| I-35 | CH₂=C(CH₂OCOCH₃)(CO₂–) | –(CH₂)₂– | –CO– | –(CH₂)₂– | — | — | — |
| I-36 | CH₂=C(CH₂OCOCH₃)(CO₂–) | –(CH₂)₂– | –CO– | –(CH₂)₂– | — | — | — |
| I-37 | CH₂=C(CH₂OCH₃)(CO₂–) | –(CH₂)₂– | –OCO– | –(CH₂)₄– | –CO₂– | –(CH₂)₂– | — |
| I-38 | CH₂=C(CH(CH₃)OCOCH₃)(CO₂–) | –(CH₂)₂– | –OCO– | –(CH₂)₄– | –CO₂– | –(CH₂)₂– | — |
| I-39 | CH₂=C(CH₂OCOCH₃)(CO₂–) | –(CH₂)₂– | –CO– | –(CH₂)₄– | –CO– | –(CH₂)₂– | — |
| I-40 | CH₂=C(CO₂CH₃)(CH₂OCO–) | –(CH₂)₂– | –CO₂– | –(CH₂)₄– | –OCO– | –(CH₂)₂– | — |
| I-41 | CH₂=C(CO₂CH₃)(CH₂OCO–) | –(CH₂)₂– | –CO₂– | –(CH₂)₂O(CH₂)₂– | –OCO– | –(CH₂)₂– | — |
| I-42 | CH₂=C(CO₂CH₃)(CH₂OCO–) | –(CH₂)₂– | –CO₂– | –(CH₂)₂– | — | — | — |
| I-43 | CH₂=C(CO₂CH₃)(CH₂OCO–) | –(CH₂)₂– | –CO₂– | –(CH₂)₂– | — | — | — |
| I-44 | CH₂=C(CO₂C₂H₅)(CH₂OCO–) | –(CH₂)₃– | –OCO– | –(CH₂)₄– | –CO₂– | –(CH₂)₃– | — |

TABLE 4-continued

| ID | Structure | col3 | col4 | col5 | col6 | col7 | col8 |
|---|---|---|---|---|---|---|---|
| I-45 | CH2=C(CH2OCO—)(CO2H) | —(CH2)2— | —OCO— | —(CH2)4— | —CO2— | —(CH2)3— | — |
| I-46 | CH2=C(CH2OCO—)(CON(CH3)2) | —(CH2)2— | —OCO— | —(CH2)4— | —CO2— | —(CH2)3— | — |
| I-47 | CH2=C(CH2OCO—)(CONH-Ph) | —(CH2)4— | —CO2— | —(CH2)2— | —OCO— | —(CH2)4— | — |
| I-48 | CH2=C(CH(CH3)OCO—)(CO2CH3) | —(CH2)4— | —CO2— | —(CH2)2— | —OCO— | —(CH2)4— | — |
| I-49 | CH2=C(CH2OCO—)(CO2CH3) | —(CH2)2— | —CO— | —(CH2)2— | — | — | — |
| I-50 | CH2=C(CH2OCO—)(CO2CH3) | —(CH2)3— | —CO— | —(CH2)3— | — | — | — |
| I-51 | CH2=C(CH2OCO—)(CO2CH3) | —CH2— | —CO— | —CH2— | — | — | — |
| I-52 | CH2=C(CH2OCO—)(CO2CH3) | —(CH2)2— | —CO2— | —(CH2)2— | — | — | — |
| I-53 | CH2=C(CH2OCO—)(CO2CH3) | —(CH2)2— | —OCO2— | —(CH2)2— | — | — | — |
| I-54 | CH2=C(CH2OCO—)(CO2CH3) | —(CH2)4— | —OCO2— | —(CH2)4— | — | — | — |
| I-55 | CH2=C(CH2OCO—)(COSCH3) | —(CH2)3— | —OCO— | —(CH2)2— | — | — | — |
| I-56 | CH2=CH—CO2— | —(CH2)3— | —OCO— | —(CH2)2— | — | — | — |
| I-57 | CH2=C(CH3)—CO2— | —(CH2)3— | —OCO— | —(CH2)2— | — | — | — |
| I-58 | CH2=CH—CO2— | —(CH2)3— | —OCO— | —(CH2)2— | — | — | — |
| I-59 | CH2=C(CH2SCH3)(CO2—) | —(CH2)3— | —OCO— | —(CH2)2— | — | — | — |

TABLE 4-continued

| I-60 | 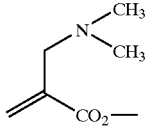 | ─(CH$_2$)$_3$─ | ─OCO─ | ─(CH$_2$)$_2$─ | ─ | ─ | ─ |

| | Q$^1$─R$^1$─T$^1$─R$^2$─T$^2$─R$^3$─T$^3$─R$^4$─T$^4$─R$^5$─Q$^2$ | | | |
|---|---|---|---|---|
| No. | R$^4$ | T$^4$ | R$^5$ | Q$^2$ |
| I-1 | ─ | ─ | ─ | 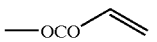 |
| I-2 | ─ | ─ | ─ | 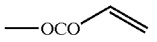 |
| I-3 | ─ | ─ | ─ | 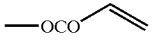 |
| I-4 | ─ | ─ | ─ | 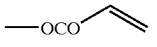 |
| I-5 | ─ | ─ | ─ | 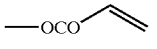 |
| I-6 | ─ | ─ | ─ | 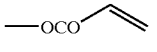 |
| I-7 | ─ | ─ | ─ | 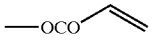 |
| I-8 | ─(CH$_2$)$_2$─ | ─CO$_2$─ | ─(CH$_2$)$_2$─ | 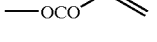 |
| I-9 | ─(CH$_2$)$_2$─ | ─CO$_2$─ | ─(CH$_2$)$_2$─ | 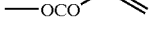 |
| I-10 | ─(CH$_2$)$_2$─ | ─CO$_2$─ | ─(CH$_2$)$_2$─ | 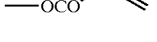 |
| I-11 | ─(CH$_2$)$_2$─ | ─OCO$_2$─ | ─(CH$_2$)$_2$─ | 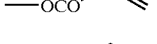 |
| I-12 | ─(CH$_2$)$_2$─ | ─CO─ | ─(CH$_2$)$_2$─ | 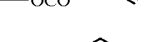 |
| I-13 | ─(CH$_2$)$_2$─ | ─CO$_2$─ | ─(CH$_2$)$_2$O(CH$_2$)$_2$─ | 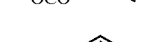 |
| I-14 | ─ | ─ | ─ | 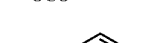 |
| I-15 | ─ | ─ | ─ |  |
| I-16 | ─ | ─ | ─ |  |
| I-17 | ─ | ─ | ─ | 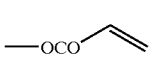 |
| I-18 | ─ | ─ | ─ | 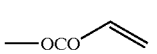 |
| I-19 | ─ | ─ | ─ | 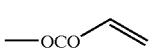 |
| I-20 | ─ | ─ | ─ | 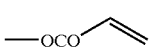 |
| I-21 | ─ | ─ | ─ | 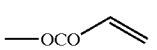 |
| I-22 | ─ | ─ | ─ |  |
| I-23 | ─ | ─ | ─ | 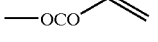 |

TABLE 4-continued

| | | | | |
|---|---|---|---|---|
| I-24 | -(CH$_2$)$_2$- | — | — | —OCO-C(CH$_3$)=CH$_2$ |
| I-25 | -(CH$_2$)$_2$- | — | — | —OCO-C(CH$_3$)=CH$_2$ |
| I-26 | -(CH$_2$)$_2$- | — | — | —OCO-C(CH$_3$)=CH$_2$ |
| I-27 | -(CH$_2$)$_2$- | — | — | —OCO-C(CH$_3$)=CH$_2$ |
| I-28 | — | — | — | —OCO-C(CH$_3$)=CH$_2$ |
| I-29 | — | — | — | —OCO-C(CH$_3$)=CH$_2$ |
| I-30 | — | — | — | —OCO-CH=CH$_2$ |
| I-31 | — | — | — | —OCO-CH=CH$_2$ |
| I-32 | — | — | — | —OCO-C(CH$_2$OCH$_3$)=CH$_2$ |
| I-33 | — | — | — | —OCO-C(CH$_2$Cl)=CH$_2$ |
| I-34 | — | — | — | —OCO-C(CH$_2$OH)=CH$_2$ |
| I-35 | — | — | — | —OCO-C(CH$_2$OCOCH$_3$)=CH$_2$ |
| I-36 | — | — | — | —OCO-CH=CH$_2$ |
| I-37 | — | — | — | —OCO-C(CH$_2$OCH$_3$)=CH$_2$ |
| I-38 | — | — | — | —OCO-C(CH(CH$_3$)OCOCH$_3$)=CH$_2$ |
| I-39 | — | — | — | —OCO-C(CH$_2$OCOCH$_3$)=CH$_2$ |

TABLE 4-continued

| | | | | |
|---|---|---|---|---|
| I-40 | — | — | — | —CO$_2$—C(=CH$_2$)—CH$_2$—CO$_2$CH$_3$ |
| I-41 | — | — | — | —CO$_2$—C(=CH$_2$)—CH$_2$—CO$_2$CH$_3$ |
| I-42 | — | — | — | —OCO—C(=CH$_2$)—CH$_3$ |
| I-43 | — | — | — | —OCO—CH=CH$_2$ |
| I-44 | — | — | — | —CO$_2$—C(=CH$_2$)—CH$_2$—CO$_2$C$_2$H$_5$ |
| I-45 | — | — | — | —CO$_2$—C(=CH$_2$)—CH$_2$—CO$_2$H |
| I-46 | — | — | — | —CO$_2$—C(=CH$_2$)—CON(CH$_3$)$_2$ |
| I-47 | — | — | — | —CO$_2$—C(=CH$_2$)—CONH—C$_6$H$_5$ |
| I-48 | — | — | — | —CO$_2$—CH(CH$_3$)—C(=CH$_2$)—CO$_2$CH$_3$ |
| I-49 | — | — | — | —CO$_2$—C(=CH$_2$)—CO$_2$CH$_3$ |
| I-50 | — | — | — | —CO$_2$—C(=CH$_2$)—CO$_2$CH$_3$ |
| I-51 | — | — | — | —CO$_2$—C(=CH$_2$)—CO$_2$CH$_3$ |
| I-52 | — | — | — | —CO$_2$—C(=CH$_2$)—CO$_2$CH$_3$ |
| I-53 | — | — | — | —CO$_2$—C(=CH$_2$)—CO$_2$CH$_3$ |
| I-54 | — | — | — | —CO$_2$—C(=CH$_2$)—CO$_2$CH$_3$ |

TABLE 4-continued
| No. | | | | |
|---|---|---|---|---|
| I-55 | — | — | — | 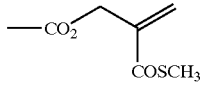 |
| I-56 | — | — | — | 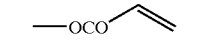 |
| I-57 | — | — | — | 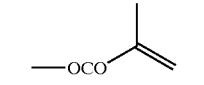 |
| I-58 | — | — | — | 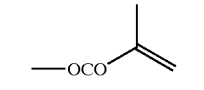 |
| I-59 | — | — | — | 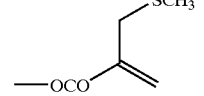 |
| I-60 | — | — | — | 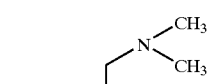 |
iii) Trifunctional or More Type
TABLE 5
Group E
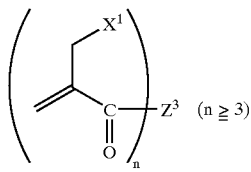 (n ≥ 3)
| No. | $X^1$ | $Z^3$ |
|---|---|---|
| E-1 | OH | 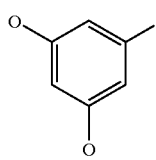 |
| E-2 | OCH$_3$ | 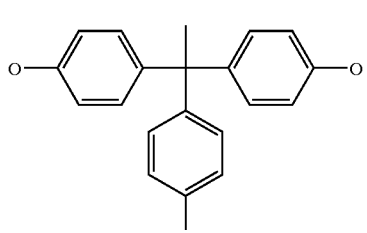 |
| E-3 | OCOCH$_3$ | 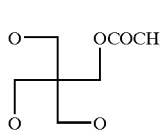 |

TABLE 5-continued
Group E
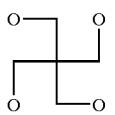
| No. | X¹ | Z³ |
|---|---|---|
| E-4 | OH | 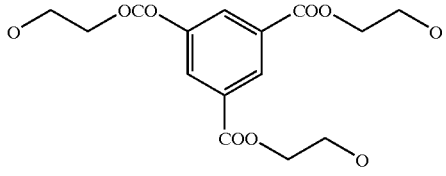 |
| E-5 | OCOCH₃ | 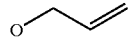 |
| E-6 | 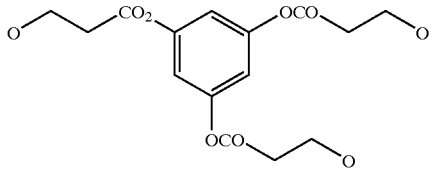 | 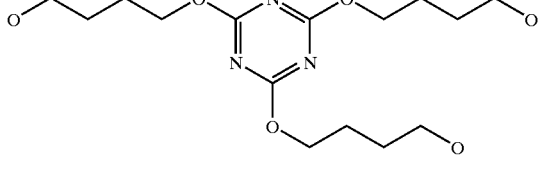 |
| E-7 | OH | 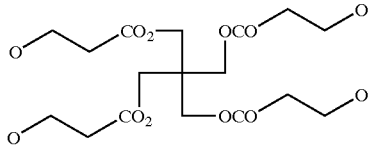 |
| E-8 | OH | 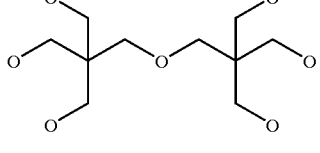 |
| E-9 | OH | 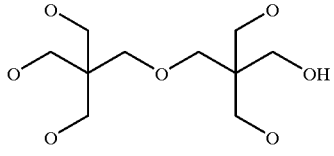 |
| E-10 | OCOCH₃ | 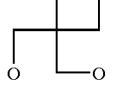 |
| E-11 | SCH₃ | 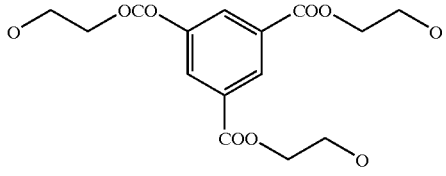 |

TABLE 5-continued
Group E
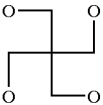
| No. | X¹ | Z³ |
|---|---|---|
| E-12 | Cl | 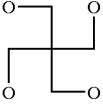 |
| E-13 | Br | 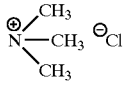 |
| E-14 | 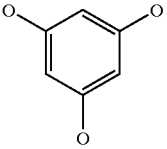 |  |
| E-15 | 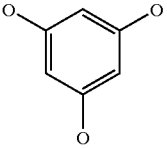 | 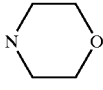 |
| E-16 | 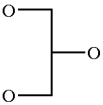 | 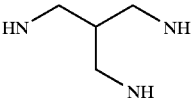 |
| E-17 | OCO(n)$C_{12}H_{25}$ | 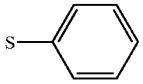 |
| E-18 | 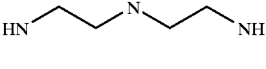 | 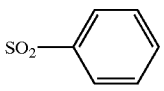 |
| E-19 | 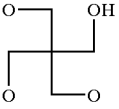 | 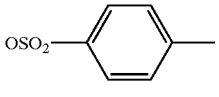 |
| E-20 | 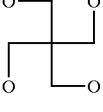 | 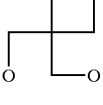 |
| E-21 | NHCOCH₃ | |

TABLE 5-continued

Group E $$\left( \begin{array}{c} X^1 \\ | \\ CH_2 \\ \parallel \\ C-Z^3 \\ | \\ C=O \end{array} \right)_n \quad (n \geq 3)$$

| No. | $X^1$ | $Z^3$ |
|---|---|---|
| E-22 | NHSO₂—C₆H₄— | (pentaerythritol tetra-O) |
| E-23 | CH(O—)(OC₂H₅) | (pentaerythritol tetra-O) |
| E-24 | OC(CH₃)₃ | (pentaerythritol tetra-O) |
| E-25 | OH | pentaerythritol tetrakis(thioethyl carbonate) |
| E-26 | OH | N,N'-(butane-1,4-diyl)diamine |

TABLE 6

$$\left( \begin{array}{c} Z^4 \\ | \\ CH_2 \\ \parallel \\ C-X^2 \\ \parallel \\ O \end{array} \right)_n \quad (n \geq 3)$$

| No. | $X^2$ | $Z^4$ |
|---|---|---|

Group F

| F-1 | OH | 1,3,5-trihydroxybenzene |
| F-2 | OCH₃ | pentaerythritol tetra-O |

TABLE 6-continued

| F-3 | OCH₃ | benzene-1,3,5-tricarboxylate (OCO, COO, COO) |
| F-4 | OCH₃ | (OCO)₂N-CH₂CH₂-N(COO)₂ (ethylenediaminetetraacetate-type) |
| F-5 | OC₂H₆ | cyanuric acid / triazine-2,4,6-trione |
| F-6 | OCH₃ | 1,3,5-tris(2-carboxyethoxy)benzene |
| F-7 | OCH₃ | pentaerythritol tetrakis(2-ethoxy... ) tetraester |
| F-8 | O(n)C₃H₇ | pentaerythritol tetracarboxylate (OCO, COO, OCO, COO) |
| F-9 | N(CH₃)₂ | benzene-1,3,5-tricarboxylate |
| F-10 | O(n)C₁₂H₂₅ | benzene-1,3,5-tricarboxylate |
| F-11 | NH–C₆H₅ | benzene-1,3,5-tricarboxylate |
| F-12 | NH—(n)C₄H₉ | benzene-1,2,4,5-tetracarboxylate |

TABLE 6-continued
| F-13 | Cl | 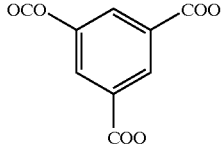 |
| F-14 | O⁻Na⁺ | 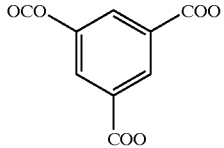 |
| F-15 | 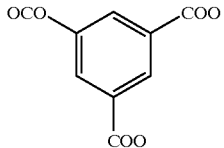 | 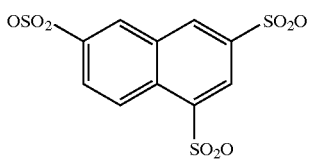 |
| F-16 | OCH₃ | 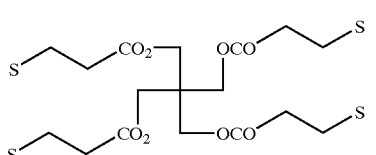 |
| F-17 | OCH₃ | 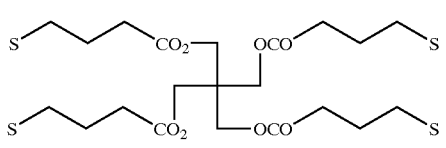 |
| F-18 | OCH₃ | 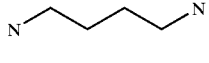 |
| F-19 | 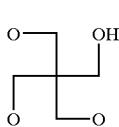 | N≡≡≡≡N |
| F-20 | 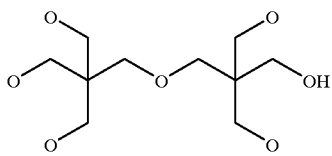 | 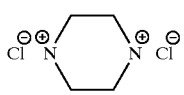 |
| F-21 | OCH₃ | |
| F-22 | | |

TABLE 6-continued
v) Others
Group H
H-1
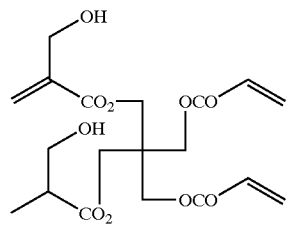
H-2
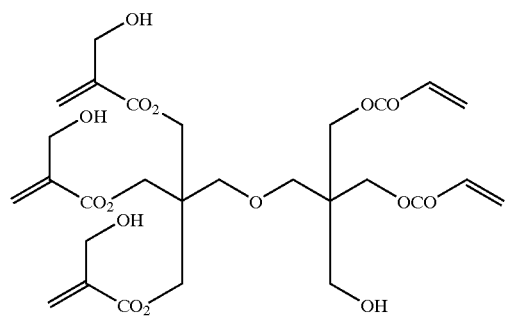
H-3
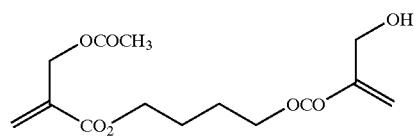
H-4
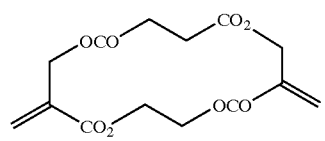
H-5
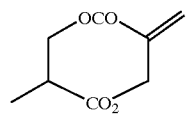
H-6
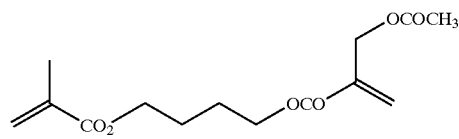
H-7
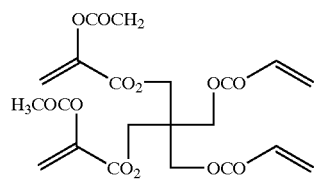
Group J
J-1
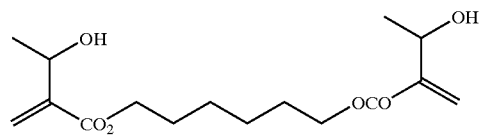

TABLE 6-continued

| J-2 | (structure: dimer with OCOCH₃ groups, CO₂-(CH₂)₆-OCO linker) |
| J-3 | (structure: dimer with OH groups, CO₂-(CH₂)₄-OCO linker) |
| J-4 | (structure: dimer with CF₃ groups, CO₂-(CH₂)₃-OCO linker) |
| J-5 | (structure: dimer with CCl₃ groups, CO₂-(CH₂)₃-OCO linker) |
| J-6 | (structure: dimer with phenyl/OCH₃ groups, CO₂-(CH₂)₃-O-(CH₂)₃-OCO linker) |
| J-7 | (structure: dimer with isopropyl and S-phenyl groups, CO₂-(CH₂)₄-OCO linker) |
| J-8 | (structure: dimer with 1,3-dioxolane groups, CO₂-(CH₂)₄-OCO linker) |
| J-9 | (structure: dimer with oxazoline groups, CO₂-(CH₂)₄-OCO linker) |
| J-10 | (structure: dimer with thiazoline groups, CO₂-(CH₂)₄-OCO linker) |
| J-11 | (structure: dimer with CO₂CH₃ groups, OCO-(CH₂)₄-CO₂ linker) |

TABLE 6-continued

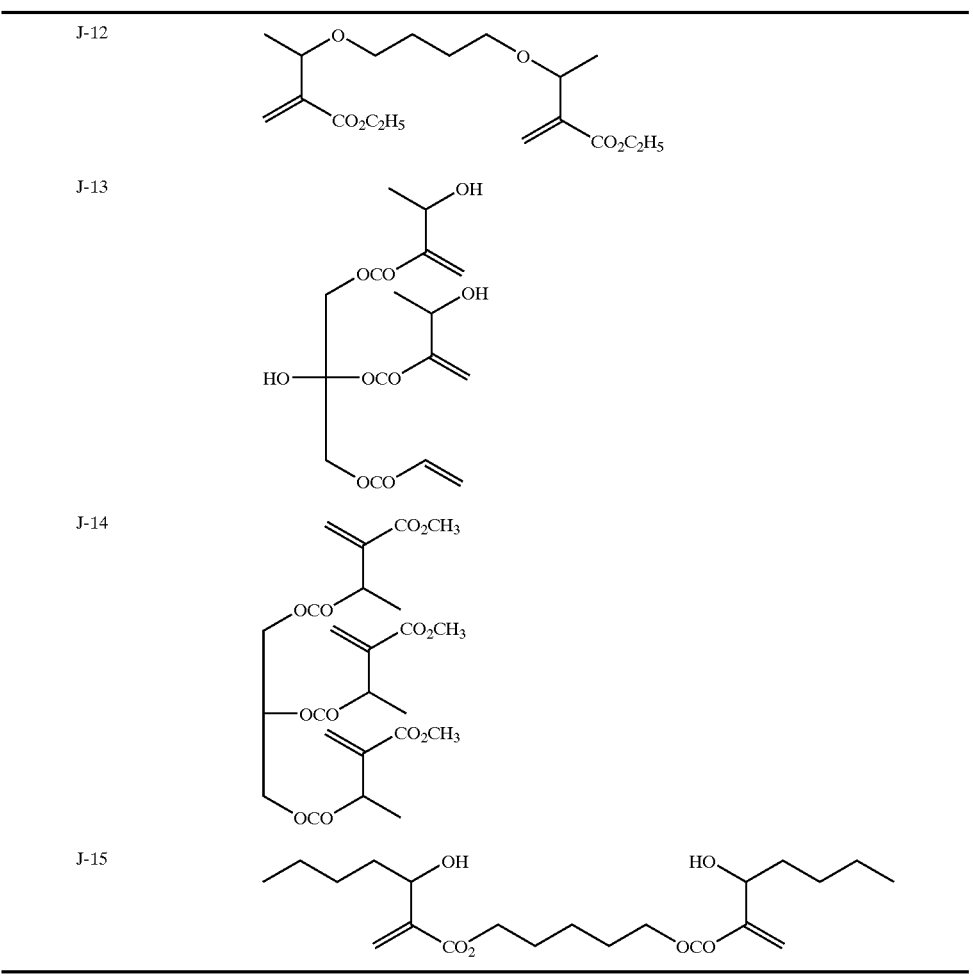

Of the difunctional crosslinking agents represented by formula (I) according to the present invention, compounds wherein the divalent hydrocarbon linking group represented by R includes two or more ester groups and the radical polymerizable terminal groups represented by $Q^1$ and $Q^2$ are both acrylate groups or different groups each other are most preferred, since these compounds are especially excellent in the reactivity and compatibility.

In the photopolymerizable composition of the present invention, a mixture of the crosslinking agent represented by formula (I) described above as a crosslinking agent having two ethylenic polymerizable groups, a crosslinking agent having three ethylenic polymerizable groups and a crosslinking agent having 4 to 8 ethylenic polymerizable groups is preferably used.

An amount of the whole crosslinking agents containing a polymerizable group including the crosslinking agent represented by formula (I) and other crosslinking agents used is ordinarily from 1 to 99.99%, preferably from 5 to 90.0%, and more preferably from 10 to 70%, based on the total weight of components of photopolymerizable composition (% used herein means % by weight).

The photopolymerization initiator, which is used in the photopolymerizable composition of the present invention, will be described below.

Preferred examples of the photopolymerization initiator includes (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

Preferred examples of the aromatic ketone (a) include compounds having a benzophenone skeleton or a thioxantone skeleton as described in J. P. Fouassier and J. F. Rabek, *Radiation Curing in Polymer Science and Technology*, pages 77 to 117 (1993), specifically, for example,

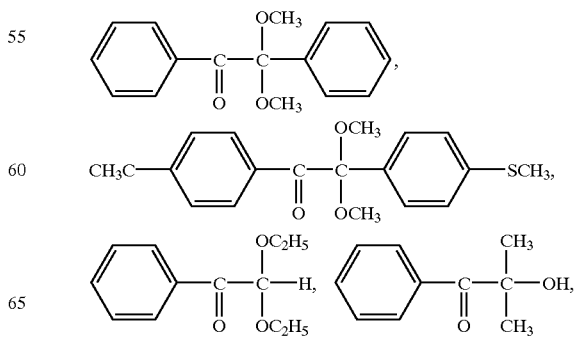

-continued
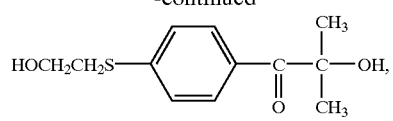
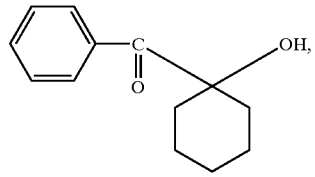
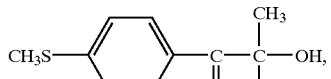
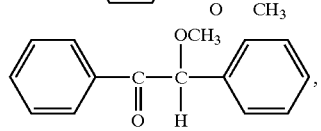
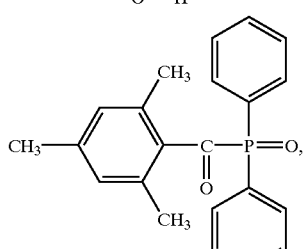
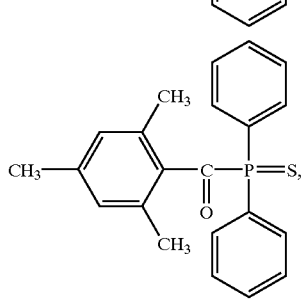
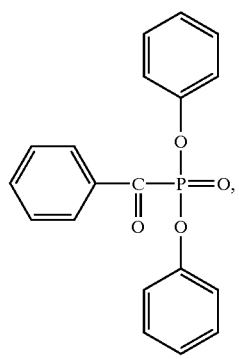
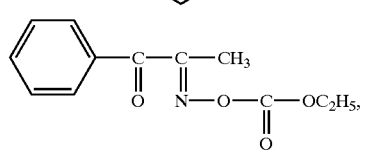
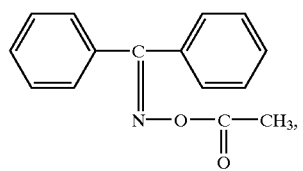
-continued
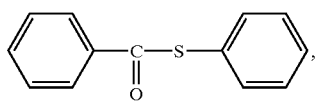
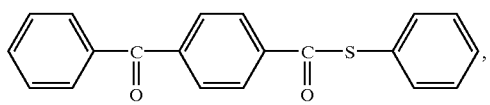
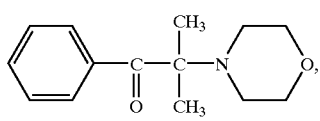
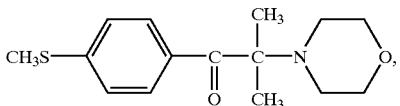
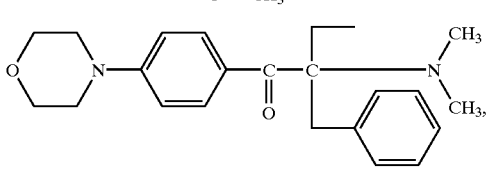
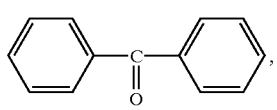
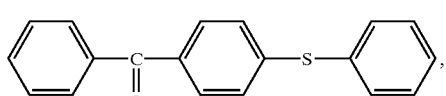
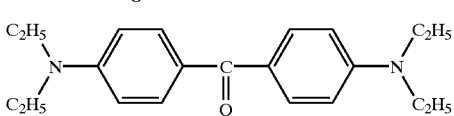
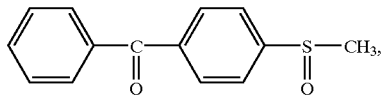
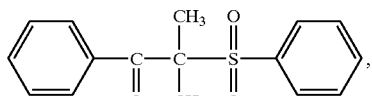
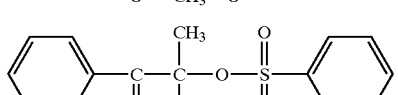
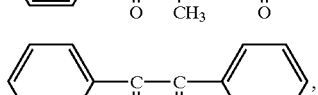
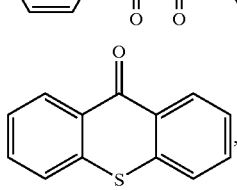
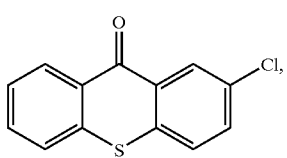

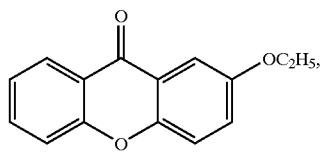

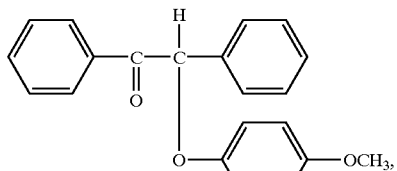

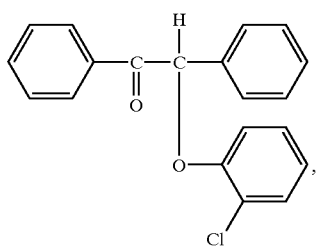

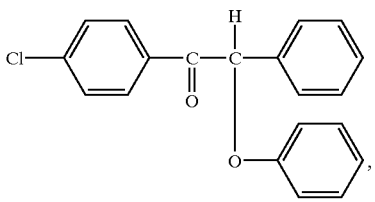

More preferred examples of the aromatic ketone (a) include α-thiobenzophenone compounds as described in JP-B-47-6416, and benzoin ether compounds as described in JP-B-47-3981, specifically, for example,

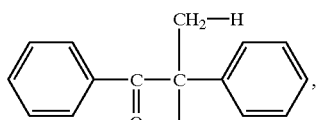

α-substituted benzoin compounds as described in JP-B-47-22326, specifically, for example,

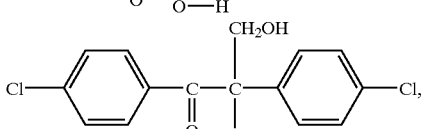

benzoin derivatives as described in JP-B-47-23664, aroylphophonic esters as described in JP-A-57-30704, and dialkoxybenzophenones as described in JP-B-60-26483, specifically, for example,

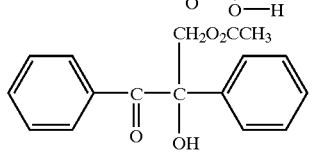

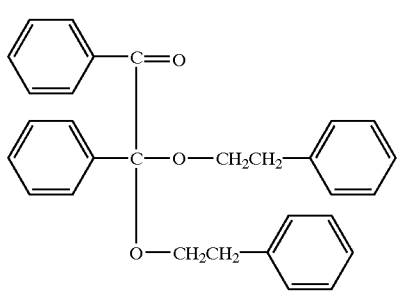

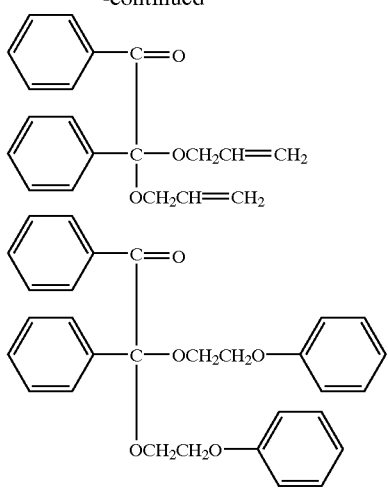
benzoin ethers as described in JP-B-60-26403 and JP-A-62-81345, specifically, for example,
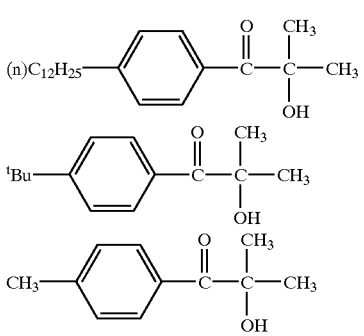
α-aminobenzophenones as described in JP-B-1-34242, U.S. Pat. No. 4,318,791 and EP-A-284,561, specifically, for example,
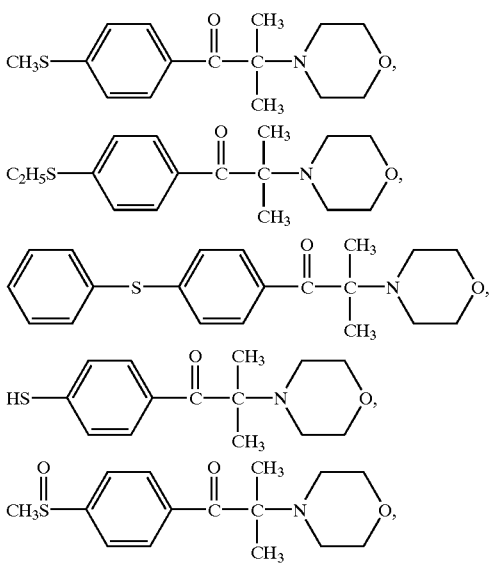
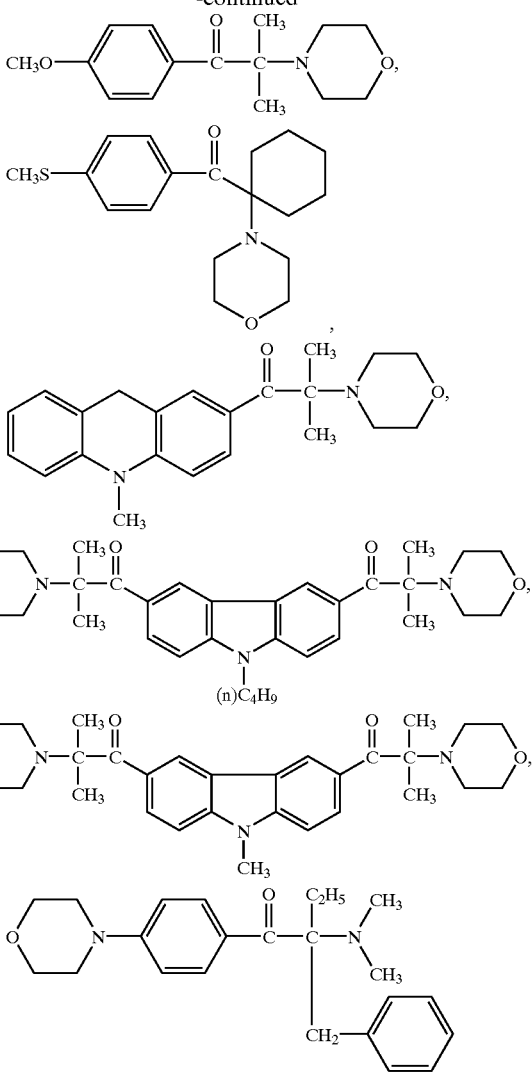
p-di(dimethylaminobenzoyl)benzene as described in JP-A-2-211452, specifically, for example,
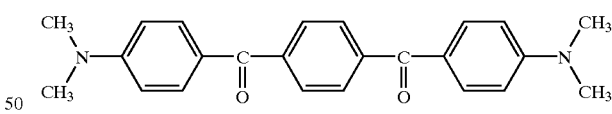
thio-substituted aromatic ketones as described in JP-A-61-194062, specifically, for example,

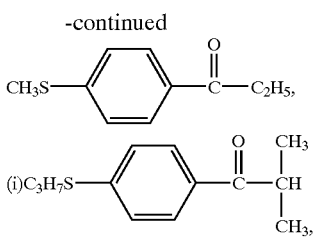

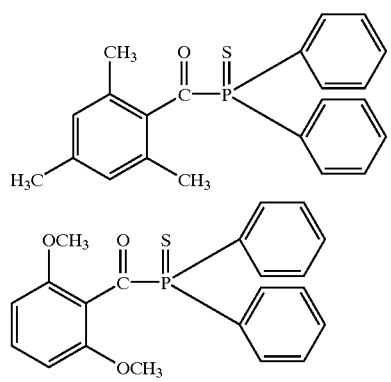

acylphosphinesulfides as described in JP-B-2-9597, specifically, for example,

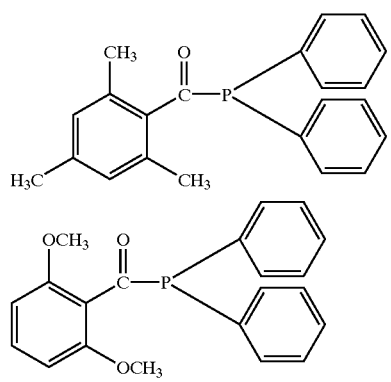

acylphosphines as described in JP-B-2-9596, specifically, for example,

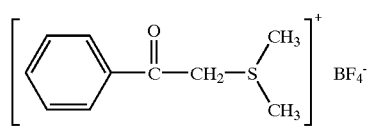

thioxantones as described in JP-B-63-61950, and coumarins as described in JP-B-59-42864.

The aromatic onium salt compound (b), which is another example of the radical initiator for use in the present invention, includes aromatic onium salts of atoms belonging to Group V, Group VI or Group VII of the periodic table, specifically, N, P, As, Sb, O, S, Se, Te and I. Examples of the aromatic onium salt compound include compounds as described in JP-B-52-14277, JP-B-52-14278 and JP-B-52-14279. Specific examples thereof include the following compounds:

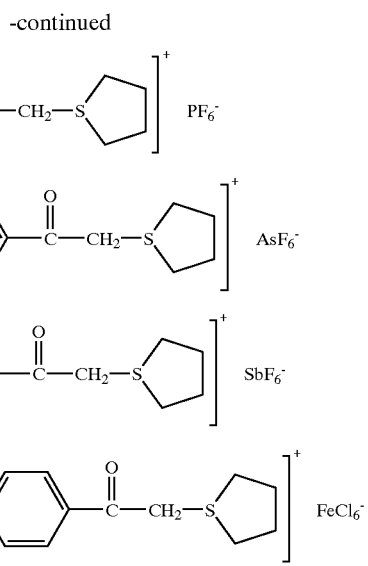

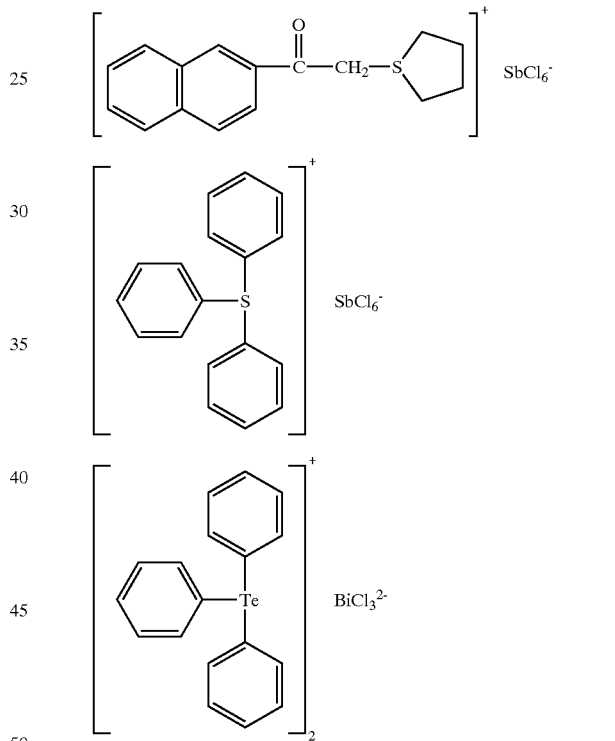

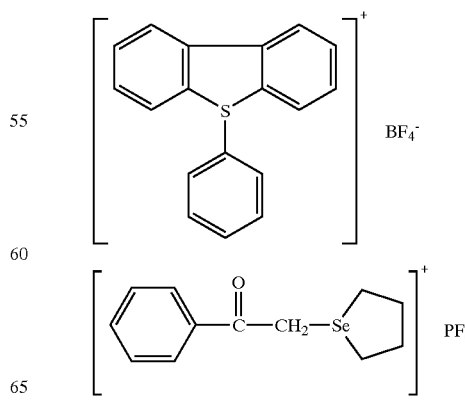

-continued
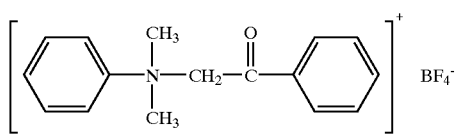
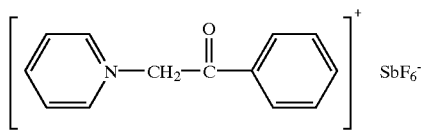
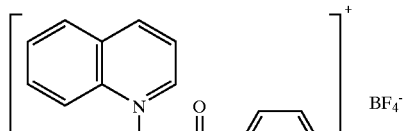
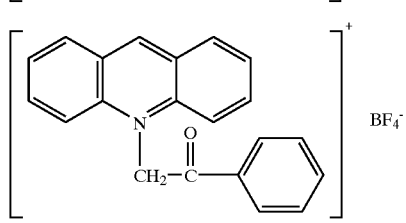
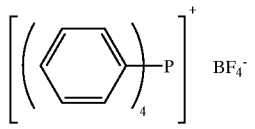
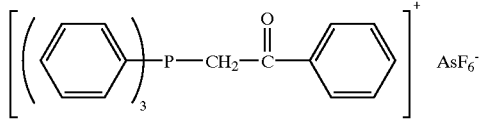
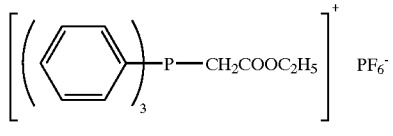
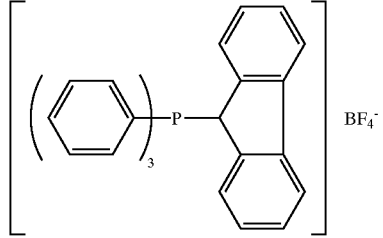
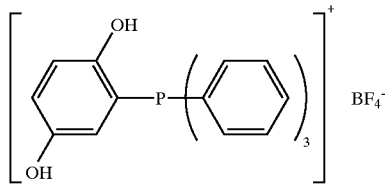
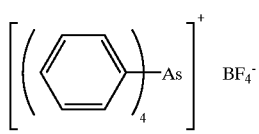
-continued
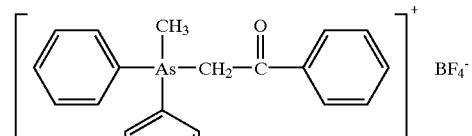
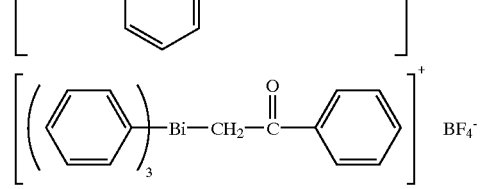
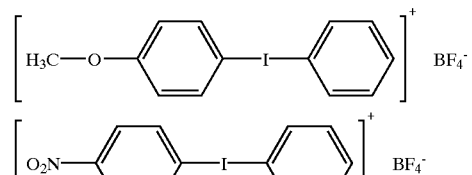
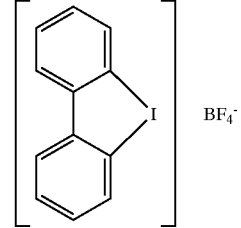
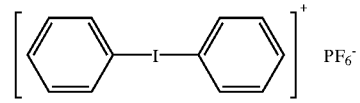
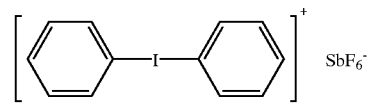
Also, the following diazonium salts are exemplified.
<Diazonium Salt or Quinonediazide>
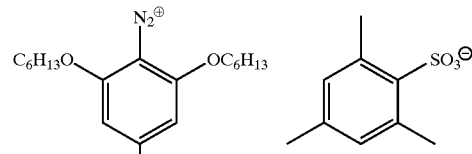
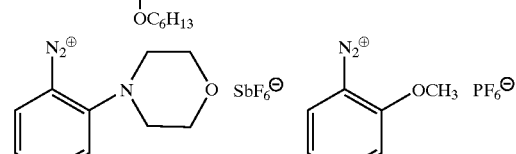
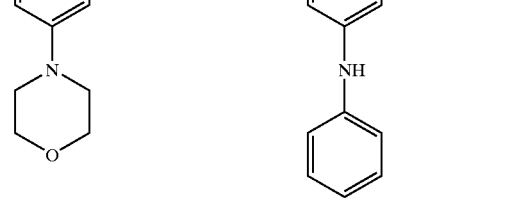

-continued

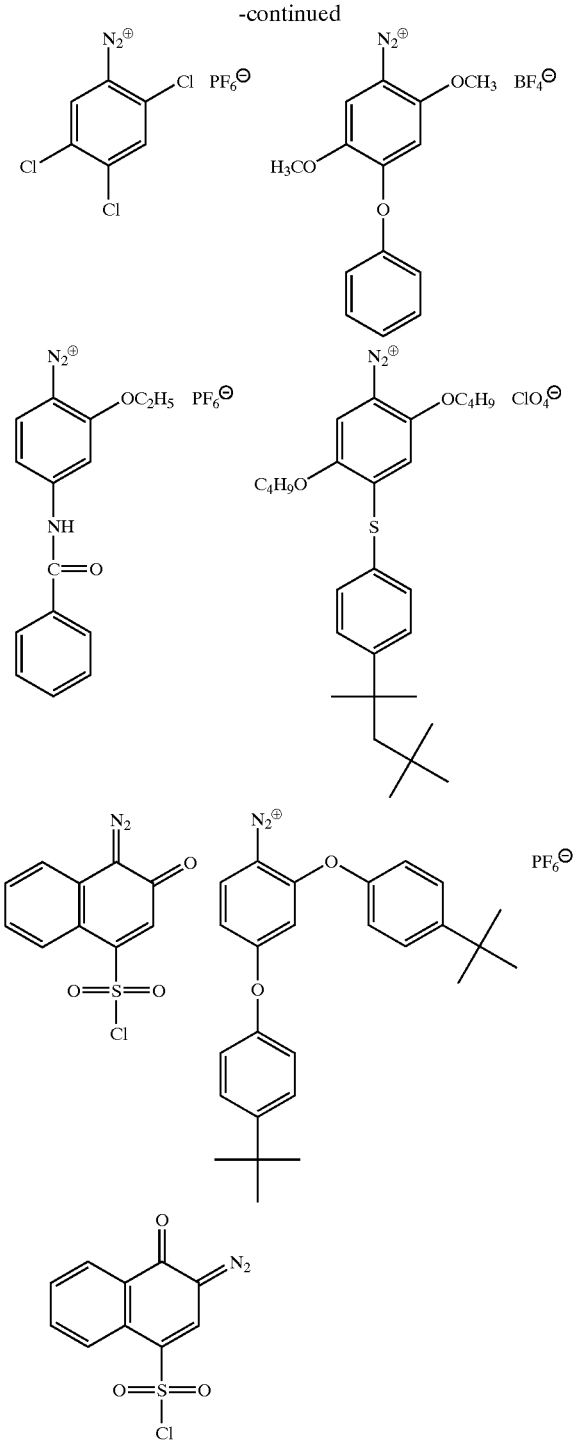

The organic peroxide (c), which is still another example of the radical initiator for use in the present invention, includes almost all organic compounds having at least one oxygen-oxygen bond in the molecules thereof. Specific examples of the organic peroxide include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butylhydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis (tert-butylperoxyisopropyl)benzene, 2,5-dimethyl-2,5-di (tert-butylperoxy)hexane, 2,5-xanoyl peroxide, succinic peroxide, benzoyl peroxide, 2,4-dichlorobenzoyl peroxide, methatoluoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy-3,5,5-trimethyl hexanoate, tert-butylperoxy laurate, tertiary carbonate, 3,3',4,4'-tetra(tert-butylperoxycarbonyl)benzophenone, 3,3',4,4'-tetra(tert-butylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra (hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

Of the organic peroxides, ester peroxides, for example, 3,3',4,4'-tetra(tert-butylperoxycarbonyl)benzophenone, 3,3', 4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-tert-butyldiperoxy isophthalate are preferred.

The thio compound (d), which is a further example of the radical initiator for use in the present invention, includes compounds represented by the following formula (II):

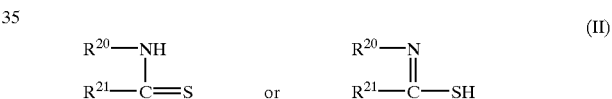

wherein $R^{20}$ represents an alkyl group, an aryl group or a substituted aryl group; $R^{21}$ represents a hydrogen atom or an alkyl group; or $R^{20}$ and $R^{21}$ combine with each other and together represent a non-metallic atomic group necessary for forming a 5-membered, 6-membered or 7-membered ring which may contain a hetero atom selected from an oxygen atom, a sulfur atom and a nitrogen atom.

The alkyl group in formula (II) is preferably that having from 1 to 4 carbon atoms. The aryl group in formula (II) is preferably that having from 6 to 10 carbon atoms, for example, phenyl and naphthyl groups. The substituted aryl group includes the above-described aryl group substituted with, for example, a halogen atom, e.g., chlorine, and an alkyl group, e.g., methyl, or an alkoxy group, e.g., methoxy or ethoxy. $R^{21}$ preferably represents an alkyl group having from 1 to 4 carbon atoms. Specific examples of the thio compound represented by formula (II) include the following compounds:

| No. | $R^{20}$ | $R^{21}$ |
|-----|----------|----------|
| 1   | H        | H        |
| 2   | H        | $CH_3$   |
| 3   | $CH_3$   | H        |
| 4   | $CH_3$   | $CH_3$   |
| 5   | $C_6H_5$ | $C_2H_5$ |

-continued

| No. | $R^{20}$ | $R^{21}$ |
|---|---|---|
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4-CH_3$ | $C_4H_9$ |
| 10 | $C_6H_4-OCH_3$ | $CH_3$ |
| 11 | $C_6H_4-OCH_3$ | $C_2H_5$ |
| 12 | $C_6H_4OC_2H_5$ | $CH_3$ |
| 13 | $C_6H_4OC_2H_5$ | $C_2H_5$ |
| 14 | $C_6H_4OCH_3$ | $C_4H_9$ |
| 15 | $-(CH_2)_2-$ | |
| 16 | $-(CH_2)_2-S-$ | |
| 17 | $-CH(CH_3)-CH_2-S-$ | |
| 18 | $-CH_2-CH(CH_3)-S-$ | |
| 19 | $-C(CH_3)_2-CH_2-S-$ | |
| 20 | $-CH_2-C(CH_3)_2-S-$ | |
| 21 | $-(CH_2)_2O-$ | |
| 22 | $-CH(CH_3)-CH_2-O-$ | |
| 23 | $-C(CH_3)_2-CH_2-O-$ | |
| 24 | $-CH=CH-N(CH_3)-$ | |
| 25 | $-(CH_2)_3S-$ | |
| 26 | $-(CH_2)_2CH(CH_3)-S-$ | |
| 27 | $-(CH_2)_3O-$ | |
| 28 | $-(CH_2)_5-$ | |
| 29 | $-C_6H_4-O-$ | |
| 30 | $-N=C(SCH_3)-S-$ | |
| 31 | $-C_6H_4-NH-$ | |
| 32 | 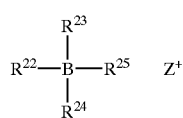 | |

The hexaarylbiimidazole compound (e), which is a still further example of the radical initiator for use in the present invention, includes lophine dimers as described in JP-B-45-37377 and JP-B-44-86516, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The ketoxime ester compound (f), which is a still further example of the radical initiator for use in the present invention, includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate compound (g), which is a still further example of the radical initiator for use in the present invention, includes compounds represented by the following formula (III):

$$R^{22}-\underset{\underset{R^{24}}{|}}{\overset{\overset{R^{23}}{|}}{B}}-R^{25} \quad Z^+ \tag{III}$$

wherein $R^{22}$, $R^{23}$, $R^{24}$ and $R^{25}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, or at least two of $R^{22}$, $R^{23}$, $R^{24}$ and $R^{25}$ may combine with each other to form a cyclic structure, provided that at least one of $R^{22}$, $R^{23}$, $R^{24}$ and $R^{25}$ represents a substituted or unsubstituted alkyl group; and $Z^+$ represents an alkali metal cation or a quaternary ammonium cation.

The alkyl group represented by $R^{22}$ to $R^{25}$ includes a straight chain, branched or cyclic alkyl group, and preferably has from 1 to 18 carbon atoms. Specific examples thereof include methyl, ethyl, propyl, isopropyl, butyl, pentyl, hexyl, octyl, stearyl, cyclobutyl, cyclopentyl and cyclohexyl groups. The substituted alkyl group represented by $R^{22}$ to $R^{25}$ includes the above-described alkyl group substituted with a halogen atom (e.g., chlorine or bromine), a cyano group, a nitro group, an aryl group (e.g., phenyl), a hydroxy group, $-N(R^{26})(R^{27})$ (wherein $R^{26}$ and $R^{27}$, which may be the same or different, each represents a hydrogen atom, an alkyl group having from 1 to 14 carbon atoms or an aryl group), $-COOR^{28}$ (wherein $R^{28}$ represents a hydrogen atom, an alkyl group having from 1 to 14 carbon atoms or an aryl group) $-OCOR^{29}$ (wherein $R^{29}$ represents an alkyl group having from 1 to 14 carbon atoms or an aryl group) or $-OR^{30}$ (wherein $R^{30}$ represents an alkyl group having from 1 to 14 carbon atoms or an aryl group). The aryl group represented by $R^{22}$ to $R^{25}$ includes an aryl group having from one to three rings, for example, phenyl or naphthyl. The substituted aryl group represented by $R^{22}$ to $R^{25}$ includes the above-described aryl group substituted with the substituent described for the substituted alkyl group above or an alkyl group having from 1 to 14 carbon atoms. The alkenyl group represented by $R^{22}$ to $R^{25}$ includes a straight chain, branched or cyclic alkenyl group having from 2 to 18 carbon atoms. In the substituted alkenyl group, the substituent includes the substituents described for the substituted alkyl group above. The alkynyl group represented by $R^{22}$ to $R^{25}$ includes a straight chain, branched or cyclic alkynyl group having from 2 to 28 carbon atoms. In the substituted alkynyl group, the substituent includes the substituents described for the substituted alkyl group above. The heterocyclic group represented by $R^{22}$ to $R^{25}$ includes a 5-membered or more heterocyclic group, preferably a 5-membered, 6-membered or 7-membered heterocyclic group, containing at least one hetero atom selected from a nitrogen atom, a sulfur atom and an oxygen atom. The heterocyclic group may have a condensed ring. In the substituted heterocyclic group, the substituent includes the substituents described for the substituted aryl group above. Specific examples of the compound represented by formula (III) include compounds described in U.S. Pat. Nos. 3,567,453 and 4,343,891, European Patents 109,772 and 109,773, and the following compounds:

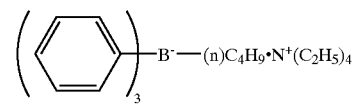

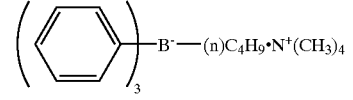

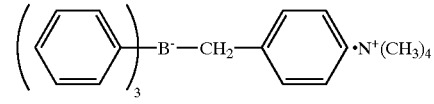

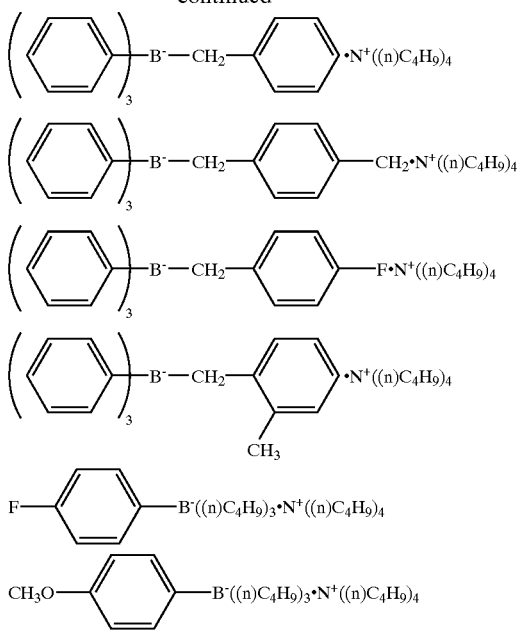

The azinium compound (h), which is a still further example of the radical initiator for use in the present invention, includes compounds having an N—O bond as described in JP-A-63-138345, JP-A-63-142345, JP-A-63-142346, JP-A-63-143537 and JP-B-46-42363.

The metallocene compound (i), which is a still further example of the radical initiator for use in the present invention, includes titanocene compounds as described in JP-A-59-152396, JP-A-61-151197, JP-A-63-41484, JP-A-2-249 and JP-A-2-4705, and iron-arene complexes as described in JP-A-1-304453 and JP-A-1-152109.

Specific examples of the titanocene compound include dicyclopentadienyl-Ti-dichloride, dicyclopentadienyl-Ti-biphenyl, dicyclopentadienyi-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis[2,6-difluoro-3-(pyr-1-yl)phenyl]-titanium, bis(cyclopentadienyl)bis[2,6-difluoro-3-(methylsulfonamido)phenyl]titanium, bis(cyclopentadienyl)bis[2,6-difluoro-3-(N-butylpivaloylamino)phenyl]titanium, bis(cyclopentadienyl)bis[2,6-difluoro-3-(N-ethylacetylamino)phenyl]titanium, bis(cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis(cyclopentadienyl)bis[2,6-difluoro-3-(N-ethyl-(2,2-dimethylbutanoyl)amino)phenyl]titanium, bis(cyclopentadienyl)bis[2,6-difluoro-3-(N-butyl-(2,2-dimethylbutanoyl)amino)phenyl]titanium, bis(cyclopentadienyl)bis[2,6-difluoro-3-(N-pentyl-(2,2-dimethylbutanoyl)amino)phenyl]titanium, bis(cyclopentadienyl)bis[2,6-difluoro-3-(N-hexyl-(2,2-dimethylbutanoyl)amino)phenyl]titanium, bis(cyclopentadienyl)bis[2,6-difluoro-3-(N-methylbutyrylamino)phenyl]titanium, bis(cyclopentadienyl) bis[2,6-difluoro-3-(N-methylpentanoylamino)phenyl]titanium, bis(cyclopentadienyl)bis[2,6-difluoro-3-(N-ethylcyclohexylcarbonylamino)phenyl]titanium bis(cyclopentadienyl)bis[2,6-difluoro-3-(N-ethylisobutyrylamino)phenyl]titanium, bis(cyclopentadienyl)bis[2,6-difluoro-3-(N-ethylacetylamino)phenyl]titanium, bis(cyclopentadienyl)bis[2,6-difluoro-3-(2,2,5,5-tetramethyl-1,2,5-azadisilolidin-1-yl)phenyl]titanium, bis(cyclopentadienyl)bis[2,6-difluoro-3-(octylsulfonamido)phenyl]titanium, bis(cyclopentadienyl)bis[2,6-difluoro-3-(4-tolylsulfonamido)phenyl]titanium, bis(cyclopentadienyl)bis[2,6-difluoro-3-(4-dodecylphenylsulfonylamido)phenyl]titanium, bis(cyclopentadienyl)bis[2,6-difluoro-3-(4-(1-pentylheptyl)phenylsulfonylamido)phenyl]titanium, bis(cyclopentadienyl)bis[2,6-difluoro-3-(ethylsulfonylamido)phenyl]titanium, bis(cyclopentadienyl)bis[2,6-difluoro-3-((4-bromophenyl)-sulfonylamido)phenyl]titanium, bis(cyclopentadienyl)bis[2,6-difluoro-3-(2-naphthylsulfonylamido)phenyl]titanium, bis(cyclopentadienyl)bis[2,6-difluoro-3-(hexadecyl-sulfonylamido)phenyl]titanium, bis(cyclopentadienyl)bis[2,6-difluoro-3-(N-methyl-(4-dodecylphenyl)sulfonylamido)phenyl]titanium, bis(cyclopentadienyl)bis[2,6-difluoro-3-(N-methyl-(4-(1-pentylheptyl)phenyl)sulfonylamido)phenyl]titanium, bis(cyclopentadienyl)bis[2,6-difluoro-3-(N-hexyl-(4-tolyl)sulfonylamido)phenyl]titanium, bis(cyclopentadienyl)bis[2,6-difluoro-3-(pyrrolidin-2,5-dion-1-yl)phenyl]titanium, bis(cyclopentadienyl)bis[2,6-difluoro-3-(3,4-dimethyl-3-pyrrolidin-2,5-dion-1-yl)phenyl]titanium, bis(cyclopentadienyl)bis[2,6-difluoro-3-(phtalimido)-phenyl]titanium, bis(cyclopentadienyl)bis[2,6-difluoro-3-(isobutoxy-carbonylamino)phenyl]titanium, bis(cyclopentadienyl)bis[2,6-difluoro-3-(ethoxy-carbonylamino)phenyl]titanium, bis(cyclopentadienyl)bis[2,6-difluoro-3-((2-chloroethoxy)-carbonylamino)phenyl]titanium, bis(cyclopentadienyl)bis[2,6-difluoro-3-(phenoxy-carbonylamino)phenyl]titanium, bis(cyclopentadienyl)bis[2,6-difluoro-3-(3-phenyl-thioureido)phenyl]titanium, bis(cyclopentadienyl)bis[2,6-difluoro-3-(3-butyl-thioureido)phenyl]titanium, bis(cyclopentadienyl)bis[2,6-difluoro-3-(3-phenyl-ureido)phenyl]titanium, bis(cyclopentadienyl)bis[2,6-difluoro-3-(3-butyl-ureido)phenyl]titanium, bis(cyclopentadienyl)bis[2,6-difluoro-3-(N,N-diacetylamino)phenyl]titanium, bis(cyclopentadienyl)bis[2,6-difluoro-3-(3,3-dimethylureido)phenyl]titanium, bis(cyclopentadienyl)bis[2,6-difluoro-3-(acetylamino)-phenyl]titanium, bis(cyclopentadienyl)bis[2,6-difluoro-3-(butyrylamino)-phenyl]titanium, bis(cyclopentadienyl)bis[2,6-difluoro-3-(decanoylamino)-phenyl]titanium, bis(cyclopentadienyl)bis[2,6-difluoro-3-(octadecanoylamino)phenyl]titanium, bis(cyclopentadienyl)bis[2,6-difluoro-3-(isobutyrylamino)-phenyl]titanium, bis(cyclopentadienyl)bis[2,6-difluoro-3-(2-ethylhexanoyl-amino)phenyl]titanium, bis(cyclopentadienyl)bis[2,6-difluoro-3-(2-methylbutanoyl-amino)phenyl]titanium, bis(cyclopentadienyl)bis[2,6-difluoro-3-(pivaloylamino)-phenyl]titanium, bis(cyclopentadienyl)bis[2,6-difluoro-3-(2,2-dimethyl-butanoylamino)phenyl]titanium, bis(cyclopentadienyl)bis[2,6-difluoro-3-(2-ethyl-2-methyl-heptanoylamino)phenyl]titanium, bis(cyclopentadienyl)bis[2,6-difluoro-3-(cyclohexylcarbonylamino)phenyl]titanium, bis(cyclopentadienyl)bis[2,6-difluoro-3-(2,2-dimethyl-3-chloropropanoylamino)phenyl]titanium, bis(cyclopentadienyl)bis[2,6-difluoro-3-(3-phenyl-propanoylamino)phenyl]titanium, bis(cyclopentadienyl)bis[2,6-difluoro-3-(2-chloromethyl-2-methyl-3- chloropropanoylamino)phenyl]titanium, bis(cyclopentadienyl)bis[2,6-difluoro-3-(3,4-xyloylamino)phenyl]titanium, bis(cyclopentadienyl)bis[2,6-difluoro-3-(4-ethylbenzoyl-amino)phenyl]titanium, bis(cyclopentadienyl)bis[2,6-difluoro-3-(2,4,6-mesitylcarbonylamino)phenyl]titanium, bis(cyclopentadienyl)bis[2,6-difluoro-3-(benzoylamino)-phenyl]titanium, bis(cyclopentadienyl)bis[2,6-difluoro-3-(N-(3-phenylpropyl)-benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis(cyclopentadienyl)bis[2,6-difluoro-3-(N-isobutyl-benzoylamino)phenyl]titanium, bis(cyclopentadienyl)bis[2,6-difluoro-3-(N-cyclohexylmethylpivaloylamino)phenyl]titanium, bis(cyclopentadienyl)bis[2,6-difluoro-3-(N-(oxolan-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl)-(4-tolyl)amino)phenyl]titanium, bis(cyclopentadienyl)bis[2,6-difluoro-3-(N-(oxolan-2-ylmethyl)-(4-tolyl)amino)phenyl]titanium, bis(cyclopentadienyl)bis[2,6-difluoro-3-(N-(4-toluylmethyl)-benzoylamino)phenyl]titanium, bis(cyclopentadienyl)bis[2,6-difluoro-3-(N-(4-toluylmethyl)-(4-toluyl)amino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-butyl-(4-toluyl)amino)phenyl]titanium, bis(cyclopentadienyl)bis[2,6-difluoro-3-(N-hexyl-(4-toluyl)amino)phenyl]titanium, bis(cyclopentadienyl)bis[2,6-difluoro-3-(N-(2,4-dimethylpentyl)-2,2-dimethylbutanoylamino)phenyl]titanium, bis(cyclopentadienyl)bis[2,6-difluoro-3-(N-(2,4-dimethylpentyl)-2,2-dimethylpentanoylamino)phenyl]titanium, bis(cyclopentadienyl)bis[2,6-difluoro-3-((4-toluyl)amino)-phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino)phenyl]titanium, bis(cyclopentadienyl)bis[2,6-difluoro-3-(N-cyclohexylmethylbenzoylamino)phenyl]titanium, bis(cyclopentadienyl)bis[2,6-difluoro-3-(N-cyclohexylmethyl-(4-toluyl)amino)phenyl]titanium, bis(cyclopentadienyl)bis[2,6-difluoro-3-(N-(2-ethylhexyl)benzoylamino)phenyl]titanium, bis(cyclopentadienyl)bis[2,6-difluoro-3-(N-isopropylbenzoylamino)phenyl]titanium, bis(cyclopentadienyl)bis[2,6-difluoro-3-(N-(3-phenylpropyl)-2,2-dimethylpentanoylamino)phenyl]titanium, bis(cyclopentadienyl)bis[2,6-difluoro-3-(N-hexylbenzoylamino)phenyl]titanium, bis(cyclopentadienyl)bis[2,6-difluoro-3-(N-cyclohexylmethyl-2,2-dimethylpentanoylamino)phenyl]titanium, bis(cyclopentadienyl)bis[2,6-difluoro-3-(N-butylbenzoylamino)phenyl]titanium, bis(cyclopentadienyl)bis[2,6-difluoro-3-(N-(2-ethylhexyl)-2,2-dimethylpentanoylamino)phenyl]titanium, bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium, bis(cyclopentadienyl)bis[2,6-difluoro-3-(N-(3-phenylpropyl)pivaloylamino)phenyl]titanium, bis(cyclopentadienyl)bis[2,6-difluoro-3-(N-butyl-2,2-dimethylpentanoylamino)phenyl]titanium, bis(cyclopentadienyl)bis[2,6-difluoro-3-(N-(2-methoxyethyl)benzoylamino)phenyl]titanium, bis(cyclopentadienyl)bis[2,6-difluoro-3-(N-benzylbenzoylamino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxyethyl)-(4-toluyl)amino)phenyl]titanium, bis(cyclopentadienyl)bis[2,6-difluoro-3-(N-(4-methylphenyl-methyl)-2,2-dimethylpentanoylamino)phenyl]titanium, bis(cyclopentadienyl)bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl-(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-hexyl-(2-ethyl-2-methylbutanoyl)amino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxolan-2-ylmethyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoyl)amino)phenyl]titanium, bis(cyclopentadienyl)bis[2,6-difluoro-3-(3,3-dimethyl-2-azetidinon-1-yl)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropanoyl)-2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)amino)phenyl]titanium, bis(cyclopentadienyl)bis[2,6-difluoro-3-(N-butyl-(2-chloro-methyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropanoyl)-(2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6- difluoro-3-(N-isobutyl-(2,2-dimethyl-3-chloropropanoyl) amino)phenyl]titanium, bis(cyclopentadienyl)bis[2,6-difluoro-3-(N-butyl-(2-chloro-methyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(methylcyclopentadienyl)bis[2,6-difluoro-3-(N-hexyl-2,2-dimethylbutanonylamino)phenyl]titanium, bis(methylcyclopentadienyl)bis[2,6-difluoro-3-(N-hexyl-2,2-dimethylpentanonylamino)phenyl]titanium, bis(methylcyclopentadienyl)bis[2,6-difluoro-3-(N-ethylacetylamino)phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanonylamino)phenyl]titanium, bis(cyclopentadienyl)bis[2,6-difluoro-3-(N-(2-methoxyethyl)trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-trimethylpropyl)dimethylsilylamino)phenyl]titanium, bis(cyclopentadienyl)bis[2,6-difluoro-3-(3-ethoxymethyl-3-methyl-2-azetidinon-1-yl)phenyl]titanium, bis(cyclopentadienyl)bis[2,6-difluoro-3-(3-allyloxymethyl-3-methyl-2-azetidinon-1-yl)phenyl]titanium, bis(cyclopentadienyl)bis[2,6-difluoro-3-(3-chloromethyl-3-methyl-2-azetidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidinon-1-yl)phenyl]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-(2,3-dihydro-1,2-benzothiazol-3-on(1,1-dioxido)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenylmethyl-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolylsulfonylamino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclopentadienyl)bis[2,6-difluoro-3-(N-cyclohexylbenzoylamino)phenyl]titanium.

The active ester compound (j), which is a still further example of the radical initiator for use in the present invention, includes imidosulfonate compounds as described in JP-B-62-6223, and active sulfonates as described in JP-B-63-14340 and JP-A-59-174831.

Preferred examples of the compound having a carbon-halogen bond (k), which is a still further example of the radical initiator for use in the present invention, include the following compounds:

Compounds represented by the following formula (IV):

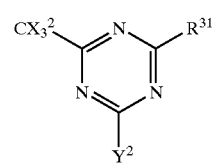

(IV)

wherein $X^2$ represents a halogen atom; $Y^2$ represents $-C(X^2)_3$, $-NH_2$, $-NHR^{32}$, $-N(R^{32})_2$ or $-OR^{32}$; $R^{32}$ represents an alkyl group, a substituted alkyl group, an aryl group or a substituted aryl group; and $R^{31}$ represents $-C(X^2)_3$, an alkyl group, a substituted alkyl group, an aryl group, a substituted aryl group or a substituted alkenyl group;

Compounds represented by the following formula (V):

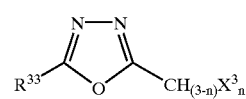

(V)

wherein $R^{33}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of from 1 to 3;

Compounds represented by the following formula (VI):

(VI)

wherein $R^{34}$ represents an aryl group or a substituted aryl group; $R^{35}$ represents

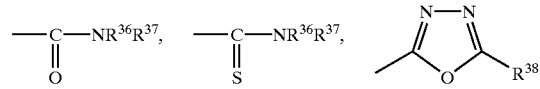

or a halogen atom; $Z^2$ represents $-C(=O)-$, $-C(=S)-$ or $-SO_2-$; $R^{36}$ and $R^{37}$ each represents an alkyl group, a substituted alkyl group, an alkenyl group, a substituted alkenyl group, an aryl group or a substituted aryl group; $R^{38}$ has the same meaning as defined for $R^{32}$ in formula (IV); $X^3$ represents a halogen atom; and m represents 1 or 2;

Compounds represented by the following formula (VII):

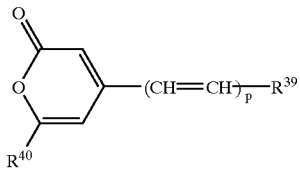
(VII)

wherein $R^{39}$ represents an aryl group which may be substituted or a heterocyclic group which may be substituted; $R^{40}$ represents a trihaloalkyl or trihaloalkenyl group having from 1 to 3 carbon atoms; and p represents 1, 2 or 3;

Carbonylmethylene heterocyclic compounds having a trihalogenomethyl group represented by the following formula (VIII):

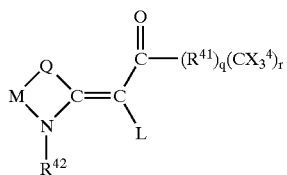
(VIII)

wherein L represents a hydrogen atom or a group represented by formula $—CO—(R^{41})_q(C(X^4)_3)_r$; Q represents a sulfur atom, a selenium atom, an oxygen atom, a dialkylmethylene group, an alken-1,2-ylene group, a 1,2-phenylene group or —N—R; M represents a substituted or unsubstituted alkylene group, a substituted or unsubstituted alkenylene group or a 1,2-arylene group; $R^{42}$ represents an alkyl group, an aralkyl group or an alkoxyalkyl group; $R^{41}$ represents a divalent carbocyclic or heterocyclic aromatic group; $X^4$ represents a chlorine atom, a bromine atom or an iodine atom; q represents 0 or 1; and r represents 1 or 2, provided that when q represents 0, r represents 1, and when q represents 1, r represents 1 or 2;

4-Halogeno-5-(halogenomethylphenyl)oxazole derivatives represented by the following formula (IX):

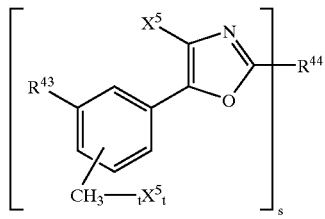
(IX)

wherein $X^5$ represents a halogen atom, t represents an integer of from 1 to 3; s represents an integer of from 1 to 4; $R^{43}$ represents a hydrogen atom or $—CH_{3-t}X^5_t$; and $R^{44}$ represents an s-valent unsaturated organic residue which may be substituted; and 2-(Halogenomethylphenyl)-4-halogenooxazole derivatives represented by the following formula (X):

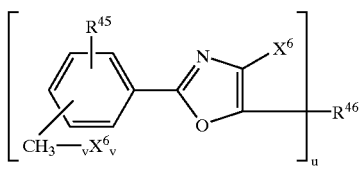
(X)

wherein $X^6$ represents a halogen atom, v represents an integer of from 1 to 3; u represents an integer of from 1 to 4; $R^{45}$ represents a hydrogen atom or $—CH_{3-v}X^6_v$; and $R^{46}$ represents an u-valent unsaturated organic residue which may be substituted.

Specific examples of the compound having a carbon-halogen bond include compounds as described in Wakabayashi et al., Bull. Chem. Soc. Japan, Vol. 42, page 2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; compounds as described in British Patent 1,388,492, for example, 2-styryl-4,6-bis(trichloromethyl)-S-triazine, 2-(p-methylstyryl)-4,6-bis(trichloromethyl)-S-triazine, 2-(p-methoxylstyryl)-4,6-bis(trichloromethyl)-S-triazine and 2-(p-methoxylstyryl)-4-amino-6-trichloromethyl-S-triazine; and compounds as described in JP-A-53-133428, for example, 2-(4-methoxynaphth-1-yl)-4,6-bis(trichloromethyl)-S-triazine, 2-(4-ethoxynaphth-1-yl)-4,6-bis(trichloromethyl)-S-triazine,2-[4-(2-ethoxyethyl)naphth-1-yl]-4,6-bis(trichloromethyl)-S-triazine, 2-(4,7-dimethoxynaphth-1-yl)-4,6-bis(trichloromethyl)-S-triazine and 2-(acenaphth-5-yl)-4,6-bis(trichloromethyl)-S-triazine; compounds as described in German Patent 3,337,024, for example,

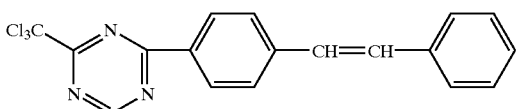

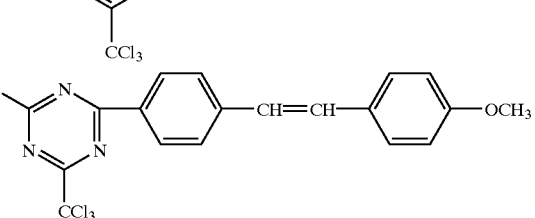

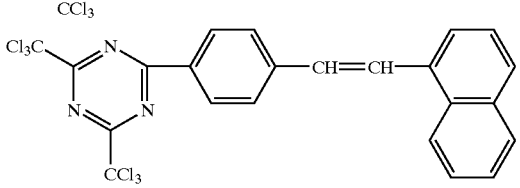

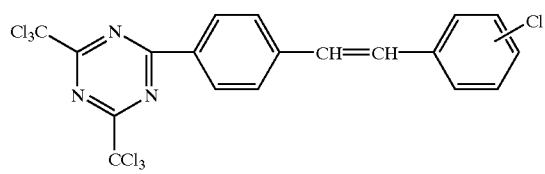

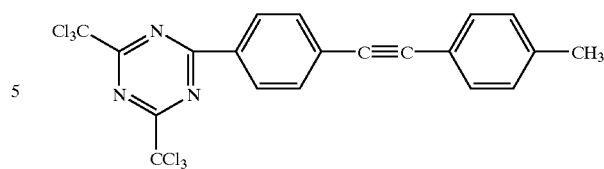

and other compounds, for example,

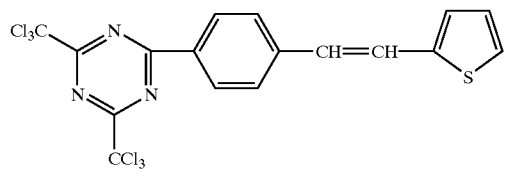

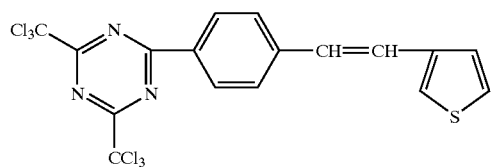

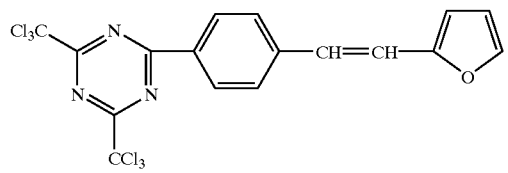

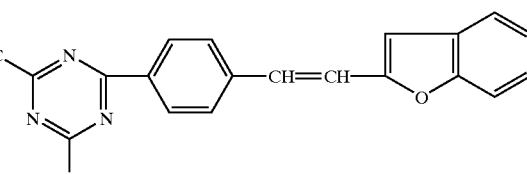

Specific examples of the compound having a carbon-halogen bond also include compounds as described in F. C. Schaefer et al., *J. Org. Chem.*, Vol. 29, page 1527 (1964), for example, 2-methyl-4,6-bis(tribromomethyl)-S-triazine, 2,4,6-tris(tri-bromomethyl)-S-triazine, 2,4,6-tris(dibromomethyl)-S-triazine, 2-amino-4-methyl-6-tribromomethyl-S-triazine and 2-methoxy-4-methyl-6-tribromomethyl-S-triazine; compounds as described in JP-A-62-58241, for example,

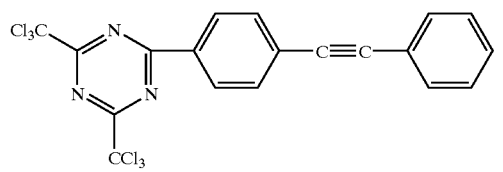

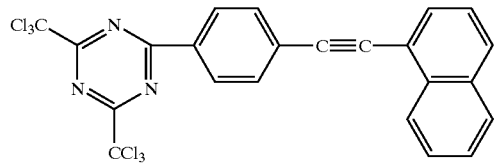

compounds as described in JP-A-5-281728, for example,

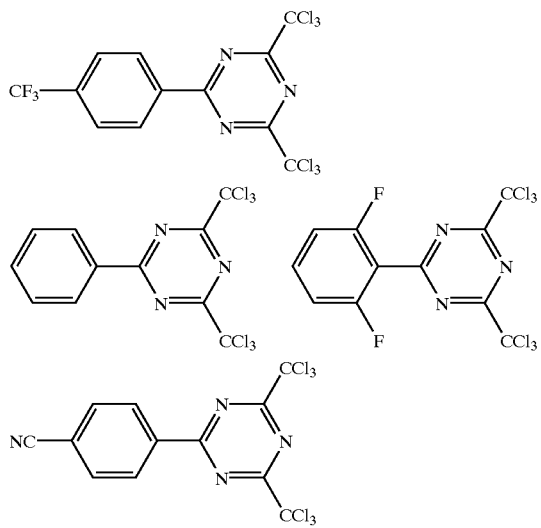

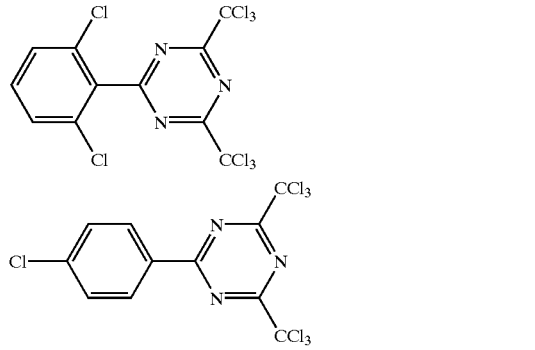

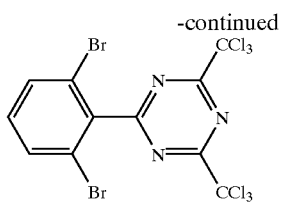
compounds which can be easily synthesized by one skilled in the art according to synthesis methods as described in M. P. Hutt, E. F. Elslager and L. M. Herbel, *Journal of Heterocyclic Chemistry*, Vol. 7, No. 3, page 511 (1970), for example,
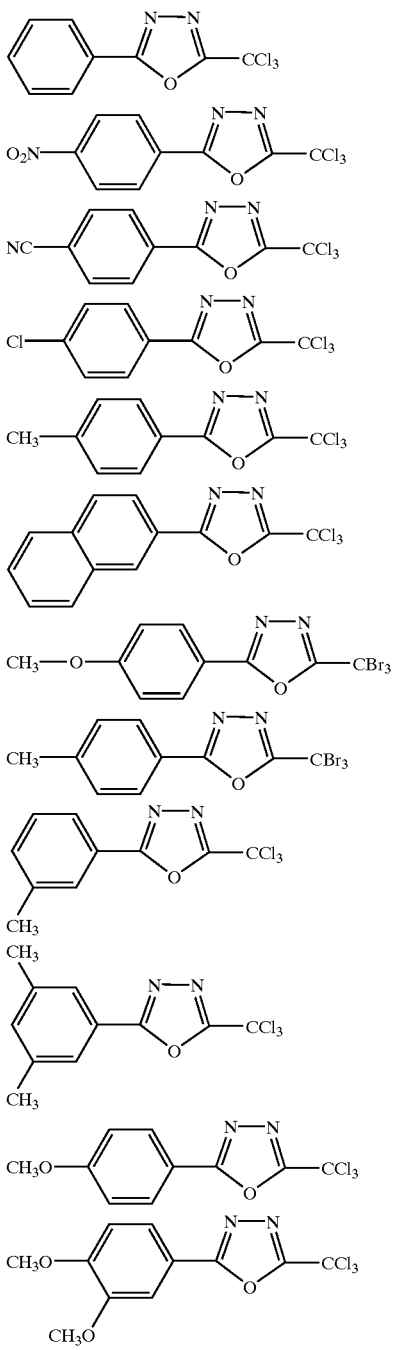
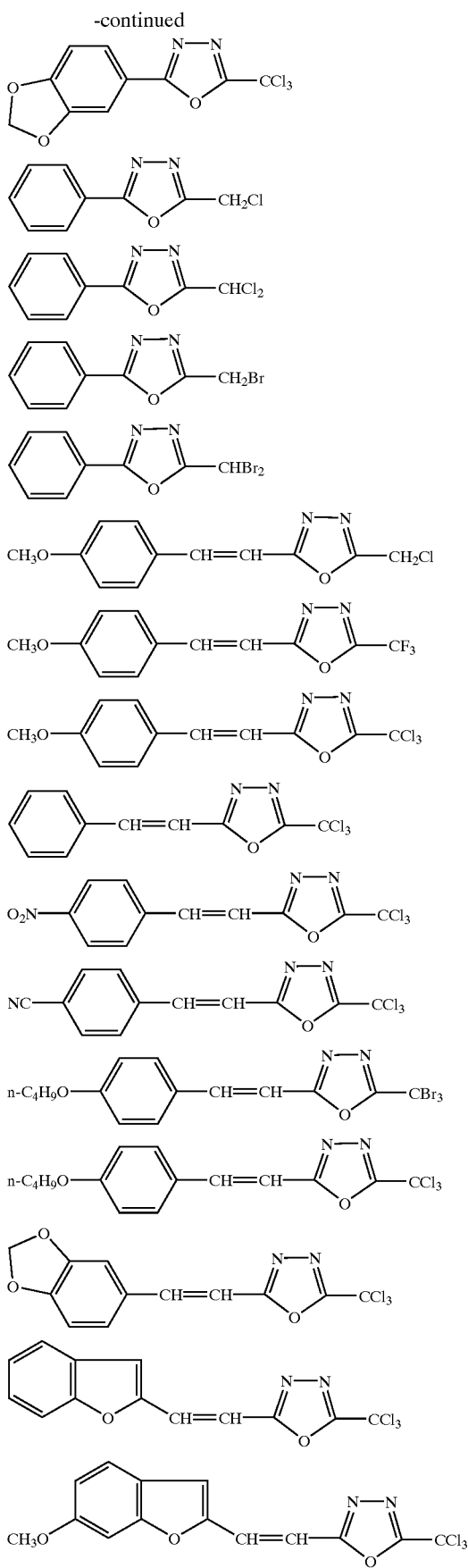

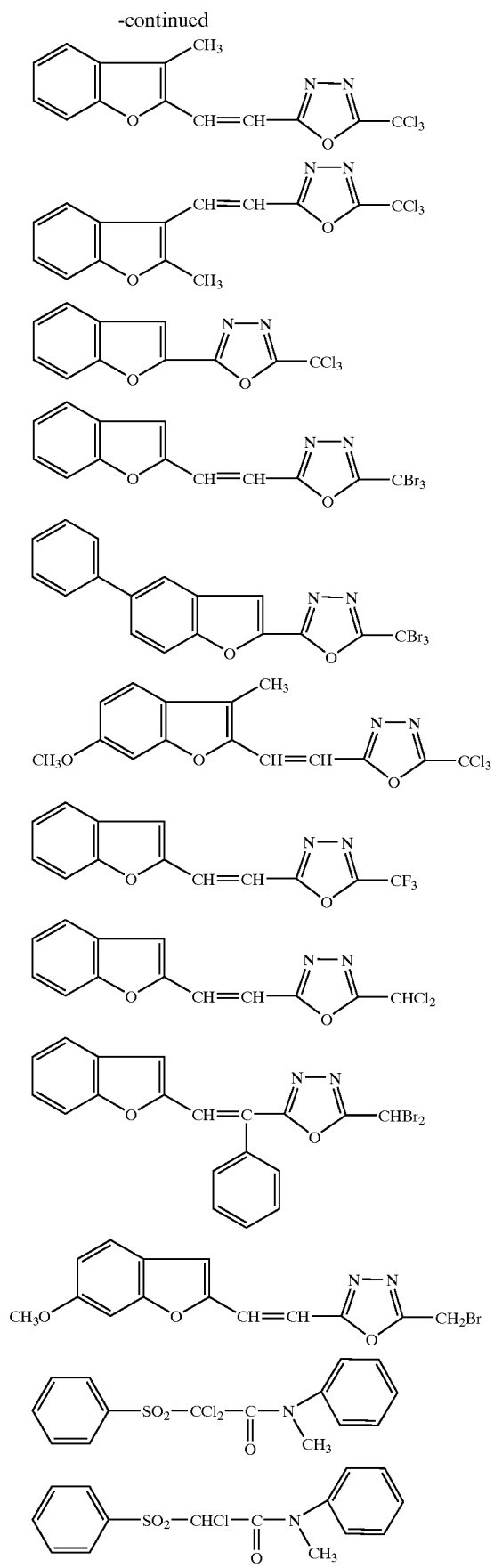
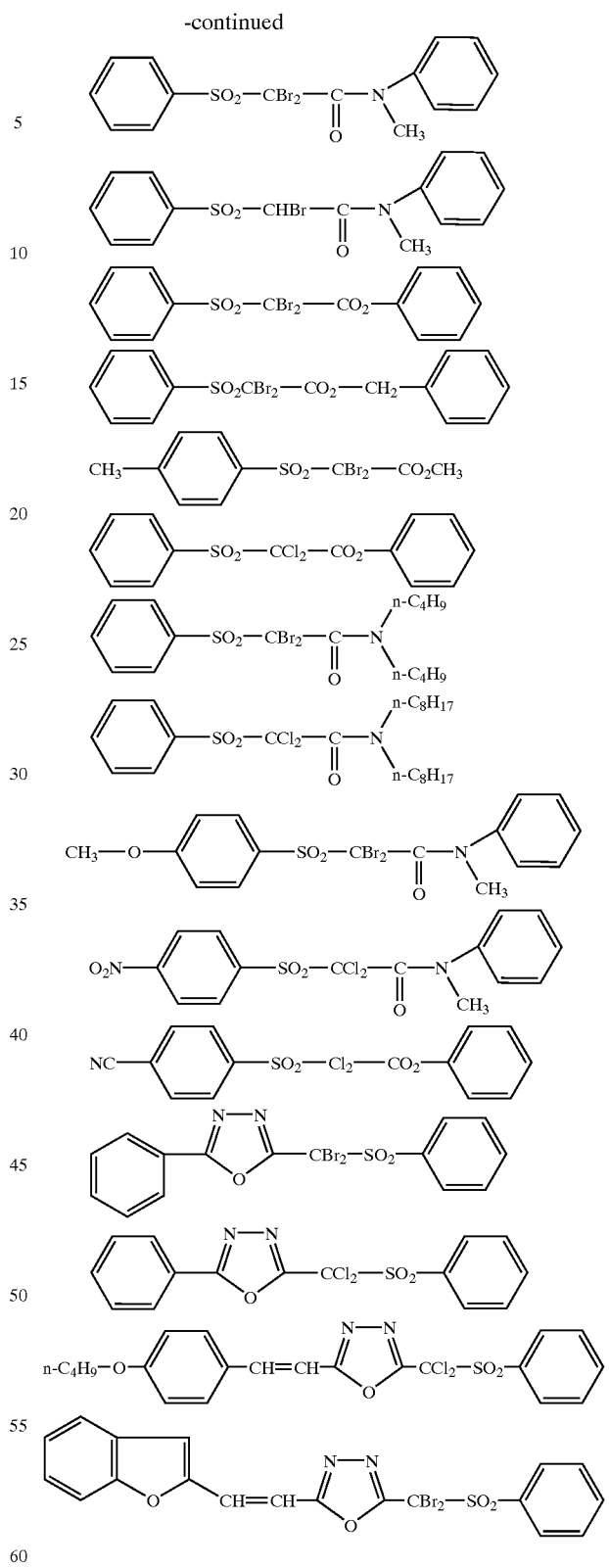
compounds as described in German Patent 2,641,100, for example, 4-(4-methoxystyryl)-6-(3,3,3-trichloropropenyl)-2-pyrrone and 4-(3,4,5-trimethoxystyryl)-6-trichloromethyl-2-pyrrone; compounds as described in German Patent 3,333,450, for example,

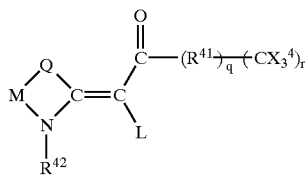

wherein $R^{41}$ represents a benzene ring; and R42 represents an alkyl group, an aralkyl group or an alkoxyalkyl group,

| | $R^{42}$ | M | L | q | $(CX^4_3)_r$ |
|---|---|---|---|---|---|
| 1 | $C_2H_5$ | 1,2-phenylene | H | 1 | 4-$CCl_3$ |
| 2 | $CH_2C_6H_5$ | 1,2-phenylene | H | 1 | 4-$CCl_3$ |
| 3 | $C_2H_5$ | 1,2-phenylene | H | 1 | 3-$CCl_3$ |
| 4 | $C_2H_5$ | 1,2-phenylene | H | 1 | 4-$CF_3$ |
| 5 | $C_2H_5$ | 5-$CH_3$-1,2-phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | 4-$CCl_3$ | compounds as described in German Patent 3,021,590, for example,

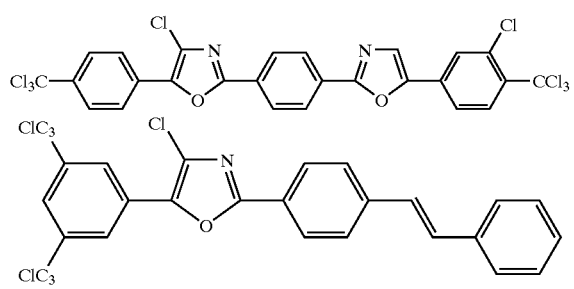

and compounds as described in German Patent 3,021,599, for example,

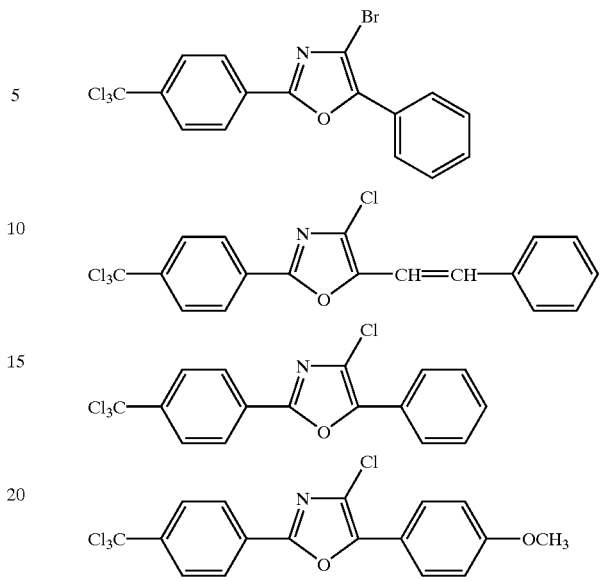

More preferred examples of the photopolymerization initiator for use in the present invention include the aromatic ketone (a), the aromatic onium salt compound (b), the organic peroxide (c), the hexaarylbiimidazole compound (e), the metallocene compound (i) and the compound having a carbon-halogen bond (k) as described above. Still more preferred examples of the photopolymerization initiator include an aromatic iodonium salt, an aromatic diazonium salt, a titanocene compound and a trihalomethyl-S-triazine compound represented by formula (IV). Also, the photopolymerization initiator selected from a sulfonium salt compound, a titanocene compound, a borate compound and a triazine compound are preferably used.

The photopolymerization initiators may be preferably employed individually or in combination of two or more thereof in the present invention.

A sensitizing dye, which may be used as one component of the photopolymerizable composition according to the present invention, includes a spectral sensitizing dye and a dyestuff or pigment that absorbs light of a light source and interacts with the photopolymerization initiator.

Preferred examples of the spectral sensitizing dye or dyestuff include a multi-nuclear aromatic compound (for example, pyrene, perylene or triphenylene), a xanthene (for example, Fluorescein, Eosine, Erythrocin, Rhodamine B or Rose Bengal), a cyanine (for example, thiacarbocyanine or oxacarbocyanine), a merocyanine (for example, merocyanine or carbomerocyanine), a thiazine (for example, Thionine, Methylene Blue or Toluidine blue), an acridine (for example, Acridine Orange, chloroflavine or acriflavine), a phthalocyanine (for example, phthalocyanine or metallophthalocyanine), a porphyrin (for example, tetraphenyl porphyrin or center metal-substituted porphyrin), a chlorophyll (for example, chlorophyll, chlorophyllin or center metal-substituted chlorophyll), a metal complex, for example,

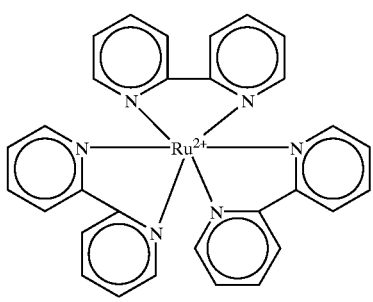

an anthraquinone (for example, anthraquinone), and a squalium (for example, squalium).

More preferred examples of the spectral sensitizing dye or dyestuff include styryl dyes as described in JP-B-37-13034, for example,

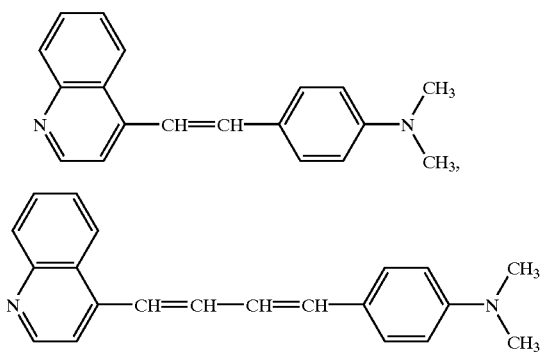

cationic dyes as described in JP-A-62-143044, for example,

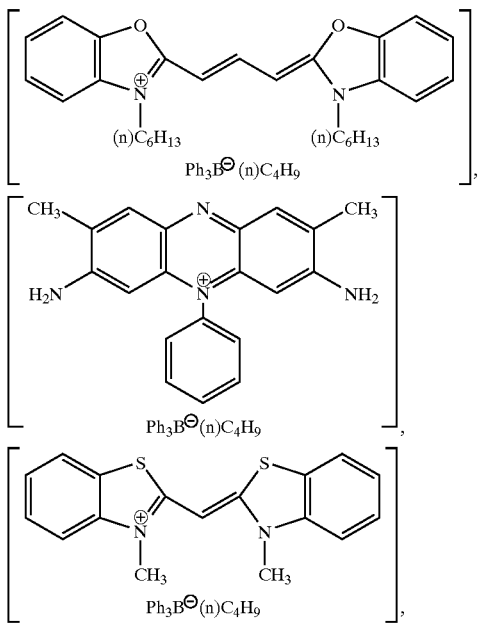

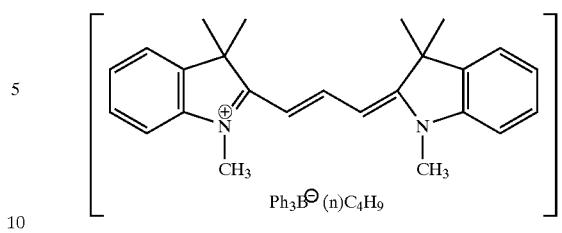

quinoxalinium salts as described in JP-B-59-24147, for example,

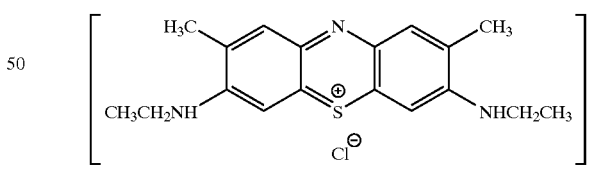

new Methylene Blue compounds as described in JP-A-64-33104, for example, anthraquinones as described in JP-A-64-56767, for example,

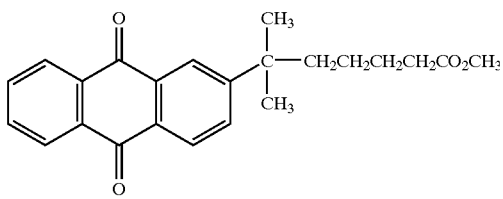

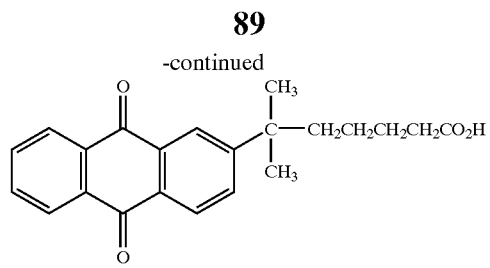
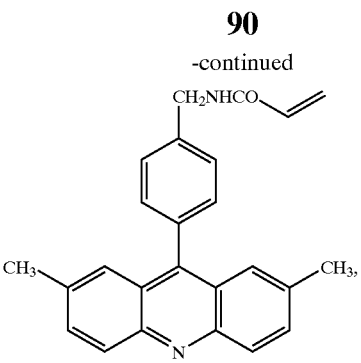
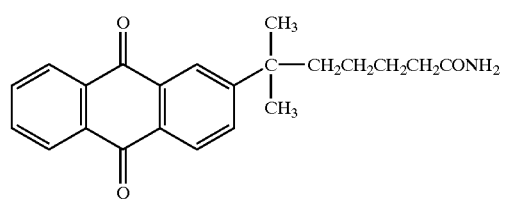
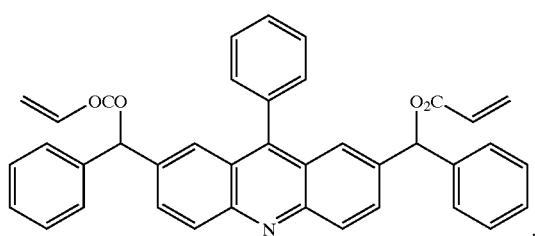
benzoxanthene dyes as described in JP-A-2-1714, acridines as described in JP-A-2-226148 and JP-A-2-226149, for example,
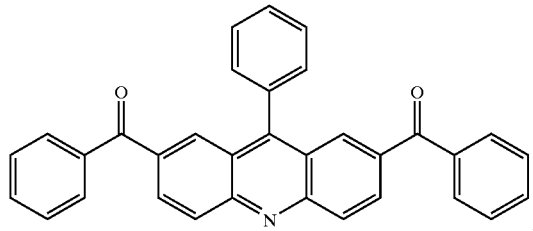
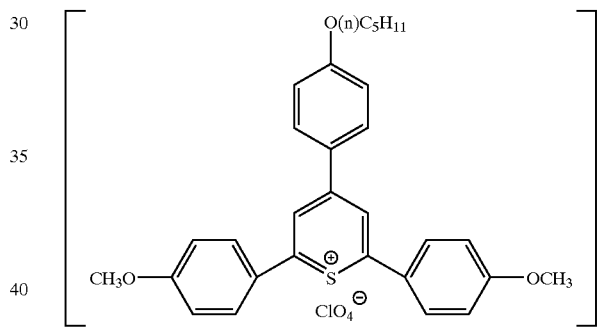
pyrylium salts as described in JP-B-40-28499, for example,
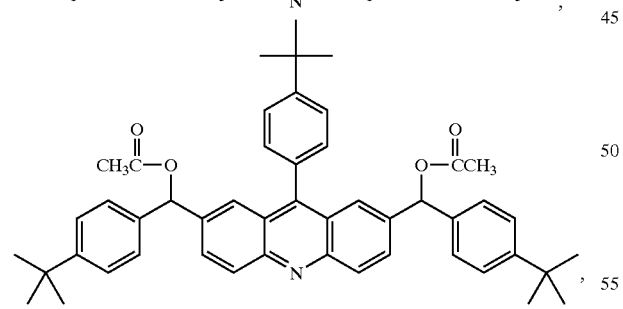
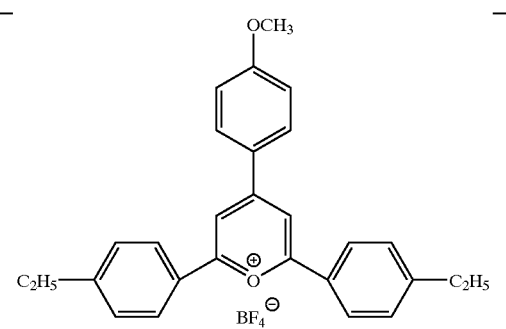
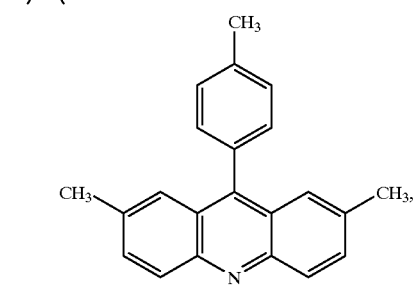
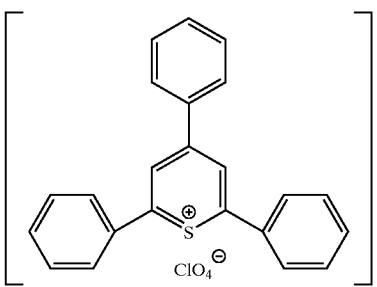

cyanines as described in JP-B-46-42363, for example,
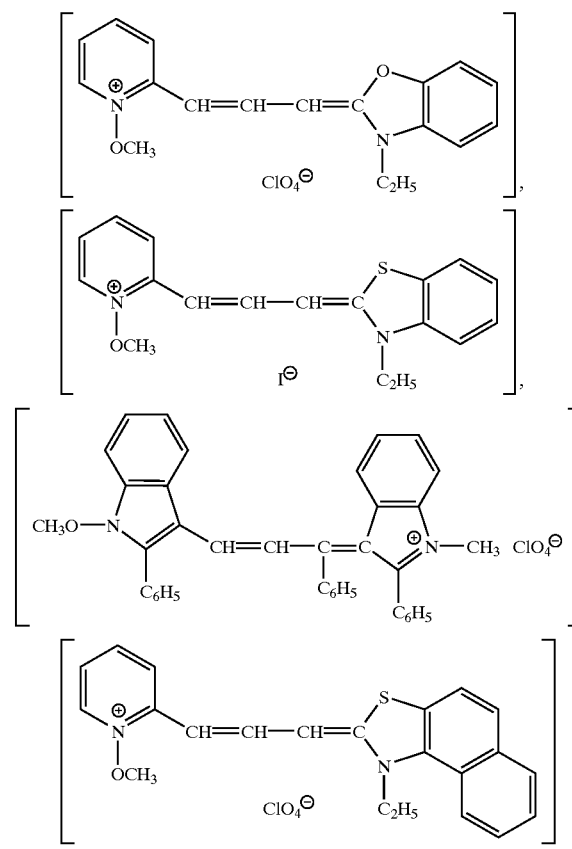
benzofuran dyes as described in JP-A-2-63053, for example,
conjugated ketone dyes as described in JP-A-2-85858 and JP-A-2-216154, for example,
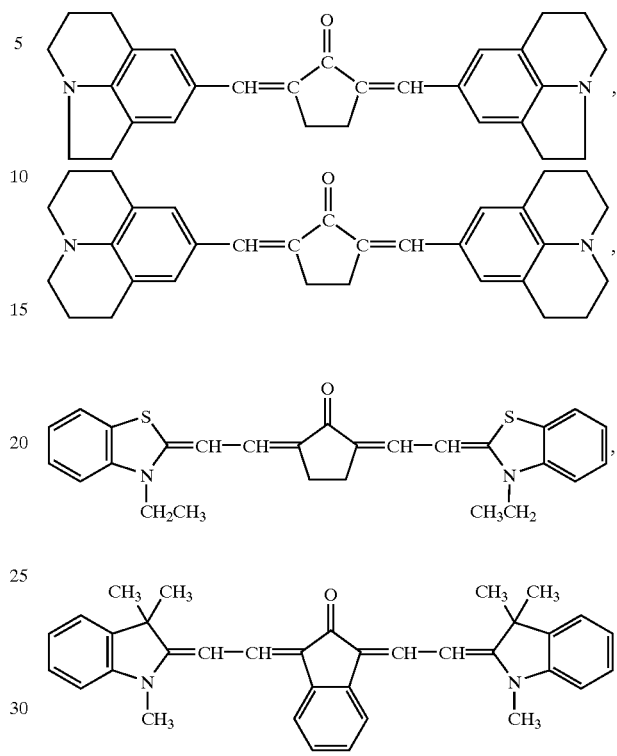
dyes as described in JP-A-57-10605, azocinnamylidene derivatives as described in JP-B-2-30321, for example,
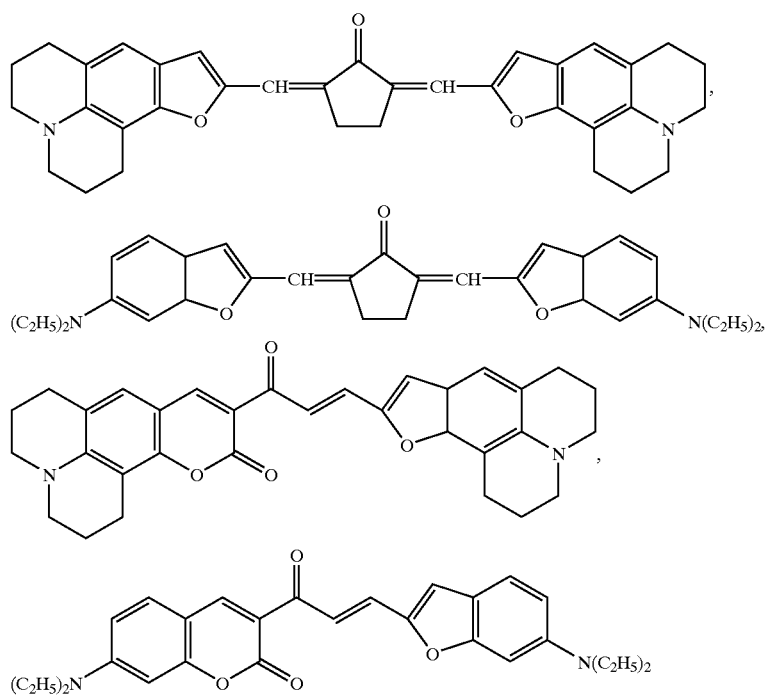

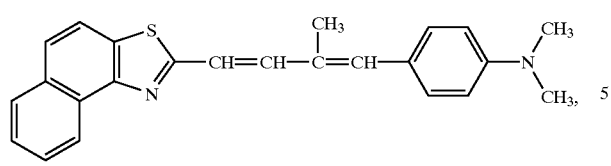
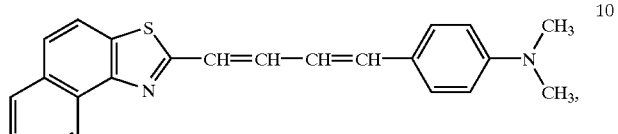
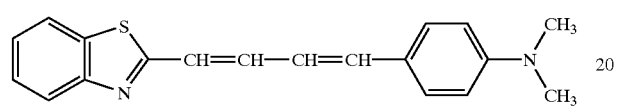
cyanines as described in JP-A-1-287105, for example,
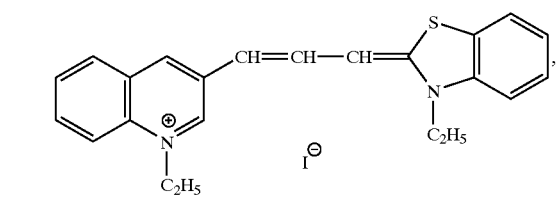
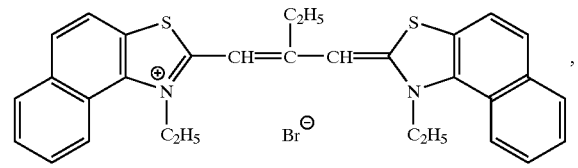
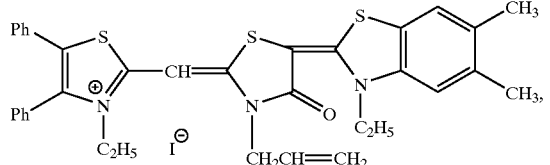
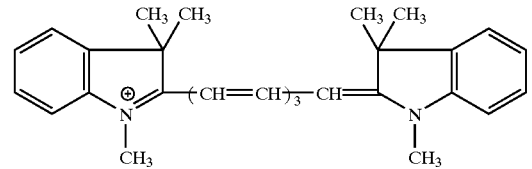
xanthene dyes as described in JP-A-62-31844, JP-A-62-31848 and JP-A-62-143043, for example,
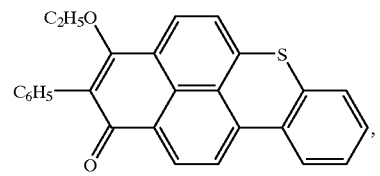
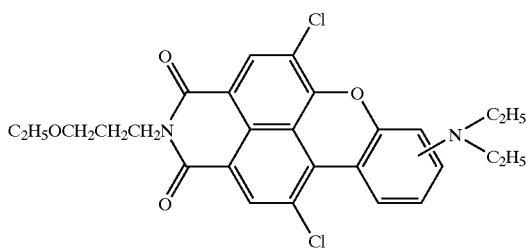
aminostyryl ketones as described in JP-B-59-28325, for example,
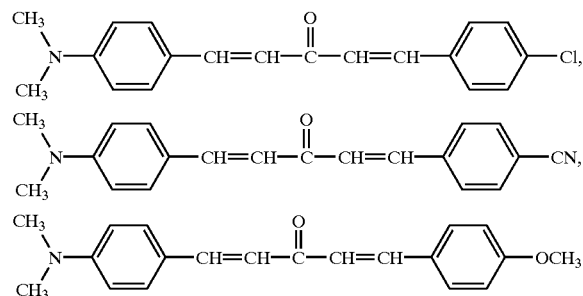
merocyanine dyes as described in JP-B-61-9621, for example, those represented by the following formulae [1] to [8]:
[1]
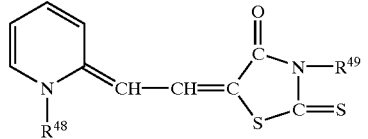
[2]
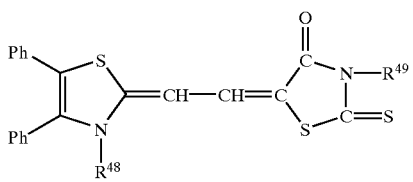
[3]
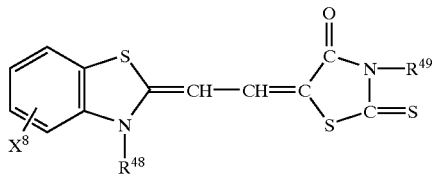
[4]
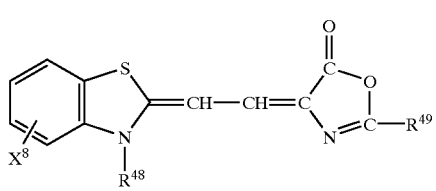

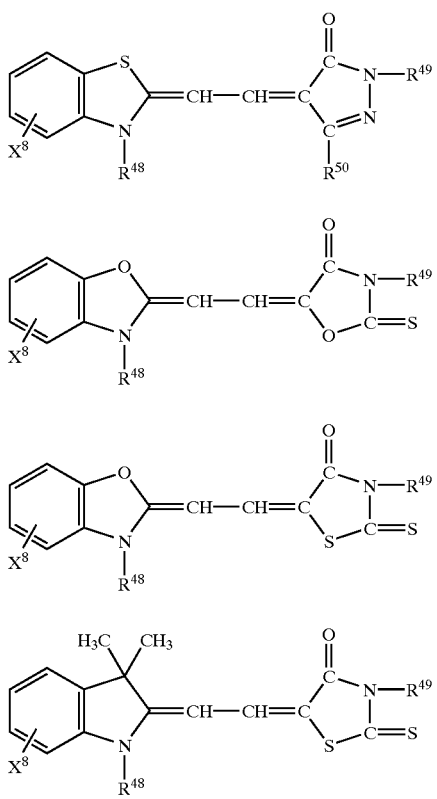

[5]

[6]

[7]

[8]

In formulae [3] to [8], $X^8$ represents a hydrogen atom, and alkyl group, a substituted alkyl group, an alkoxy group, and aryl group, a substituted aryl group, an aryloxy group, and aralkyl group or a halogen atom. In formula [2], Ph represents a phenyl group. In formulae [1] to [8], $R^{48}$, $R^{49}$ and $R^{50}$, which may be the same or different, each represent and alkyl group, a substituted alkyl group, an alkenyl group, an aryl group, a substituted aryl group or an aralkyl group, dyes as described in JP-A-2-179643, for example, those represented by the following formulae [9] to [11]:

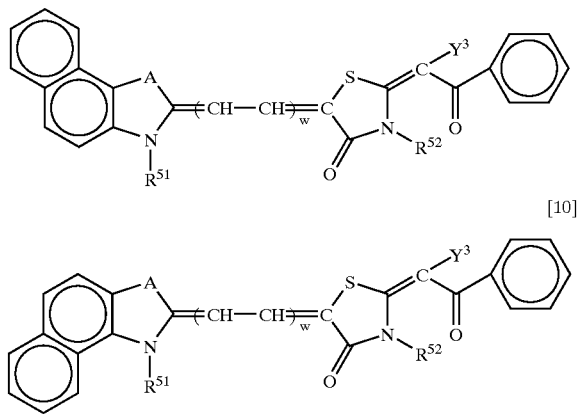

[9]

[10]

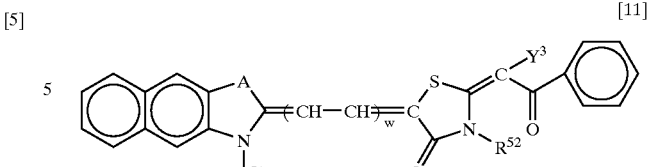

[11]

wherein A represents an oxygen atom, a sulfur atom, a selenium atom, a tellurium atom, a nitrogen atom substituted with an alkyl group or an aryl group or a carbon atom substituted with two alkyl groups; $Y^3$ represents a hydrogen atom, an alkyl group, a substituted alkyl group, an aryl group, a substituted aryl group, an aralkyl group, an acyl group or a substituted alkoxycarbonyl group; $R^{51}$ and $R^{52}$ each represent a hydrogen atom, an alkyl group having from 1 to 18 carbon atoms or a substituted alkyl group having from 1 to 18 carbon atoms and having as the substituent, $R^{53}O$—,

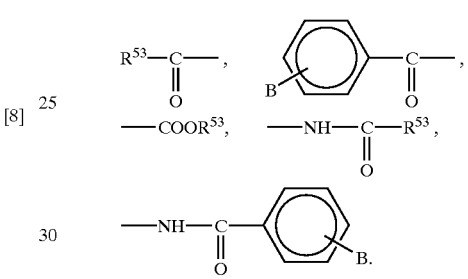

—$(CH_2CH_2O)_w$—$R^{53}$ or a halogen atom (e.g., F, Cl, Br or I); $R^{53}$ represents a hydrogen atom or an alkyl group having from 1 to 10 carbon atoms; B represents a dialkylamino group, a hydroxy group, an acyloxy group, a halogen atom or a nitro group; w represents an integer of from 0 to 4; and x represents an integer of from 1 to 20, merocyanine dyes as described in JP-A-2-244050, for example, those represented by the following formula [12]:

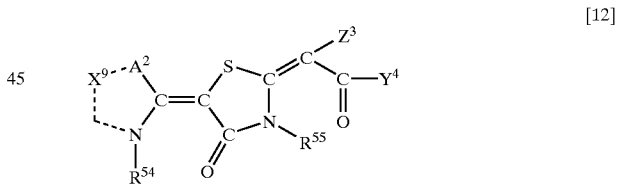

[12]

wherein $R^{54}$ and $R^{55}$ each independently represent a hydrogen atom, an alkyl group, a substituted alkyl group, an alkoxycarbonyl group, an aryl group, a substituted aryl group or an aralkyl group; $A^2$ represents an oxygen atom, a sulfur atom, a selenium atom, a tellurium atom, a nitrogen atom substituted with an alkyl group or an aryl group or a carbon atom substituted with two alkyl groups; $X^9$ represents a non-metallic atomic group necessary for forming a nitrogen-containing 5-membered heterocyclic ring; $Y^4$ represents a substituted phenyl group, an unsubstituted or substituted multinuclear aromatic ring or an unsubstituted or substituted heteroaromatic ring; and $Z^3$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group, or $Z^3$ and $Y^4$ may be combined with each other to form a ring;

and preferred specific examples of the merocyanine dye including

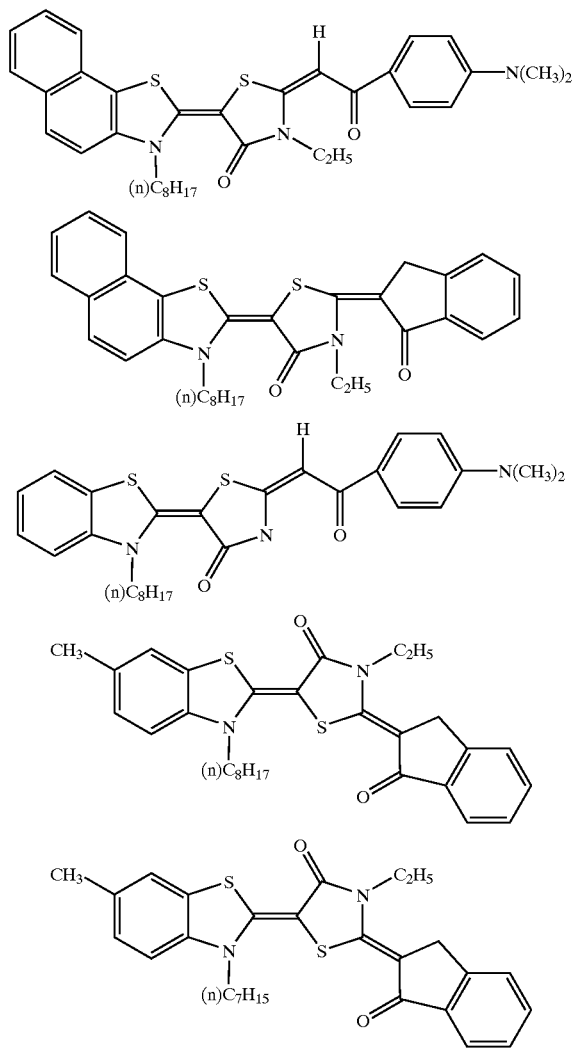

merocyanine dyes as described in JP-B-59-28326, for example, those represented by the following formula [13]:

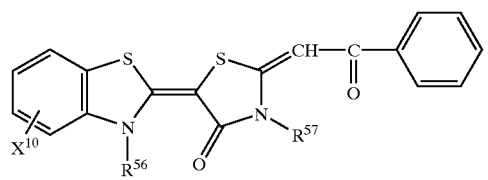

[13]

wherein $R^{56}$ and $R^{57}$, which may be the same or different, each represent a hydrogen atom, an alkyl group, a substituted alkyl group, an aryl group, a substituted aryl group or an aralkyl group; and $X^{10}$ represents a substituent having a Hammett sigma (σ) value ranging from −0.9 to +0.5, merocyanine dyes as described in JP-A-59-89303, for example, those represented by the following formula [14]:

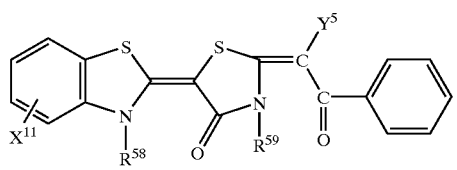

[14]

wherein $R^{58}$ and $R^{59}$ each independently represent a hydrogen atom, an alkyl group, a substituted alkyl group, an aryl group, a substituted aryl group or an aralkyl group; $X^{11}$ represents a substituent having a Hammett sigma (σ) value ranging from −0.9 to +0.5; and $Y^5$ represents a hydrogen atom, an alkyl group, a substituted alkyl group, an aryl group, a substituted aryl group, an aralkyl group, an acyl group or an alkoxycarbonyl group; and preferred specific examples of the merocyanine dye including

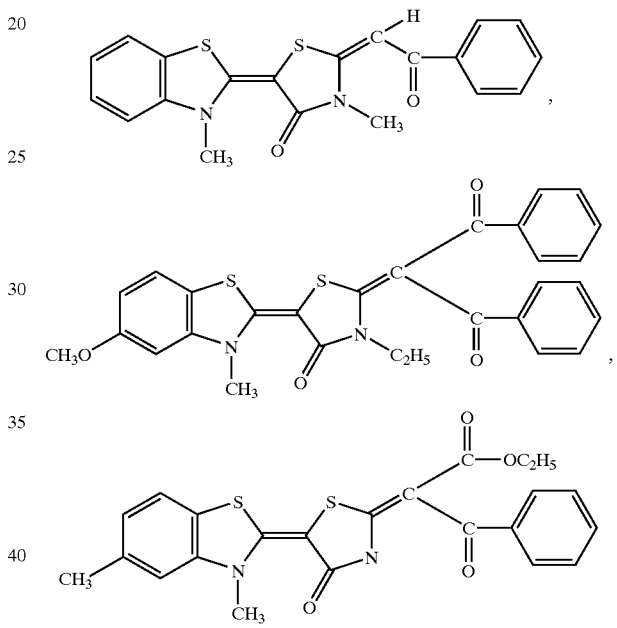

merocyanine dyes as described in JP-A-8-129257, for example, those represented by the following formula [15]:

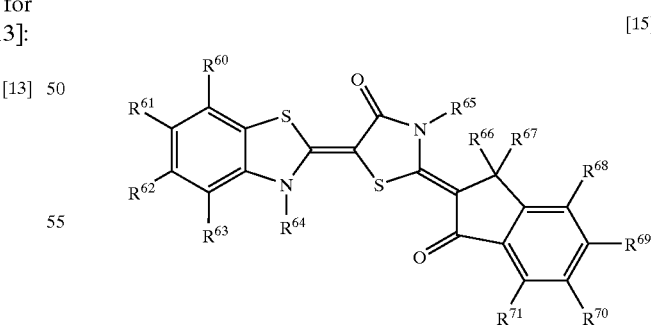

[15]

wherein $R^{60}$, $R^{61}$, $R^{62}$, $R^{63}$, $R^{68}$, $R^{69}$, $R^{70}$, $R^{71}$ each independently represent a hydrogen atom, a halogen atom, an alkyl group, a substituted alkyl group, an aryl group, a substituted aryl group, a hydroxy group, a substituted oxy group, a mercapto group, a substituted thio group, an amino group, a substituted amino group, a substituted carbonyl group, a sulfo group, a sulfonato group, a substituted sulfinyl group, a substituted sulfonyl group, a phosphono group, a substituted phosphono group, a phosphonato group, a substituted phosphonato group, a cyano group or a nitro group, or $R^{60}$ and $R^{61}$, $R^{61}$ and $R^{62}$, $R^{62}$ and $R^{63}$, $R^{68}$ and $R^{69}$, $R^{69}$ and $R^{70}$ or $R^{70}$ and $R^{71}$ may be combined with each other to from an aliphatic ring or an aromatic ring; $R^{64}$ represents a hydrogen atom, an alkyl group, a substituted alkyl group, an aryl group or a substituted aryl group, $R^{65}$ represents a substituted or unsubstituted alkenylalkyl group or a substituted or unsubstituted alkynylalkyl group; and $R^{66}$ and $R^{67}$ each independently represent a hydrogen atom, a halogen atom, an alkyl group, a substituted alkyl group, an aryl group, a substituted aryl group or a substituted carbonyl group; and preferred specific examples of the merocyanine dye including

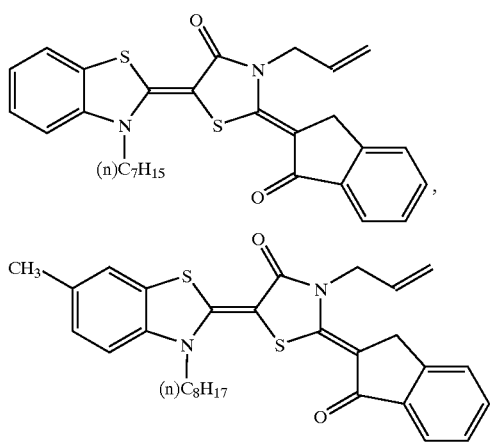

benzopyran dyes as described in JP-A-8-334897, for example, those represented by the following formula [16]:

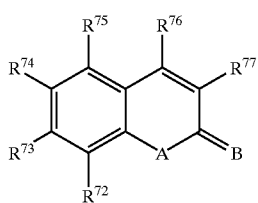

[16]

wherein $R^{72}$ to $R^{75}$ each independently represent a hydrogen atom, a halogen atom, an alkyl group, an aryl group, a hydroxy group, an alkoxy group or an amino group, or $R^{72}$ to $R^{75}$ may be combined with each other to form a ring composed of non-metallic atoms together with the carbon atoms; $R^{76}$ represents a hydrogen atom, an alkyl group, an aryl group, a heterocyclic group, a cyano group, an alkoxy group, a carboxy group or an alkenyl group; $R^{77}$ represents any one of the groups defined for $R^{76}$ or $-Z-R^{76}$; Z represents a carbonyl group, a sulfonyl group, a sulfinyl group or an arylenedicarbonyl group, or $R^{76}$ and $R^{77}$ may be combined with each other to form a ring composed of non-metallic atoms; A represents an oxygen atom, a sulfur atom, NH or a nitrogen atom having a substituent; B represents an oxygen atom or $=C(G1)(G2)$; and G1 and G2, which may be the same or different, each represent a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that G1 and G2 do not represent hydrogen atoms at the same time, or G1 and G2 may be combined with each other to form a ring composed of non-metallic atoms together with the carbon atom, and short wavelength type ketone and styryl dyes as described in EP-A-1048982, for example, those represented by the following formulae:

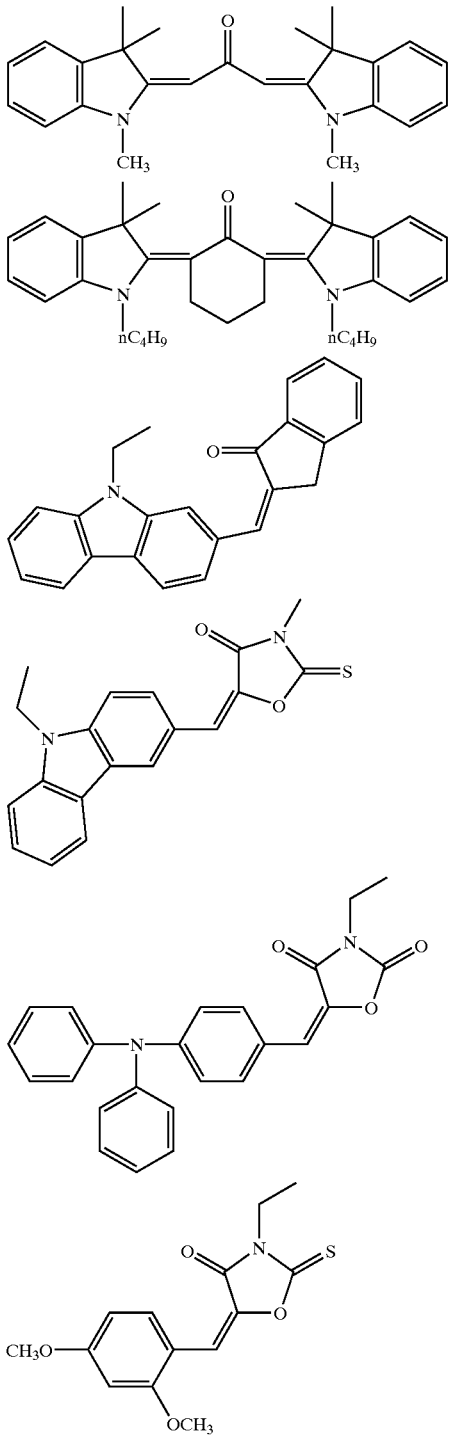

In addition, the infrared absorbing agents (including dyes and pigments) described below are particularly preferably used as the sensitizing dyes.

Preferred examples of the infrared absorbing dye include cyanine dyes as described, for example, in JP-A-58-125246, JP-A-59-84356, JP-A-59-202829 and JP-A-60-78787, and cyanine dyes as described in British Patent 434,875.

Other preferred examples of the infrared absorbing dye include near infrared absorbing sensitizers as described in U.S. Pat. No. 5,156,938, substituted arylbenzo(thio) pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063 and JP-A-59-146061, cyanine dyes as described in JP-A-59-216146, pentamethinethiopyrylium salts as described in U.S. Pat. No. 4,283,475, and pyrylium compounds as described in JP-B-5-13514 and JP-B-5-19702.

Other preferred examples of the infrared absorbing dye include near infrared absorbing dyes represented by formulae (I) and (II) in U.S. Pat. No. 4,756,993, and phthalocyanine dyes as described in EP-A-916,513.

Anionic infrared absorbing dyes as described in JP-A-11-338131 are also preferably used. The anionic infrared absorbing dye means a dye that does not have a cation structure in the dye skeleton substantially absorbing an infrared ray and has an anion structure. The anionic infrared absorbing dye includes, for example, (c1) anionic metal complex, (c2) anionic carbon black, (c3) anionic phthalocyanine, and (c4) compound represented by formula (6) shown below. A counter cation of the anionic infrared absorbing dye is a monovalent or polyvalent cation containing a proton.

$$[G_a^- - M - G_b]_m X^{m+} \quad (6)$$

The anionic metal complex (c1) is a complex in which the center metal and ligand thereof substantially absorbing light form an anion, as a whole.

The anionic carbon black (c2) includes carbon black having bonded thereto an anion group, for example, sulfonic acid, carboxylic acid or phosphonic acid, as a substituent. In order to introduce the anion group into carbon black, for example, a method of oxidizing carbon black with the desired acid as described in Carbon Black Kyokai ed., *Carbon Black Binran*, Third Edition, page 12, Carbon Black Kyokai (Apr. 5, 1995) can be employed.

The anionic phthalocyanine (c3) is a compound in which the anion group as described in the anionic carbon black (c2) is bonded to a phthalocyanine skeleton as a substituent to form an anion, as a whole.

The compound (c4) represented by formula (6) will be described in detail below.

In formula (6) above, $G_a^-$ represents an anionic substituent; $G_b$ represents a neutral substituent; $X^{m+}$ represents an m-valent cation containing a proton; m represents an integer of from 1 to 6; and M represents a conjugate chain. The conjugate chain may contain a substituent and/or a cyclic structure. The conjugate chain is represented by the following formula:

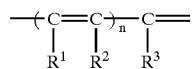

wherein $R^1$, $R^2$ and $R^3$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, or $R^1$, $R^2$ and $R^3$ may be combined with each other to form a cyclic structure; and n represents an integer of from 1 to 8.

Of the anionic infrared absorbing dyes represented by formula (6), the following compounds A-1 to A-5 are preferably used.

A-1

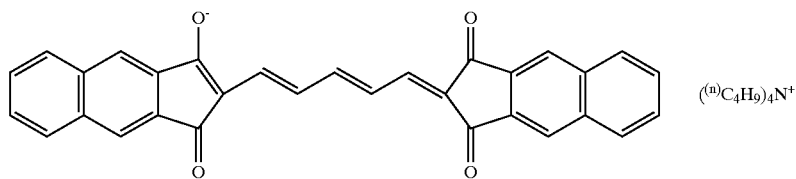

A-2

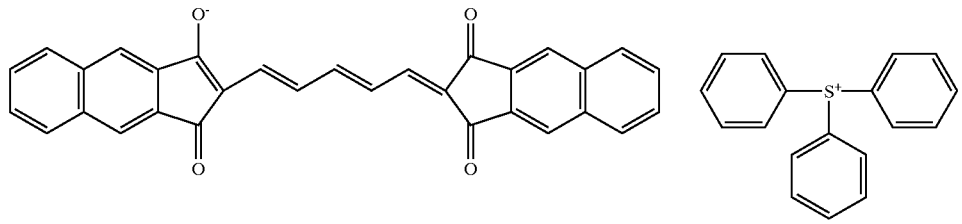

A-3

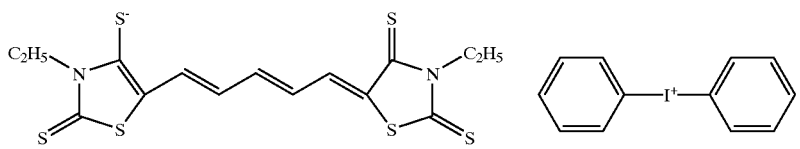

A-4

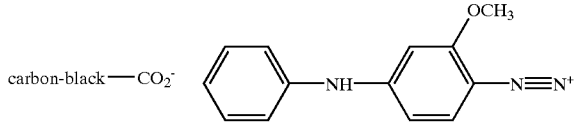

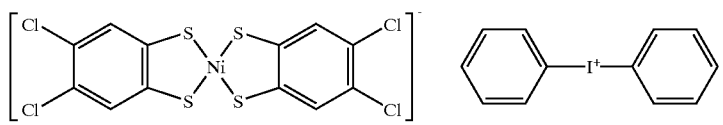
A-5
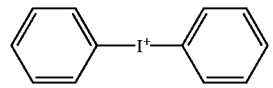
The following cationic infrared absorbing dyes CA-1 to CA-44 are also preferably employed.
CA-1
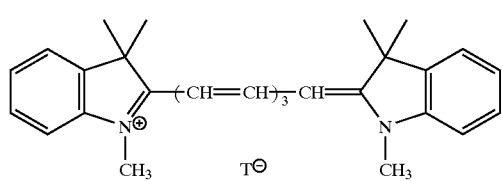
CA-2
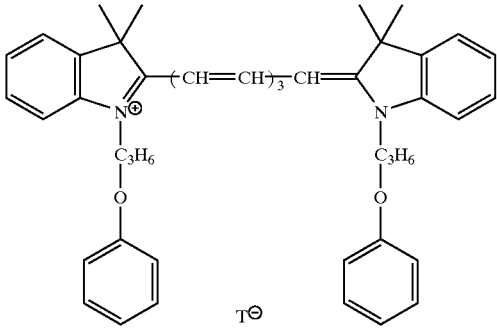
CA-3
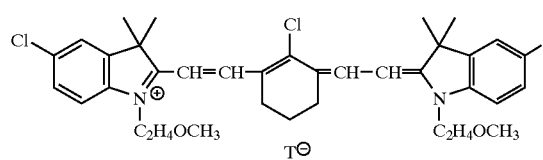
CA-4
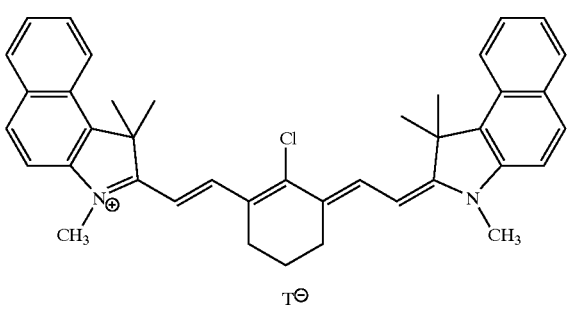
CA-5
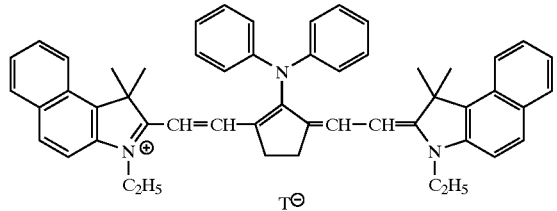
CA-6
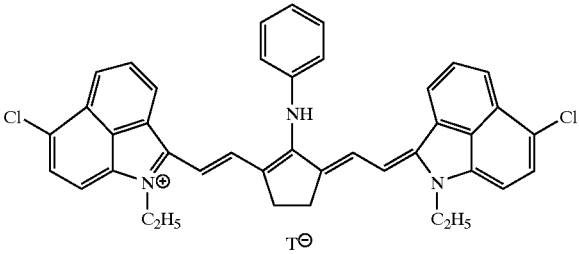
CA-7
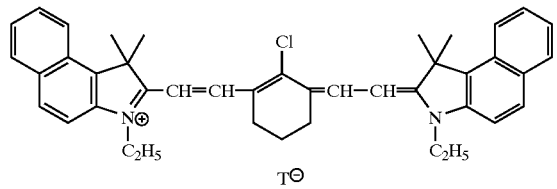
CA-8
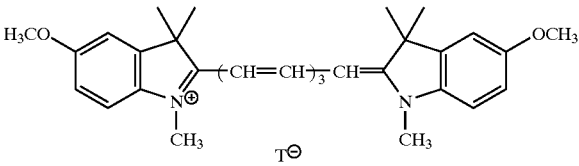

-continued
CA-9
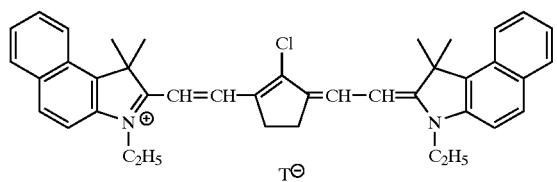
CA-10
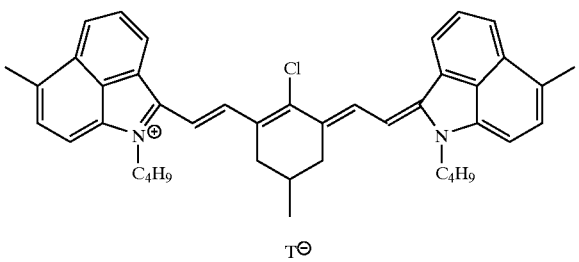
CA-11
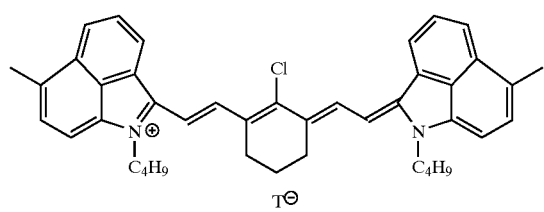
CA-12
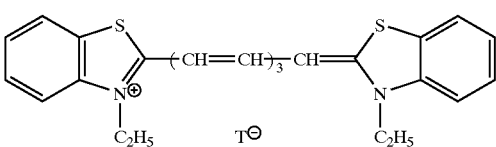
CA-13
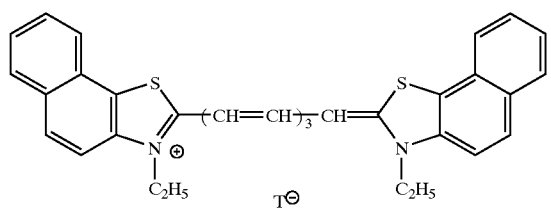
CA-14
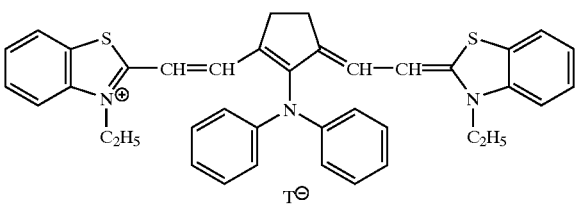
CA-15
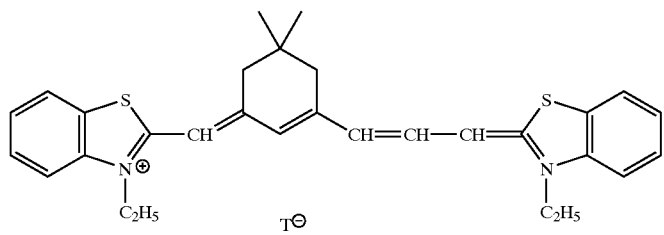
CA-16
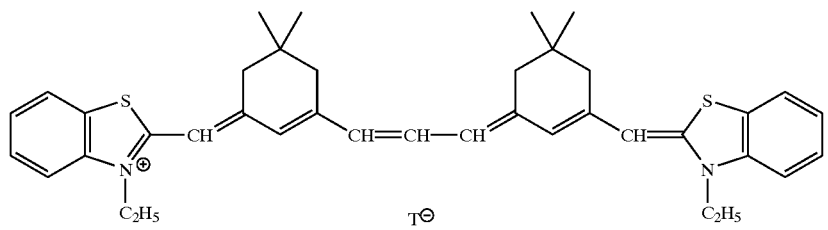
CA-17
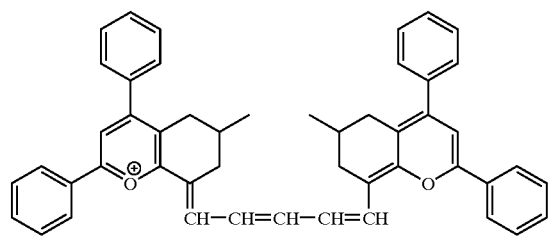
CA-18
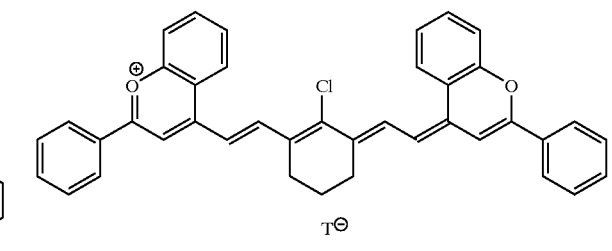

-continued
CA-19
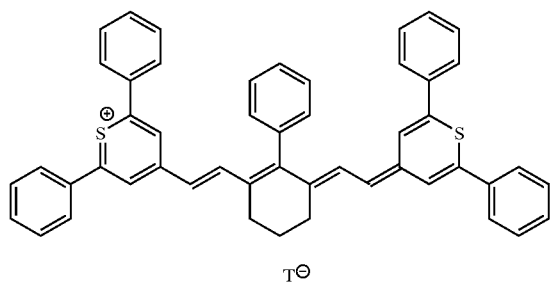
CA-20
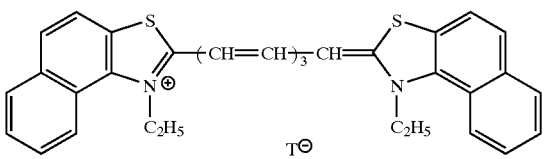
CA-21
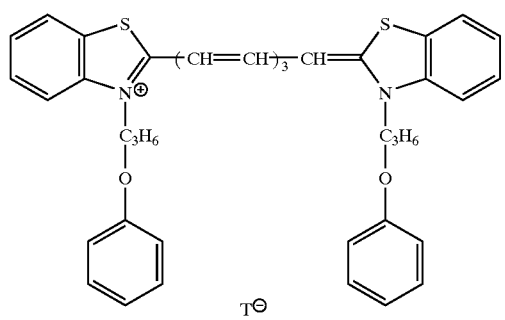
CA-22
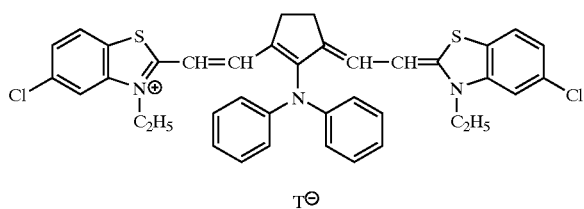
CA-23
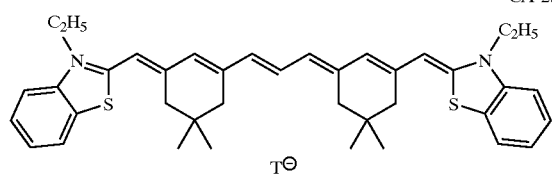
CA-24
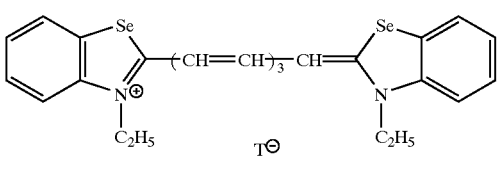
CA-25
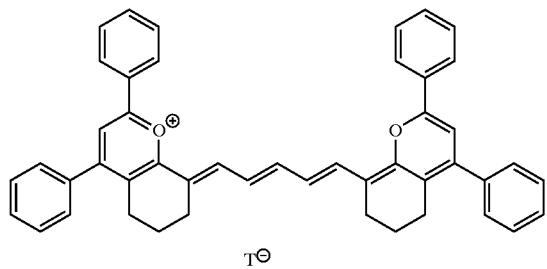
CA-26
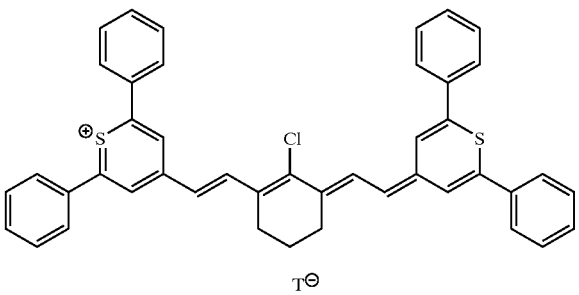
CA-27
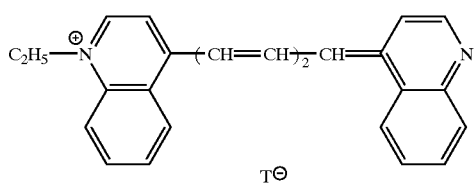
CA-28
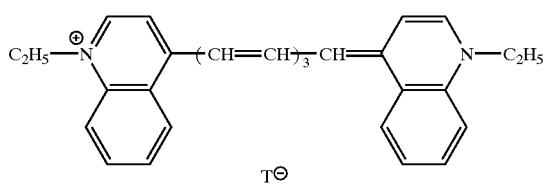

-continued
CA-29
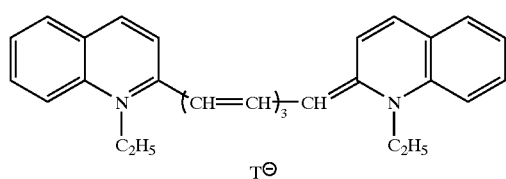
CA-30
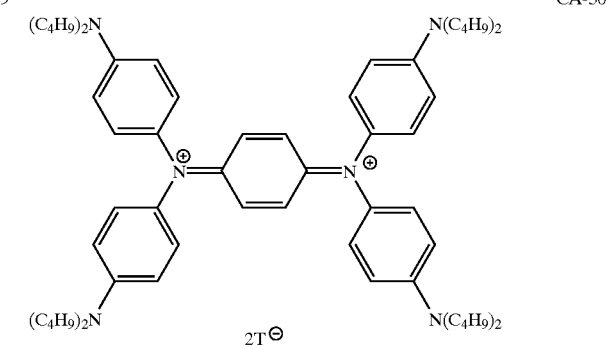
CA-31
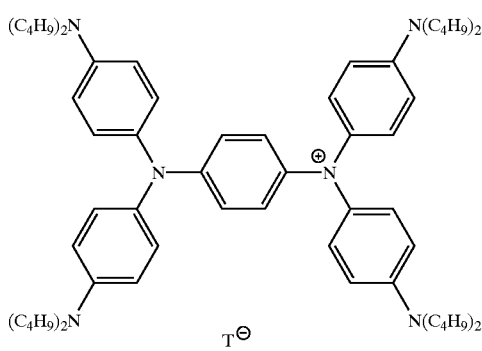
CA-32
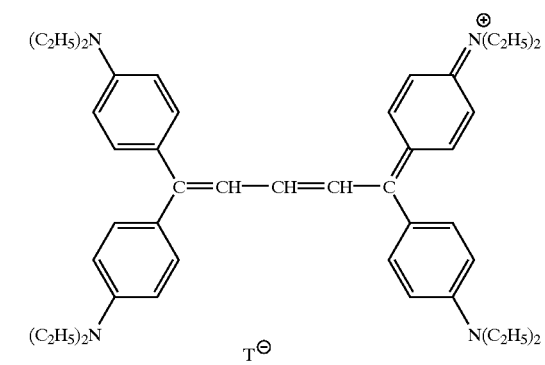
CA-33
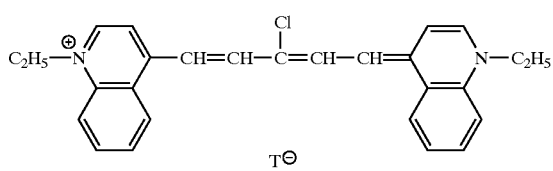
CA-34
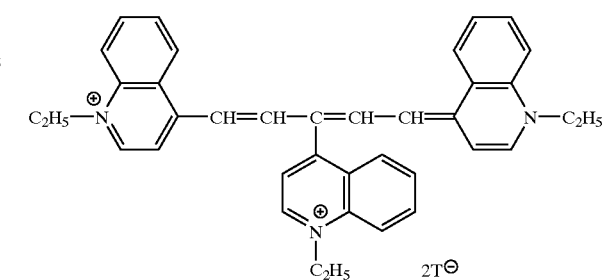
CA-35
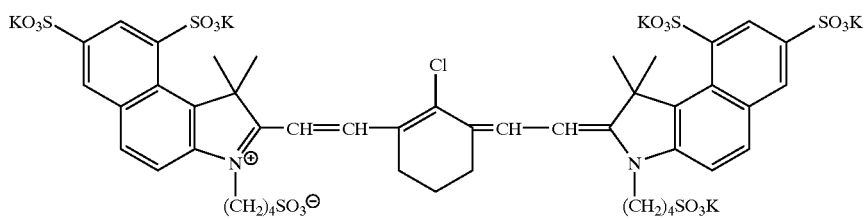
CA-36
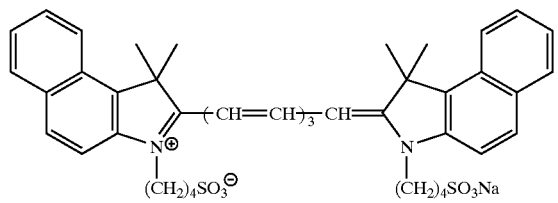
CA-37
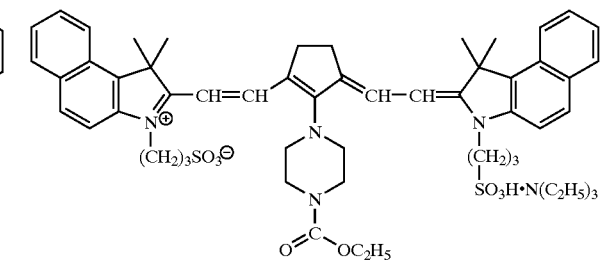

-continued
CA-38
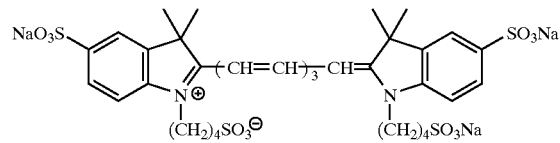
CA-39
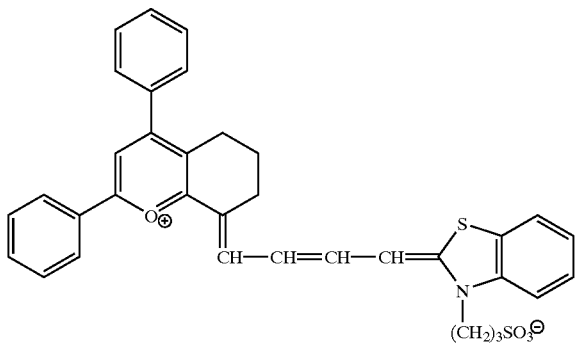
CA-40
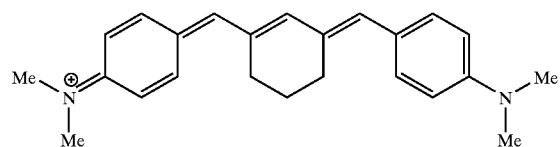
CA-41
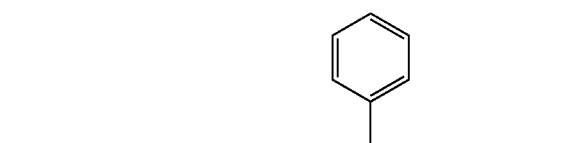
CA-42
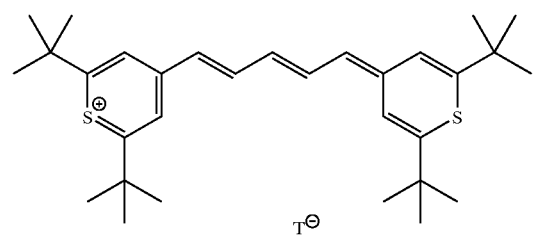
CA-43
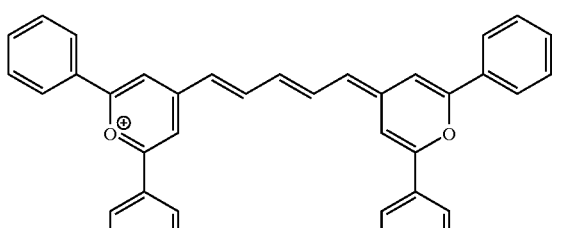
CA-44
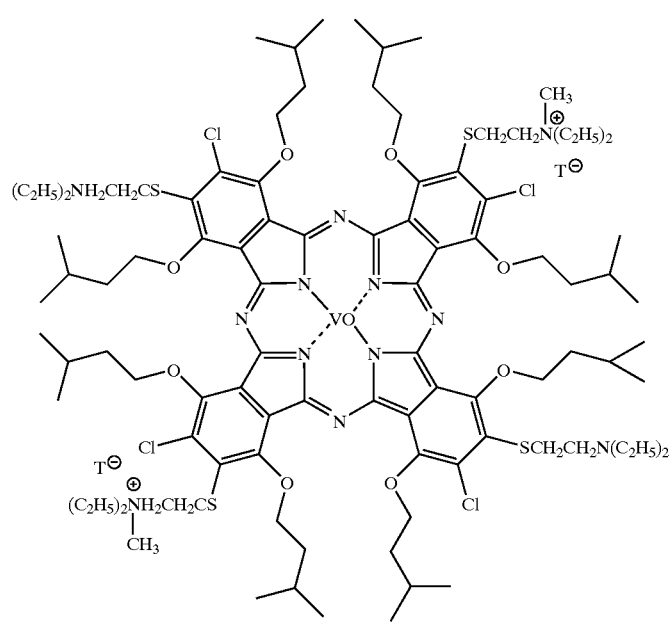

In the above-described formulae, T⁻ represents a monovalent counter anion, preferably a halogen anion (e.g., F⁻, Cl⁻, Br⁻ or I⁻), a Lewis Acid anion (e.g., $BF_4^-$, $PF_6^-$, $SbCl_6^-$ or $ClO_4^-$), an alkylsulfonic acid anion or an arylsulfonic acid anion.

The alkyl group in the alkylsulfonic acid includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The aryl group in the arylsulfonic acid includes an aryl group composed of one benzene ring, an aryl group formed by condensing two or three benzene rings and an aryl group formed by condensing a benzene ring and a 5-membered unsaturated ring. Specific examples of the aryl group include phenyl, naphthyl, anthryl, phenanthryl, indenyl, acenaphthenyl and fluorenyl groups. A phenyl group and a naphthyl group are preferred.

Further, the following nonionic infrared absorbing dyes NA-1 to NA-12 are also preferably employed.

NA-1

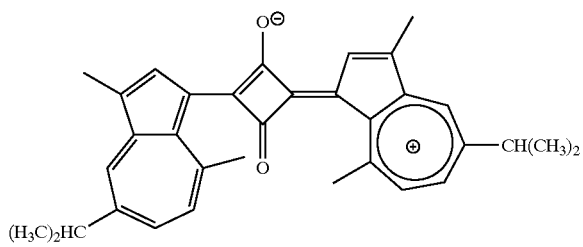

NA-2

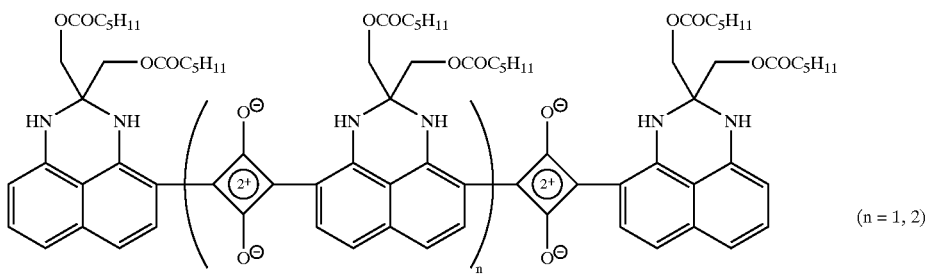

NA-3

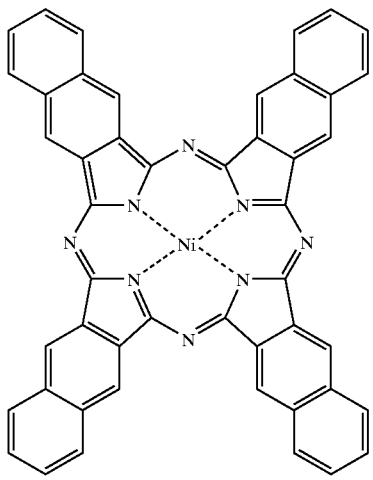

NA-4

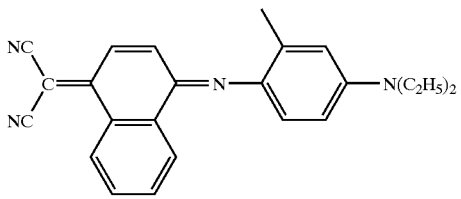

NA-5

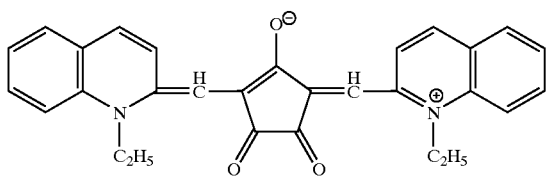

NA-6

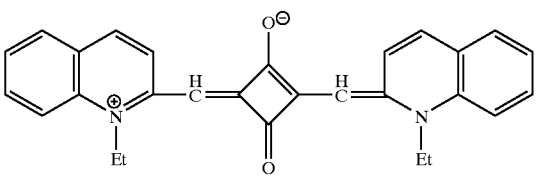

-continued

NA-7

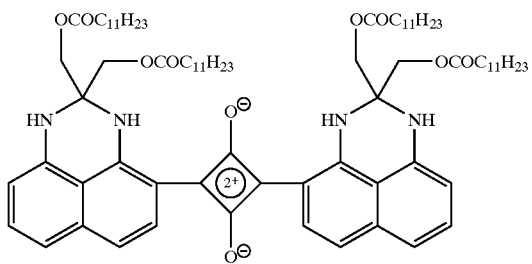

NA-8

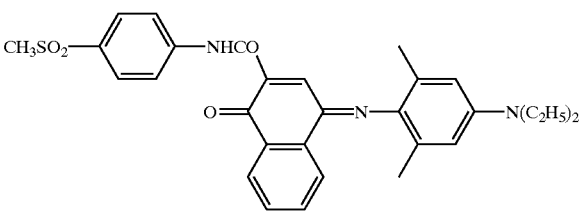

NA-9

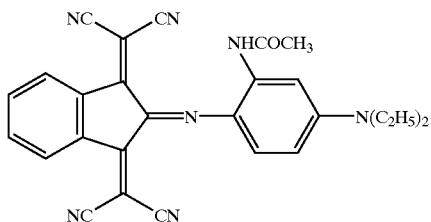

NA-10

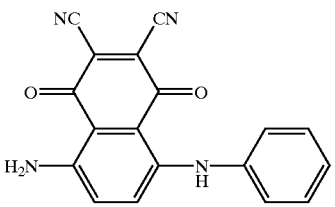

NA-11

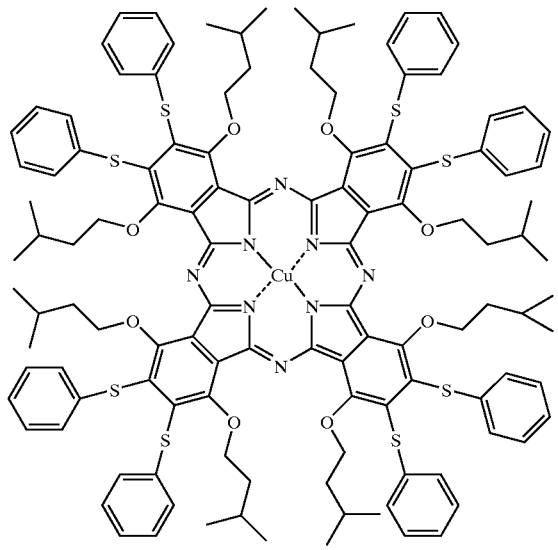

NA-12

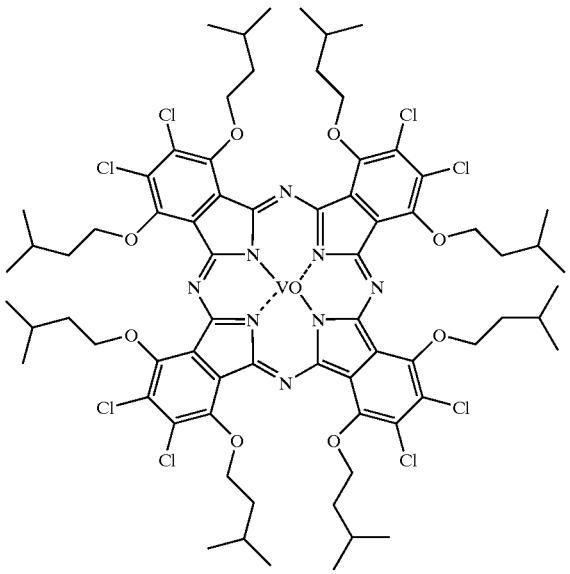

Of the specific compounds described above, A-1 is particularly preferred as the anionic infrared absorbing dye, CA-7, CA-30, CA-40 and CA-42 are particularly preferred as the cationic infrared absorbing dyes, and NA-11 is particularly preferred as the nonionic infrared absorbing dye.

Commercially available dyes and known dyes as described, for example, in Yuki Gosei Kagaku Kyokai ed., Senryo Binran (1970) may also employed. Specific examples of the dye include an azo dye, a metal complex azo dye, a pyrazolone azo dye, a naphthoquinone dye, an anthraquinone dye, a phthalocyanine dye, a carbonium dye, a quinoneimine dye, a methine dye, a diimmonium dye, an aminium dye, a squarylium dye, and a metal thiolate complex.

Pigments used as the sensitizing dyes include commercially available pigments and pigments described in *Colour Index (C.I.)*, Nippon Ganryo Gijutsu Kyokai ed., *Saishin Ganryo Binran* (1977), *Saishin Ganryo Oyo Gijutsu*, CMC Publishing Co. (1986) and *Insatsu Ink Gijutsu*, CMC Publishing Co. (1984). The pigments include black pigment, yellow pigment, orange pigment, brown pigment, red pigment, purple pigment, blue pigment, green pigment, fluorescent pigment, metal powder pigment, and polymer-bonding dye. Specific examples of the pigment include an insoluble azo pigment, an azo lake pigment, a condensed azo pigment, a chelate azo pigment, a phthalocyanine pigment, an anthraquinone pigment, a perylene pigment, a perynone pigment, a thioindigo pigment, a quinacridone pigment, a dioxazine pigment, an isoindolinone pigment, a quinophthalone pigment, a Reichardt's dye, an azine pigment, a nitroso pigment, a nitro pigment, a natural pigment, a fluorescent pigment, an organic pigment, and carbon black. Of the pigments, carbon black is preferably used.

The pigment may be used without surface treatment or the pigment subjected to the surface treatment may be used. Methods of the surface treatment include coating a resin or wax on the surface of pigment, adhering a surface active agent to the surface of pigment and bonding a reactive substance (e.g., a silane coupling agent, an epoxy compound or a polyisocyanate) to the surface of pigment. The methods of surface treatment are described in *Kinzoku Sekken no Seishitu to Oyo*, Miyuki Shobo, *Insatsu Ink Gijutsu*, CMC Publishing Co. (1984) and *Saishin Ganryo Oyo Gijutsu*, CMC Publishing Co. (1986).

A particle size of the pigment is preferably from 0.01 to 10 μm, more preferably from 0.05 to 1 μm, and particularly preferably from 0.1 to 1 μm. The pigment having a particle size of less than 0.01 μm is not preferred in view of the dispersion stability of pigment in a coating solution for the image-forming layer. On the other hand, the pigment having a particle size exceeding 10 μm is not preferred in view of the uniformity of the image-forming layer.

Known dispersing technique used in the production of ink and toner can be utilized for dispersing the pigment. A dispersing machine, for example, an ultrasonic dispersing device, a sand mill, an attriter, a pearl mill, a super mill, a ball mill, an impeller, a disperser, a KD mill, a colloid mill, Dynatron, a three-roll mill or a pressure kneader can be used for dispersion. Details thereof are described in *Saishin Ganryo Oyo Gijutsu*, CMC Publishing Co. (1986).

More preferred examples of the sensitizing dye for use in the present invention include the merocyanine dyes described in JP-B-61-9621, the merocyanine dyes described in JP-A-2-179643, the merocyanine dyes described in JP-A-2-244050, the merocyanine dyes described in JP-B-59-28326, the merocyanine dyes described in JP-A-59-89303, the merocyanine dyes described in JP-A-8-129257, the benzopyran dyes described in JP-A-8-334897, and the short wavelength type ketone and styryl dyes described in EP-A-1048982.

Furthermore, the infrared absorbing agents described in JP-A-11-209001 are also exemplified.

The sensitizing dyes may be suitably employed individually or as a combination of two or more thereof in the present invention. In the photopolymerizable composition according to the present invention, known compounds which function for further increasing the sensitivity or preventing the polymerization inhibition due to oxygen may be incorporated as cosensitizers.

Examples of the cosensitizer include amine compounds as described in M. R. Sander, *Journal of Polymer Society*, Vol., 10, page 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825, and specifically triethanolamine, ethyl p-dimethylaminobenzoate, p-formyldimethylaniline and p-methylthiodimethylaniline.

Other examples of the cosensitizer include thiol compounds as described in JP-A-53-702, JP-B-55-50806 and JP-A-5-142772, and disulfide compounds as described in JP-A-56-75643, and specifically 2-mercaptobenzothiazole, 2-mercaptobenzoxazole, 2-mercaptobenzimidazole, 2-mercapto-4(3H)-quinazoline and β-mercaptonaphthalene.

Still other examples of the cosensitizer include amino acid compounds (e.g., N-phenylglycine), organometal compounds (e.g., tributyl tin acetate) as described in JP-B-48-42965, hydrogen donors as described in JP-B-55-34414, sulfur compounds (e.g., trithiane) as described in JP-A-6-308727, phosphorus compounds (e.g., diethylphosphite) as described in JP-A-6-250389, and Si—H or Ge—H compounds as described in Japanese Patent Application No. 6-191605.

The amount of photopolymerization initiator used is preferably from 0.01 to 60% by weight, and more preferably form 0.05 to 30% by weight, based on the amount of the whole component of photopolymerizable composition according to the present invention.

When the sensitizing dye is used in the present invention, a molar ratio of the photopolymerization initiator to the sensitizing dye in the photopolymerizable composition is preferably from 99:1 to 1:99, more preferably from 90:10 to 10:90, and particularly preferably from 80:20 to 20:80.

In case of using the cosensitizer, the amount thereof is preferably from 0.01 to 50 parts by weight per part by weight of the photopolymerization initiator.

<Linear Organic High Molecular Polymer>

It is preferred that the photopolymerizable composition according to the present invention contains a linear organic high molecular polymer as a binder. The linear organic high molecular polymer is not particularly limited, and any linear organic high molecular polymer may be used as far as it has compatibility with the photopolymerizable ethylenically unsaturated compound. A linear organic high molecular polymer that is soluble or swellable in water or an aqueous alkalescent solution and is capable of being developed with water or an aqueous alkalescent solution is preferably used. The linear organic high molecular polymer used as a film forming agent in the photopolymerizable composition and it is appropriately selected taking it into consideration whether water, an aqueous alkalescent solution or an organic solvent is used as the developer. For example, when a water-soluble organic high molecular polymer is used, development with water is possible. Examples of the linear organic high molecular polymer include an addition polymer having a carboxylic acid group on its side chain, such as those disclosed in JP-A-59-44615, JP-B-54-34327, JP-B-58-12577, JP-B-54-25957, JP-A-54-92723, JP-A-59-53836 and JP-A-59-71048, specifically, a methacrylic acid copolymer, an acrylic acid copolymer, an itaconic acid copolymer, a crotonic acid copolymer, a maleic acid copolymer and a partially esterified maleic acid copolymer. An acidic cellulose derivative having a carboxylic group on its side chain is also exemplified. Further, a polymer obtained by adding a cyclic acid anhydride to an addition polymer having a hydroxyl group is also useful. Of these polymers, a copolymer composed of benzyl (meth)acrylate and (meth)acrylic acid and if desired, other addition polymerizable vinyl monomers and a copolymer composed of allyl (meth) acrylate and (meth)acrylic acid and if desired, other addition polymerizable monomers are preferred. In addition, polyvinyl pyrrolidone and polyethylene oxide are useful as the water-soluble linear organic high molecular polymer. In order to improve the strength of the hardened film, an alcohol-soluble polyamide and a polyether of 2,2-bis(4-hydroxyphenyl)propane and epichlorohydrin are useful.

The linear organic high molecular polymer may be used in the photopolymerizable composition in an appropriate amount. However, when the amount of the linear organic high molecular polymer exceeds 90% by weight based on the total components of the photopolymerizable composition, preferred results may not be obtained, for example, from the standpoint of the strength of image formed. The amount thereof is preferably from 30 to 85% by weight. A weight ratio of the photopolymerizable ethylenically unsaturated compound to the linear organic high molecular polymer is preferably in a range of from 1/9 to 7/3, and more preferably from 3/7 to 5/5.

(Polymerization Inhibitor)

According to the present invention, it is preferred that a small amount of a thermal polymerization inhibitor is added to the photopolymerizable composition in order to prevent undesirable thermal polymerization of the compound having a polymerizable ethylenically unsaturated double bond during the production and preservation of the photopolymerizable composition, in addition to the fundamental components described above. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxylamine primary cerium salt. The amount of thermal polymerization inhibitor added is preferably from about 0.01 to about 5% by weight based on the total components of the photopolymerizable composition. Also, if desired, a higher fatty acid derivative, for example, behenic acid or behenic acid amide may be added so as to be maldistributed on the surface of photosensitive layer during the drying process after the coating of the photopolymerizable composition in order to prevent the polymerization inhibition due to oxygen. The amount of higher fatty acid derivative added is preferably from about 0.5 to about 10% by weight based on the total components of the photosensitive composition.

(Coloring Agent)

A dye or pigment may be added for the purpose of coloring the photosensitive layer. By the addition of coloring agent, a printing plate can be improved in plate inspection properties, for example, visibility after the plate-making or suitability for image density measurement. The coloring agent used is preferably a pigment because many dyes cause reduction in the sensitivity of the photopolymerizable photosensitive layer. Specific examples of the coloring agent include pigments, for example, a phthalocyanine pigment, an azo pigment, carbon black or titanium oxide, and dyes, for example, Ethyl Violet, Crystal Violet, an azo dye, an anthraquinone dye or a cyanine dye. The amount of dye or pigment added is preferably from about 0.5 to about 5% by weight based on the total components of the photopolymerizable composition.

(Other Additives)

Known other additives, for example, an inorganic filler or plasticizer for improving physical properties of the hardened film, or an oil sensitivity imparting agent capable of improving an ink-receptive property on the surface of photosensitive layer, may also be added to the photopolymerizable composition.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. When a binder is used, the plasticizer may be added in an amount of not more than 10% by weight based on the total amount of the polymerizable compound having an ethylenically unsaturated double bond and the binder.

Furthermore, in order to improve the film strength (printing durability), an UV initiator or a heat crosslinking agent capable of accelerating the effect of heating and/or exposure to light after the development may also be added.

In addition, in order to improve adhesion between the photosensitive layer and a support or to increase removability of the unexposed photosensitive layer by development, an additive may be added or an interlayer may be provided. For instance, by adding or undercoating a compound having a relatively strong interaction with the support, for example, a compound having a diazonium structure or a phosphone compound, the adhesion to the support can be improved, thereby increasing the printing durability. On the other hand, by adding or undercoating a hydrophilic polymer, for example, polyacrylic acid or polysulfonic acid, the developability of the non-image area can be improved, whereby the occurrence of stain can be prevented.

The photopolymerizable composition of the present invention is dissolved in an appropriate solvent selected from various solvents and the resulting solution is coated on a support. Examples of the solvent which can be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol monoethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or in combination of two or more thereof. The solid concentration in the coating solution is suitably from 2 to 50% by weight.

Since the amount of coverage of photosensitive layer on a support has an influence mainly upon the sensitivity of photosensitive layer, the developability, the strength of the exposed film and the printing durability, it is desirable to appropriately determine the amount of coverage depending on the use. When the amount of coverage is too small, the printing durability may not be sufficient, whereas an excessively large amount of coverage is disadvantageous, because the sensitivity decreases, the exposure takes a time and the development processing also requires a longer period of time. In the case of a lithographic printing plate precursor for scanning exposure, which is one of the main objects of the present invention, the amount of coverage is preferably from about 0.1 to about 10 $g/m^2$, more preferably from 0.5 to 5 $g/m^2$, in terms of the dry weight.

<Support>

For preparing a lithographic printing plate precursor, which is one of the main objects of the present invention, the photosensitive layer is preferably provided on a support having a hydrophilic surface. For such a purpose, any known hydrophilic support used for a lithographic printing plate precursor may be employed without any limitation. The support employed is preferably a dimensionally stable plate-like material. Examples thereof include paper, paper laminated with plastics (e.g., polyethylene, polypropylene or polystyrene), a plate of metal (e.g., aluminum, zinc or copper), a film of plastics (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film laminated with or having deposited thereon the above-described metal. The surface of the support may be subjected to a known appropriate physical or chemical treatment, if desired, for the purposes, for example, imparting hydrophilicity or increasing strength.

Paper, a polyester film and an aluminum plate are preferably used. Of the supports, the aluminum plate is particularly preferred because it is dimensionally stable, relatively inexpensive and capable of providing a surface excellent in the hydrophilicity and strength by a surface treatment, if desired. Also, a composite sheet obtained by bonding an aluminum sheet on a polyethylene terephthalate film as described in JP-B-48-18327 is preferably used.

The aluminum plate suitably used includes a pure aluminum plate or an alloy plate mainly comprising aluminum and containing a trace amount of foreign elements. Also, a plastic film laminated with or having deposited thereon aluminum may be used. Examples of the foreign element contained in the aluminum alloy include silicon, iron, manganese, copper, magnesium, chromium, zinc, bismuth, nickel and titanium. The content of foreign elements in the alloy is at most 10% by weight. In the present invention, although pure aluminum is particularly suitably used, it is difficult to produce completely pure aluminum in view of the refining technology. Thus, an aluminum containing a trace amount of foreign elements can be used. The composition of the aluminum plate for use in the present invention is not particularly limited and an aluminum plate conventionally known and used in the field of art can be appropriately utilized. The aluminum plate for use in the present invention preferably has a thickness of approximately from 0.1 to 0.6 mm, more preferably from 0.15 to 0.4 mm, and still more preferably from 0.2 to 0.3 mm.

In case of a support having a metal surface, particularly an aluminum surface, the support is preferably subjected to a surface treatment, for example, a surface roughening (graining) treatment, an immersion treatment in an aqueous solution of sodium silicate, potassium fluorozirconate or a phosphate, or an anodic oxidation treatment.

The surface roughening treatment of aluminum plate is performed by various methods, for example, by a method of mechanically roughening the surface, a method of electrochemically dissolving and roughening the surface or a method of chemically dissolving selectively the surface. In the mechanical surface roughening, a known method, for example, ball graining, brush graining, blast graining or buff graining may be used. The electrochemical surface roughening includes a method of transporting an aluminum plate in an electrolytic solution, e.g., hydrochloric acid or nitric acid while applying an alternating current or direct current. Also, a method wherein these two surface roughening treatments may be conducted in combination may be used as described in JP-A-54-63902. Prior to the surface roughening of aluminum plate, the aluminum plate is subjected to a degreasing treatment, for example, with a surface active agent, an organic solvent or an alkaline aqueous solution, if desired, for the purpose of removing rolling oil on the surface thereof.

Further, an aluminum plate subjected to the surface roughening treatment and then to an immersion treatment in an aqueous sodium silicate solution may be preferably used. An aluminum plate subjected to an anodic oxidation treatment and then to an immersion treatment in an aqueous solution of alkali metal silicate as described in JP-B-47-5125 is preferably used. The anodic oxidation treatment is carried out by applying an electric current to the aluminum plate as an anode in an electrolytic solution, for example, in an aqueous or non-aqueous solution of an inorganic acid, e.g., phosphoric acid, chromic acid, sulfuric acid or boric acid, an organic acid, e.g., oxalic acid or sulfamic acid, or a salt thereof. The aqueous or non-aqueous solutions may be used individually or in combination of two or more thereof.

The silicate electrode position as described in U.S. Pat. No. 3,658,662 is also effective.

Also, a support subjected to electrolytic graining as described in JP-B-46-27481, JP-A-52-58602 and JP-A-52-30503 and to the above-described anodic oxidation treatment and sodium silicate treatment in combination is useful.

A support subjected to mechanical graining, chemical etching, electrolytic graining, anodic oxidation treatment and sodium silicate treatment in order as described in JP-A-56-28893 is also preferably used.

Further, a support subjected to, after the above-described treatments, an undercoat treatment with a water-soluble resin, for example, polyvinyl phosphonic acid, a polymer or copolymer having a sulfonic acid group in the side chain thereof or polyacrylic acid, a water-soluble metal salt (e.g., zinc borate), a yellow dye or an amine salt is preferably used.

A support subjected to a sol-gel treatment and having covalent-bonded thereto a functional group capable of causing an addition reaction by a radical as described in JP-A-7-159983 is also preferably used.

Other preferred examples include a support obtained by providing a water-resistant hydrophilic layer as a surface layer on a support. Examples of the surface layer include a layer comprising an inorganic pigment and a binder as described in U.S. Pat. No. 3,055,295 and JP-A-56-13168, a hydrophilic swellable layer as described in JP-A-9-80744, and a sol-gel film comprising titanium oxide, polyvinyl alcohol and a silicic acid as described in JP-W-8-507727 (the term "JP-W" as used herein means an "unexamined published international patent application").

The hydrophilic treatment is applied for the purpose of, for example, preventing a detrimental reaction in the photopolymerizable composition coated thereon or improving the adhesion of the photosensitive layer, in addition to the purpose of rendering the support surface hydrophilic.

<Protective Layer>

In the present invention, the lithographic printing plate precursor for scanning exposure is usually exposed in the air, therefore, a protective layer may be further provided on the photopolymerizable composition layer. The protective layer prevents a low molecular substance, e.g., a basic substance present in the air, which inhibits the image formation reaction caused in the photosensitive layer upon exposure, from penetrating into the photosensitive layer and thereby enables the exposure in the air. Accordingly, the protective layer is required to have low permeability to a low molecular substance and preferably further has capabilities of not substantially inhibit the transmission of light used for the exposure, exhibiting excellent adhesion to the photosensitive layer and being easily removed in a development step after the exposure. Investigations on the protective layer have been made as described in detail in U.S. Pat. No. 3,458,311 and JP-A-55-49729. Examples of the material which can be used in the protective layer include a water-soluble polymer compound having relatively good crystallinity. Specific examples thereof include a water-soluble polymer, for example, polyvinyl alcohol, polyvinyl pyrrolidone, acidic cellulose, gelatin, gum arabic or polyacrylic acid. Particularly, polyvinyl alcohol is preferably used as the main component because most advantageous results in the fundamental properties such as oxygen inhibiting property and development removability can be obtained. The polyvinyl alcohol for use in the protective layer has necessary oxygen inhibiting property and water solubility, therefore, as long as it contains an unsubstituted vinyl alcohol unit, a part may be displaced with an ester, an ether or an acetal. Similarly, a part may have another copolymer component. Examples of the polyvinyl alcohol which can be used include those having a hydrolysis ratio of from 71 to 100 mol % and a weight average molecular weight of from 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA- 220, PVA-224, PVA-217EE, PVA-217E, PVA-220E, PVA-224E, PVA-405, PVA-420, PVA-613 and L-8 produced by Kuraray Co., Ltd.

The components of the protective layer (e.g., selection of PVA or use of additives) and the coating amount thereof are determined by taking account of fogging property, adhesive property and scratch resistance, in addition to the inhibiting property against the low molecular substance and the development removability. In general, PVA having a higher hydrolysis ratio (namely, the protective layer has a higher unsubstituted vinyl alcohol unit content) and the layer thickness is larger, the low molecular substance inhibiting property becomes stronger and this is more advantageous in view of sensitivity. However, if the low molecular substance inhibiting property is extremely increased, the undesirable polymerization reaction may be caused during the production or preservation, or the undesirable fog or thickening of image line may be generated at the image exposure. Further, the adhesive property to the image area and the scratch resistance are also very important in view of handling of the plate. Specifically, when a hydrophilic layer comprising a water-soluble polymer is coated on a lipophilic polymer layer, the layer is readily peeled off due to insufficient adhesion. To overcome such a problem, various proposals have been made to improve the adhesive property between those two layers. For example, in U.S. Pat. Nos. 292,501 and 44,563, there are described techniques of mixing from 20 to 60% by weight of an acrylic emulsion or a water-insoluble vinyl pyrrolidone-vinyl acetate copolymer in a hydrophilic polymer mainly comprising polyvinyl alcohol and applying the mixture to the lipophilic polymer layer, thereby obtaining a sufficiently high adhesive property. These known techniques can be applied to the protective layer for use in the present invention. A coating method of the protective layer is described in detail, for example, in U.S. Pat. No. 3,458,311 and JP-A-55-49729.

Furthermore, other functions may be imparted to the protective layer. For instance, when a laser ray is used as the light source, the photosensitive composition is intended to exhibit excellent sensitivity to light at the wavelength of the light source but not sensitive to light at other wavelengths. In a case where the light source emits light in an infrared region of 750 nm or more, the printing plate may be used substantially in a bright room. In some cases, however, the printing plate is also practically sensitive to light having a short wavelength, e.g., light of a fluorescent lamp. In such a case, a coloring agent (e.g., water-soluble dye) ensuring excellent transmittance of light of the light source and capable of efficiently absorbing light at a wavelength of less than 700 nm is preferably added.

In another example where a light source which emits light in the ultraviolet region of 450 nm or less is used, the printing plate can be substantially used under a safe light. However, in some cases, the printing plate is also sensitive to visible light of 500 nm or more. In such a case, a coloring agent (e.g., water-soluble dye) ensuring excellent transmission of light of the light source and capable of efficient absorbing light at a wavelength of 500 nm or more may be used, whereby the safelight aptitude can be more improved without causing any reduction in the sensitivity.

In case of using a photosensitive material prepared by employing the photopolymerizable composition according to the present invention as an image-forming material, the photosensitive material is usually subjected to imagewise exposure and then developed with a developer to remove the unexposed area of the photosensitive layer, thereby forming an image. The developer, which is preferably used for the development of the photosensitive layer comprising the photopolymerizable composition to prepare a lithographic printing plate, includes a developer as described in JP-B-57-7427. An aqueous solution of an inorganic alkali agent, e.g., sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, or an aqueous solution of an organic alkali agent, e.g., monoethanolamine or diethanolamine is suitably used. The alkali agent is added so that a concentration of the alkali agent in the solution is ordinarily from 0.1 to 10% by weight, preferably from 0.5 to 5% by weight.

The aqueous alkaline solution may contain, if desired, a small amount of a surface active agent or an organic solvent, for example, benzyl alcohol, 2-phenoxyethanol or 2-butoxyethanol. Examples of such aqueous alkaline solution include those described in U.S. Pat. Nos. 3,375,171 and 3,615,480.

Further, developers as described in JP-A-50-26601, JP-A-58-54341, JP-B-56-39464 and JP-B-56-42860 are also excellent.

As the developer most preferable for the photosensitive layer of photopolymerization type, a developer described in Japanese Patent Application No. 2000-334851 is exemplified.

The developer is an aqueous alkali solution having a pH of not more than 12.5 and an electric conductivity of not more than 30 mS/cm. In view of the developing speed, the pH of developer is more preferably from 10.0 to 12.5, most preferably from 11.0 to 12.5, and the electric conductivity thereof is more preferably from 3 to 30 mS/cm, most preferably from 3 to 15 mS/cm. The developer has an excellent antifoaming property and a low foaming property, thus the development processing step can be performed without hindrance due to the foaming at the development.

The developer is a non-silicate type developer and characterized by containing an inorganic alkali agent and a nonionic compound represented by the following formula (20):

$$A-W \qquad (20)$$

wherein A represents a hydrophobic organic group having a log P of A-H of not less than 1.5; and W represents a nonionic hydrophilic group having a log P of W—H of less than 1.0.

Specific examples of the nonionic compound represented by formula (20) are set forth below.

Examples of Compound represented by Formula (20)

A-W

Y-1 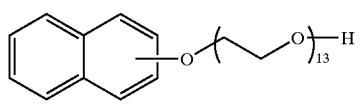

Y-2 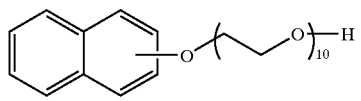

-continued
Examples of Compound represented by Formula (20)
A-W
Y-3 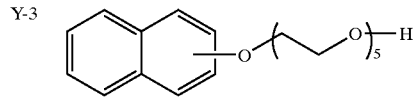
Y-4 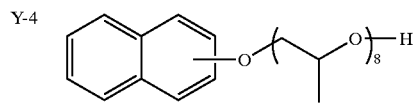
Y-5 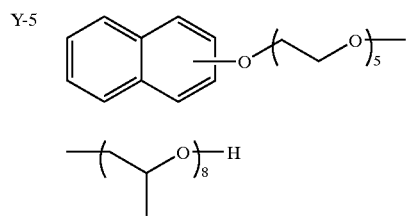
Y-6 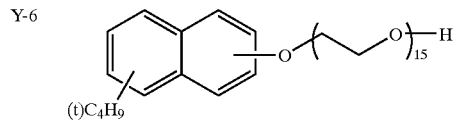
Y-7 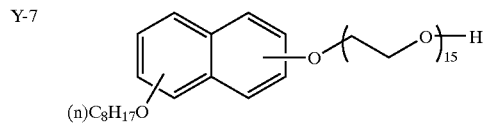
Y-8 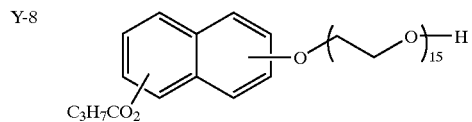
Y-9 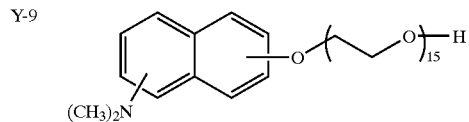
Y-10 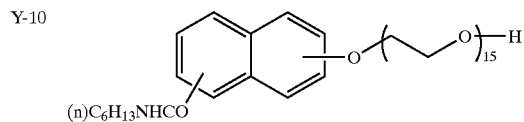
Y-11 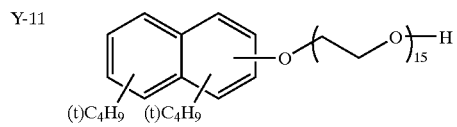
Y-12 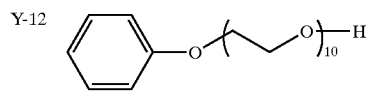
-continued
Examples of Compound represented by Formula (20)
A-W
Y-13 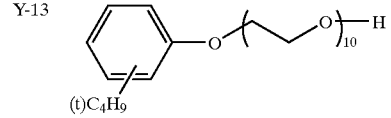
Y-14 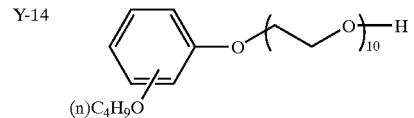
Y-15 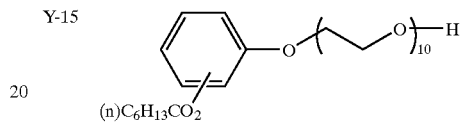
Y-16 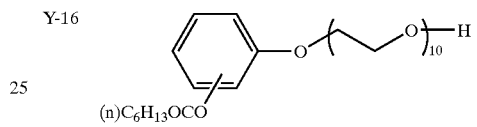
Y-17 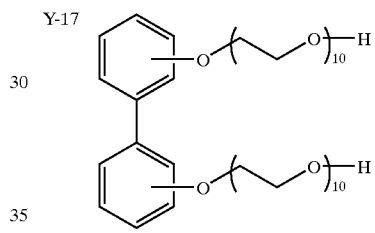
Y-18 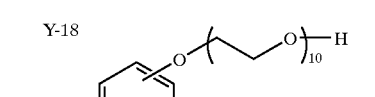
Y-19 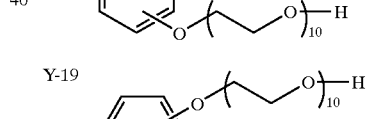
Y-20 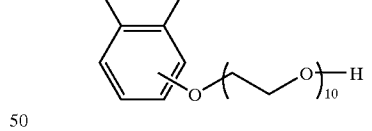
Y-21 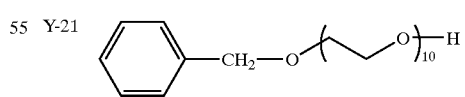
Y-22 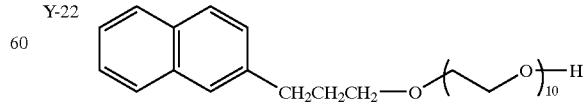
Of the nonionic compound represented by formula (20), those more preferred are represented by the following formulae (20-A) and (20-B):

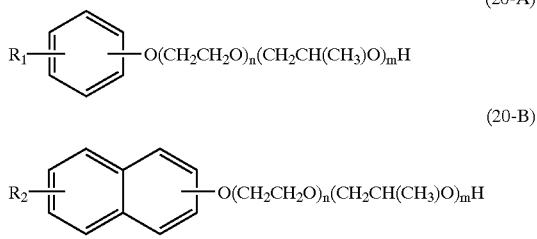

wherein $R_1$ and $R_2$ each represent a hydrogen atom or an alkyl group having from 1 to 100 carbon atoms; and n and m each represent an integer of from 0 to 100.

One example of the developer is illustrated below. Specific Example of Developer Composition:

| | |
|---|---|
| Alkali (NaOH) | 0.15 g |
| Compound of Formula (20) (Y-1 shown below) | 5.0 g |
| Chelating Agent (Z-1 shown below) | 0.1 g |
| Additive 1 (P-1 shown below) | 1.0 g |
| Additive 2 (Q-1 shown below) | 1.0 g |
| Water | 92.75 g |

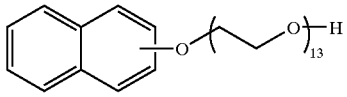

In the plate-making process of a lithographic printing plate precursor to which the photopolymerizable composition according to the present invention is suitably applied, the entire surface of lithographic printing plate precursor may be heated, if desired, before or during the exposure or in the period from the exposure to the development. By the heating, the image-forming reaction in the photosensitive layer is accelerated, and advantageous effects, for example, improvement in the sensitivity and the printing durability or stabilization of the sensitivity can be obtained. Furthermore, for the purpose of improving the image strength and the printing durability, it is also effective to conduct after-heating or exposure to the entire surface of the image after the development. It is preferred that the heating before the exposure is conducted under a mild condition as a temperature of 150° C. or below. If the temperature is excessively high, a problem, for example, the formation of fog in the non-image area may arise. In the heating after the development, a very severe condition as a temperature of from 200 to 500° C. is usually used. When the temperature is low, a sufficient effect of strengthening the image may not be obtained, whereas when it is excessively high, a problem, for example, deterioration of the support or thermal decomposition of the image area may arise.

In a scanning exposure of the lithographic printing plate precursor according to the present invention, known methods may be used without any limitation. The light source used is preferably a laser. Examples of the laser light source having a wavelength of from 350 to 450 nm available at present, which can be used, include the followings:

gas laser, for example, Ar ion laser (364 nm, 351 nm, from 10 mW to 1 W), Kr ion laser (356 nm, 351 nm, from 10 mW to 1 W) or He—Cd laser (441 nm, 325 nm, from 1 to 100 mW);

solid laser, for example, a combination of Nd:YAG ($YVO_4$) with SHG crystal×twice (355 nm, from 5 mW to 1 W) or a combination of Cr:LiSAF with SHG crystal (430 nm, 10 mW);

semiconductor laser, for example, $KNbO_3$, ring resonator (430 nm, 30 mW), a combination of a waveguide type wavelength conversion element with AlGaAs or InGaAs semiconductor (from 380 to 450 nm, from 5 to 100 mW), a combination of a waveguide type wavelength conversion element with AlGaInP or AlGaAs semiconductor (from 300 to 350 nm, from 5 to 100 mW), or AlGaInN (from 350 to 450 nm, from 5 to 30 mW); and pulse laser, for example, $N_2$ laser (337 nm, pulse: from 0.1 to 10 mJ) or XeF (351 nm, pulse: from 10 to 250 mJ).

Of these lasers, the AlGaInN semiconductor laser (commercially available InGaN-type semiconductor laser: from 400 to 410 nm, from 5 to 30 mW) is preferred in view of the wavelength property and the cost.

In addition, as the available light source which emits light of from 450 to 700 nm, Ar+ laser (488 nm), YAG-SHG laser (532 nm), He—Ne laser (633 nm), He—Cd laser and red semiconductor laser (from 650 to 690 nm) may be suitably used, and as the available light source which emits light of from 700 to 1,200 nm, semiconductor laser (from 800 to 850 nm) and Nd-YAG laser (1,064 nm) may be suitably used.

Furthermore, various mercury lamps of ultrahigh pressure, high pressure, medium pressure and low pressure, a chemical lamp, a carbon arc lamp, a xenon lamp, a metal halide lamp, an ultraviolet laser lamp (e.g., ArF excimer laser or KrF excimer laser) and a radiation, for example, an electron beam, an X ray, an ion beam or a far infrared ray may be used. The laser light sources of 350 nm or more are preferred because these are inexpensive.

The exposure mechanism may be any of an internal surface drum system, an external surface drum system and a flat bed system.

The components of the photosensitive layer for use in the present invention may have high water solubility and thereby the photosensitive layer may be rendered to be soluble in neutral water or alkalescent water. A lithographic printing plate precursor having such a photosensitive layer can be mounted on a printing machine and performed exposure and development on the machine.

The photopolymerizable composition according to the present invention is widely applied to known uses of photosetting resins without any particular restriction, in addition to the use of lithographic printing plate for scanning exposure. For instance, the liquid photopolymerizable composition further containing a cation polymerizable compound, if desired, is used as a material for stereolithography having high sensitivity. The photopolymerizable composition is used as a material for holography utilizing the change of refractive index due to photopolymerization. It is also applied to various transfer materials (for example, a peel-off type photosensitive material or a toner development type photosensitive material) utilizing the change of adhesion on the surface due to photopolymerization. Further, it is applied to photocuring of microcapsules. Moreover, it is applied to the production of materials for electronics, for example, photoresists, and photosetting resin materials, for example, ink, paint and adhesive.

The present invention will be described in greater detail with reference to the following examples, but the present invention should not be construed as being limited thereto.

<Synthesis of Crosslinking Agent>

The crosslinking agent for use in the present invention can be easily synthesized using a corresponding compound having an acryl group according to methods described in *Secchaku no Gijutsu*, Vol. 14, No. 4 (the consecutive number of volumes: 37), page 2, published by Nippon Secchaku Gakkai (1995).

SYNTHESIS EXAMPLE 1

Synthesis of Compound C-1

In a flask were charged 0.75 mols of 1,6-hexanediol diacrylate (manufactured by Nakamura Chemical Co., Ltd.), 1.0 mol of a 37% aqueous solution of formaldehyde and 100 ml of tetrahydrofuran. Then, 0.135 mols of DABCO was added to the mixture, followed by reacting with stirring for 24 hours. To the reaction mixture was added a mixture of 40 ml of 1 N hydrochloric acid and 200 ml of water, and the mixture was extracted with ethyl acetate. The extract was dried over magnesium sulfate and filtered. The filtrate was concentrated under a reduced pressure, separated by silica gel chromatography (hexane/ethyl acetate=9/1) and concentrated under a reduced pressure to obtain Compound C-1 in a yield of 20%. The structure of the compound was confirmed by NMR, MASS and IR.

SYNTHESIS EXAMPLE 2

Synthesis of Compound D-7

In a flask were charged 1.0 mol of Compound A-1, 100 ml of ethyl acetate, 1.0 mol of pyridine and 0.1 mol of DMAP (4-dimethylaminopyridine). Then, 0.5 mols of butanediol dichloride was dropwise added to the mixture under cooling with ice over a period of one hour, and the temperature of mixture was returned to room temperature, followed by stilling for 3 hours. To the reaction mixture was added 200 ml of water, and the ethyl acetate layer was extracted. The extract was dried over magnesium sulfate and filtered. The filtrate was sufficiently concentrated under a reduced pressure to obtain Compound D-7 in a yield of 80%. The structure of the compound was confirmed by NMR, MASS and IR.

SYNTHESIS EXAMPLE 3

Synthesis of Compound E-4

In a flask were charged 0.375 mols of pentaerythritol tetraacrylate (manufactured by Nakamura Chemical Co., Ltd.), 1.0 mol of a 37% aqueous solution of formaldehyde and 100 ml of tetrahydrofuran. Then, 0.135 mols of DABCO was added to the mixture, followed by reacting with stirring for 24 hours. To the reaction mixture was added a mixture of 40 ml of 1 N hydrochloric acid and 200 ml of water, and the mixture was extracted with ethyl acetate. The extract was dried over magnesium sulfate and filtered. The filtrate was concentrated under a reduced pressure, separated by silica gel chromatography (hexane/ethyl acetate=9/1) and concentrated under a reduced pressure to obtain Compound E-4 in a yield of 10%. The structure of the compound was confirmed by NMR, MASS and IR.

SYNTHESIS EXAMPLE 4

Synthesis of Compound F-3

In a flask were charged 1.0 mol of Compound A-1, 100 ml of ethyl acetate, 1.0 mol of pyridine and 0.1 mol of DMAP (4-dimethylaminopyridine). Then, 0.34 mols of trimesoyl chloride was dropwise added to the mixture under cooling with ice over a period of one hour, and the temperature of mixture was returned to room temperature, followed by stilling for 3 hours. To the reaction mixture was added 200 ml of water, and the ethyl acetate layer was extracted. The extract was dried over magnesium sulfate and filtered. The filtrate was sufficiently concentrated under a reduced pressure to obtain Compound F-3 in a yield of 70%. The structure of the compound was confirmed by NMR, MASS and IR.

Other compounds of the specific examples described above may be synthesized in the same manner as above.

EXAMPLE 1

Photopolymerizable Composition (Preparation of Support)

A 0.3 mm-thick aluminum plate was etched by dipping it in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic graining treatment in a 1% by weight aqueous nitric acid solution using an alternating current with a sinusoidal waveform at electricity of 300 coulomb/$dm^2$ during the anodic time. Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to conduct a desmut treatment, and then subjected to an anodic oxidation treatment in a 20% by weight aqueous sulfuric acid solution for 2 minutes at a current density of 2 A/$dm^2$ to form an anodic oxide film having a thickness of 2.7 g/$m^2$. The surface roughness measured was 0.3 μm (the Ra value according to JIS B0601).

On the back surface of the thus-treated aluminum plate, a coating solution for backcoat layer described below was coated by a bar coater and dried at 100° C. for 1 minute, thereby preparing a support having provided thereon the backcoat layer having a dry coating amount of 70 mg/$m^2$.

Sol-Gel Reaction Solution

| | |
|---|---|
| Tetraethyl silicate | 50 parts by weight |
| Water | 20 parts by weight |
| Methanol | 15 parts by weight |
| Phosphoric acid | 0.05 parts by weight |

The above components were mixed and stirred, and about 5 minutes later, heat generation occurred. After reacting the mixture for 60 minutes, a solution having the composition shown below was added the reaction mixture to prepare the coating solution for backcoat layer.

| | |
|---|---|
| Pyrogallol formaldehyde condensed resin (molecular weight: 2,000) | 4 parts by weight |
| Dimethyl phthalate | 5 parts by weight |
| Fluorine-based surface active agent (N-butylperfluorooctane sulfonamidoethyl acrylate/polyoxyethylene acrylate copolymer, molecular weight: 20,000) | 0.7 parts by weight |
| Methanol silica sol (manufactured | 50 parts by weight |

-continued

| | |
|---|---|
| by Nissan Chemical Industries, Ltd., 30% by weight in methanol) | |
| Methanol | 800 parts by weight |

(Preparation of Photosensitive Layer)

On the above-described aluminum support, a coating solution for photosensitive layer having the photopolymerizable composition shown below was coated and dried at 100° C. for 1 minute to form a photosensitive layer having a dry coating amount of 1.5 g/m².

Coating Solution for Photosensitive Layer

| | |
|---|---|
| Compound (X) of the present invention or for comparison shown in Table A below | 2.0 g |
| Photopolymerization Initiator (Y) shown in Table A below | 0.3 g |
| Polymer binder (Z) shown in Table A below | 2.0 g |
| Additive (S) shown in Table A below | 0.4 g |
| Fluorine-based surface active agent (Megafac F-177, manufactured by Dai-Nippon Ink & Chemicals, Inc.) | 0.03 g |
| Thermal polymerization inhibitor (N-Nitrosophenylhydroxylamine aluminum salt) | 0.01 g |
| Pigment dispersion (shown below) | 2.0 g |
| Methyl ethyl ketone | 20 g |
| Propylene glycol monomethyl ether | 20 g |

Composition of Pigment Dispersion

| | |
|---|---|
| Pigment Blue 15:6 | 15 parts by weight |
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |

(Preparation of Protective Layer)

As shown in Table A below, in some examples, a 3% by weight aqueous solution of polyvinyl alcohol (saponification degree: 98% by mole, polymerization degree: 550) was coated on the photosensitive layer and dried at 100° C. for 2 minutes to prepare a protective layer having a dry coating amount of 2 g/m².

(Evaluation of Sensitivity)

The evaluation of sensitivity was conducted with each of the photosensitive materials thus prepared using different light sources depending on the exposure wavelength of the photosensitive material. For instance, the exposure was conducted in the air using a semiconductor laser of 410 nm, an FD-YAG laser of 532 nm and a semiconductor laser of 830 nm. Then, the exposed photosensitive material was subjected to development by immersing in a developer having the composition shown below at 25° C. for 10 seconds. From the minimum exposure amount necessary for forming an image, the sensitivity under each exposure condition was calculated in a unit of mJ/cm². As the value is smaller, the sensitivity is higher. However, since an energy amount per photon varies depending on the exposure wavelength, it is easily understood that the photosensitive material is ordinarily sensitive in a small amount of the above-described exposure as the exposure wavelength is shorter. Thus, the higher sensitivity is obtained when the exposure wavelength used is shorter. Therefore, the comparison of sensitivity under different exposure conditions is meaningless, and it should be noted that the difference of sensitivity between the examples and the comparative examples under the same exposure condition is evaluated in Table B. The results obtained are shown in Table B below.

Composition of Developer

| | |
|---|---|
| Potassium hydroxide | 0.06 g |
| Potassium carbonate | 0.06 g |
| Compound of formula (20) (Y-1 shown below) | 5.0 g |
| Chelest 400 | 0.1 g |
| Water | 100.0 g |
| [k 110] | |

(Evaluation of Preservation Stability)

Each of the photosensitive material before the laser exposure was allowed to stand under a high temperature condition (60° C.) for 3 days, and then subjected to the laser exposure in the same manner as above. The amount of energy necessary for image formation was determined and an energy ratio between before and after the preservation at a high temperature (energy after high temperature preservation/energy before high temperature preservation) was obtained. The energy ratio of not more than 1.1 is preferable in the production and denotes excellent preservation stability. The results obtained are also shown in Table B below.

TABLE A

| | Photosensitive Material | | | | | |
|---|---|---|---|---|---|---|
| | X | Y | Z | S | Protective Layer | Light Source (nm) |
| Example | | | | | | |
| 1 | X-1 | Y-1 | Z-1 | S-1 | present | 410 |
| 2 | X-2 | Y-1 | Z-1 | S-1 | present | 410 |
| 3 | X-3 | Y-2 | Z-1 | S-1 | present | 410 |
| 4 | X-4 | Y-2 | Z-1 | S-1 | present | 410 |
| 5 | X-5 | Y-1 | Z-2 | S-1 | present | 410 |
| 6 | X-6 | Y-1 | Z-2 | S-1 | present | 410 |
| 7 | X-7 | Y-2 | Z-2 | S-1 | present | 410 |
| 8 | X-8 | Y-2 | Z-2 | S-1 | present | 410 |
| Comparative Example | | | | | | |
| 1 | ex-1 | Y-1 | Z-1 | S-1 | present | 410 |
| 2 | ex-2 | Y-1 | Z-1 | S-1 | present | 410 |
| 3 | ex-3 | Y-2 | Z-1 | S-1 | present | 410 |
| 4 | Ex-4 | Y-2 | Z-1 | S-1 | present | 410 |
| 5 | ex-5 | Y-1 | Z-2 | S-1 | present | 410 |
| 6 | ex-6 | Y-1 | Z-2 | S-1 | present | 410 |
| 7 | ex-7 | Y-2 | Z-2 | S-1 | present | 410 |
| 8 | ex-8 | Y-2 | Z-2 | S-1 | present | 410 |
| Example | | | | | | |
| 9 | X-9 | Y-3 | Z-1 | S-2 | present | 532 |
| 10 | X-10 | Y-3 | Z-1 | S-2 | present | 532 |
| 11 | X-11 | Y-4 | Z-1 | S-2 | present | 532 |
| 12 | X-12 | Y-4 | Z-2 | S-2 | present | 532 |
| 13 | X-13 | Y-5 | Z-2 | S-2 | present | 532 |
| 14 | X-14 | Y-5 | Z-2 | S-2 | present | 532 |
| Comparative Example | | | | | | |
| 9 | ex-9 | Y-3 | Z-1 | S-2 | present | 532 |
| 10 | ex-10 | Y-3 | Z-1 | S-2 | present | 532 |
| 11 | ex-11 | Y-4 | Z-1 | S-2 | present | 532 |
| 12 | ex-12 | Y-4 | Z-2 | S-2 | present | 532 |
| 13 | ex-13 | Y-5 | Z-2 | S-2 | present | 532 |
| 14 | ex-14 | Y-5 | Z-1 | S-2 | present | 532 |

TABLE A-continued

Photosensitive Material

| | X | Y | Z | S | Protective Layer | Light Source (nm) |
|---|---|---|---|---|---|---|
| Example | | | | | | |
| 15 | X-15 | Y-6 | Z-3 | none | none | 830 |
| 16 | X-16 | Y-6 | Z-3 | none | none | 830 |
| 17 | X-17 | Y-7 | Z-4 | none | none | 830 |
| 18 | X-18 | Y-7 | Z-4 | none | none | 830 |
| 19 | X-19 | Y-7 | Z-4 | none | none | 830 |
| Comparative Example | | | | | | |
| 15 | ex-15 | Y-6 | Z-3 | none | none | 830 |
| 16 | ex-16 | Y-6 | Z-3 | none | none | 830 |
| 17 | ex-17 | Y-7 | Z-4 | none | none | 830 |
| 18 | ex-18 | Y-7 | Z-4 | none | none | 830 |
| 19 | ex-19 | Y-7 | Z-4 | none | none | 830 |

(Evaluation of Printing Durability)

Each photosensitive material was subjected to scanning exposure of background image and dot images of 1 to 99% (1% pitch) under condition of 175 lines/inch at 4,000 dpi using an FD-YAG laser of 532 nm and 100 mW (Plate Jet 4 manufactured by CSI Co., Ltd.) in an amount of 100 $\mu J/cm^2$, using a violet LD of 410 nm and 30 mW (test device of internal surface drum type) in an amount of 100 $\mu J/cm^2$ or using an infrared LD of 830 nm and 40 W (Trendsetter manufactured by Creo Inc.) in an amount of 100 $mJ/cm^2$. The development processing was conducted using an automatic developing machine (LP-850P2 manufactured by Fuji Photo Film Co., Ltd.) loaded with the above-described developer and a finishing gum solution (FP-2W manufactured by Fuji Photo Film Co., Ltd.) according to the standard processing to obtain a lithographic printing plate. The preheating after the exposure was conducted so as to reach the plate surface temperature at 110° C. The immersion time in the developer was 15 seconds.

The lithographic printing plate was subjected to printing using a printing machine (Type R201 manufactured by Man Roland Co., Ltd.) and ink (GEOS G Black (N) manufactured by Dainippon Ink & Chemicals Inc.), and a number of sheets where dots of 3% were disappeared was determined. The results obtained are also shown in Table B below.

With respect to the criteria of evaluations, it is desired in view of the production that the sensitivity is not more than 0.05 $mJ/cm^2$ at a wavelength of 410 nm, not more than 0.2 $mJ/cm^2$ at a wavelength of 532 nm, and not more than 100 $mJ/cm^2$ at a wavelength of 830 nm, the preservation stability is not more than 1.1, and the printing durability is not less than 200,000 sheets.

TABLE B

| | Evaluation Result | | |
|---|---|---|---|
| | Sensitivity (mJ/cm²) | Preservation Stability (energy ratio) | Printing Durability (×10⁴ sheets) |
| Example | | | |
| 1 | 0.05 | 1.05 | 30 |
| 2 | 0.04 | 1.05 | 30 |
| 3 | 0.05 | 1.1 | 25 |
| 4 | 0.05 | 1.1 | 25 |
| 5 | 0.05 | 1.1 | 25 |
| 6 | 0.04 | 1.05 | 25 |
| 7 | 0.05 | 1.1 | 30 |
| 8 | 0.05 | 1.05 | 30 |
| Comparative example | | | |
| 1 | 0.2 | 1.5 | 15 |
| 2 | 0.15 | 2.0 | 10 |
| 3 | 0.2 | 2.0 | 10 |
| 4 | 0.2 | 2.0 | 15 |
| 5 | 0.2 | 1.5 | 15 |
| 6 | 0.15 | 1.5 | 15 |
| 7 | 0.2 | 1.5 | 10 |
| 8 | 0.15 | 2.0 | 10 |
| Example | | | |
| 9 | 0.1 | 1.05 | 30 |
| 10 | 0.15 | 1.05 | 30 |
| 11 | 0.1 | 1.0 | 30 |
| 12 | 0.1 | 1.0 | 30 |
| 13 | 0.15 | 1.0 | 25 |
| 14 | 0.15 | 1.1 | 25 |
| Comparative example | | | |
| 9 | 0.3 | 2.0 | 10 |
| 10 | 0.3 | 1.5 | 15 |
| 11 | 0.3 | 1.5 | 15 |
| 12 | 0.3 | 1.5 | 15 |
| 13 | 0.5 | 1.5 | 15 |
| 14 | 0.5 | 1.5 | 10 |
| Example | | | |
| 15 | 100 | 1.0 | 20 |
| 16 | 100 | 1.0 | 20 |
| 17 | 90 | 1.1 | 20 |
| 18 | 100 | 1.0 | 20 |
| 19 | 100 | 1.1 | 20 |
| Comparative example | | | |
| 15 | 250 | 2.0 | 10 |
| 16 | 200 | 1.5 | 10 |
| 17 | 150 | 2.0 | 10 |
| 18 | 150 | 1.5 | 15 |
| 19 | 200 | 1.3 | 15 |

Compounds shown in Table A:
| | | $\dfrac{a}{b+c}$ |
|---|---|---|
| X-1 | 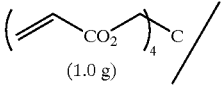 (1.0 g) / 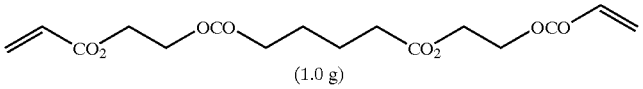 (1.0 g) | $\dfrac{50 \text{ wt \%}}{0 + 50 \text{ wt \%}} = 1.0$ |
| X-2 | 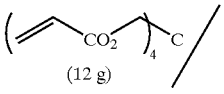 (12 g) / 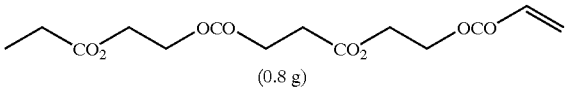 (0.8 g) | $\dfrac{40}{0 + 60} = 0.67$ |
| X-3 | 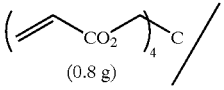 (0.8 g) / 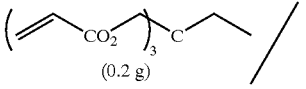 (0.2 g) / 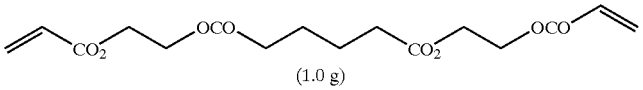 (1.0 g) | $\dfrac{50}{10 + 40} = 1.0$ |
| X-4 | 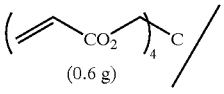 (0.6 g) / 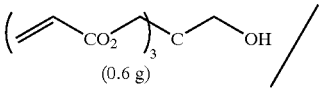 (0.6 g) / 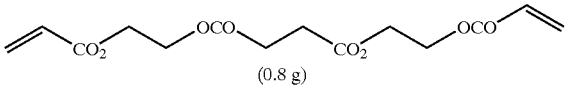 (0.8 g) | $\dfrac{40}{30 + 30} = 0.67$ |
| X-5 | 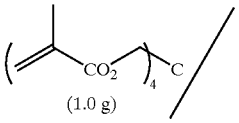 (1.0 g) / 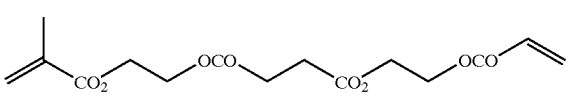 (1.0 g) | $\dfrac{50}{0 + 50} = 1.0$ |
| X-6 |  (0.6 g) / | $\dfrac{70}{0 + 30} = 2.3$ |

|  | $\dfrac{a}{b+c}$ |
|---|---|
| 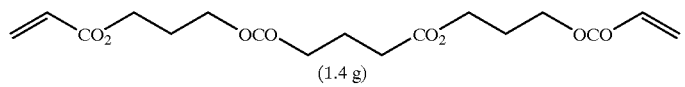<br>(1.4 g) | |
| X-7 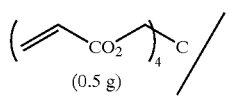<br>(0.5 g) / | $\dfrac{50}{25+25} = 1.0$ |
| 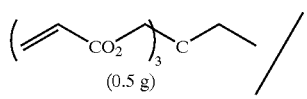<br>(0.5 g) / | |
| 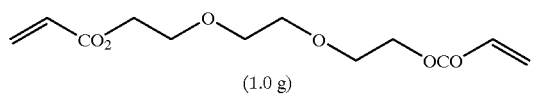<br>(1.0 g) | |
| X-8 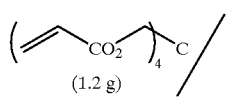<br>(1.2 g) / | $\dfrac{40}{0+60} = 0.67$ |
| 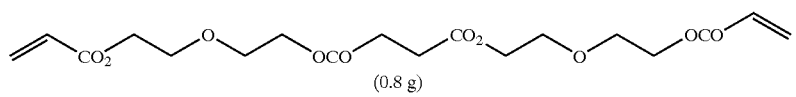<br>(0.8 g) | |
| ex-1 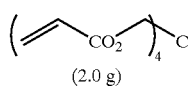<br>(2.0 g) | $\dfrac{0}{0+100} = 0$ |
| ex-2 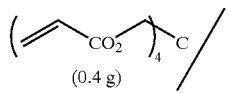<br>(0.4 g) / | $\dfrac{80}{0+20} = 4.0$ |
| 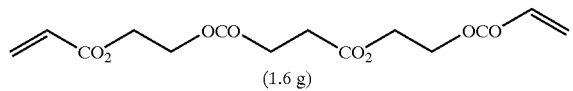<br>(1.6 g) | |
| ex-3 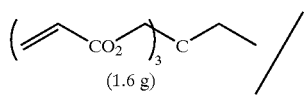<br>(1.6 g) / | $\dfrac{20}{80+0} = 0.25$ |
| 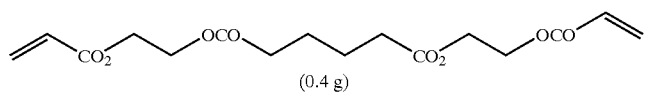<br>(0.4 g) | |
| ex-4 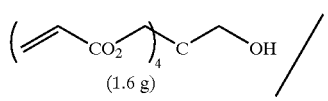<br>(1.6 g) / | $\dfrac{20}{80+0} = 0.25$ |
| 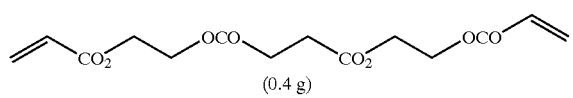<br>(0.4 g) | |
| ex-5 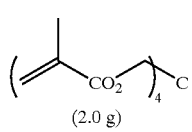<br>(2.0 g) | $\dfrac{0}{0+100} = 0$ |

-continued
| | $\dfrac{a}{b+c}$ |
|---|---|
| ex-6 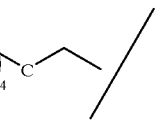 (0.2 g) 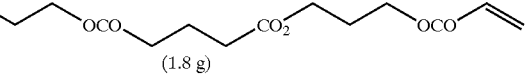 (1.8 g) | $\dfrac{90}{0+10} = 9.0$ |
| ex-7  (0.1 g) 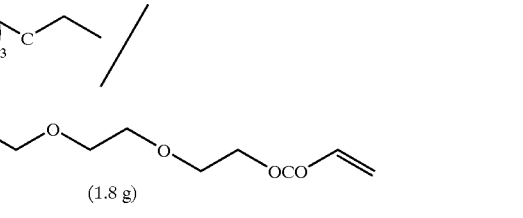 (0.1 g) 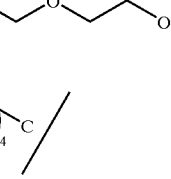 (1.8 g) | $\dfrac{90}{5+5} = 9.0$ |
| ex-8 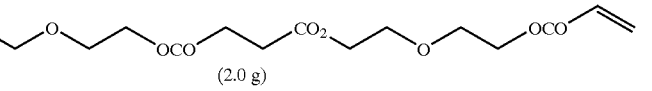 (2.0 g) | $\dfrac{100}{0+0} = 0$ |
| X-9  (1.0 g) 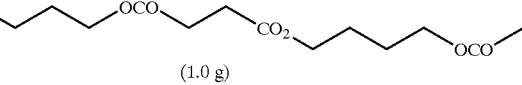 (1.0 g) | $\dfrac{50}{0+50} = 1.0$ |
| X-10  (1.0 g) 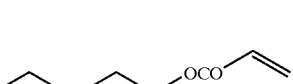 (1.0 g) | $\dfrac{50}{0+50} = 1.0$ |
| X-11 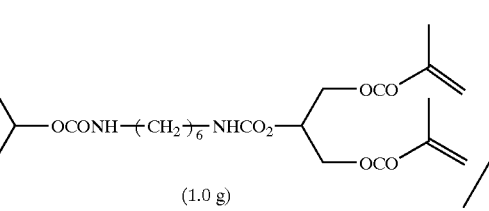 (1.0 g) 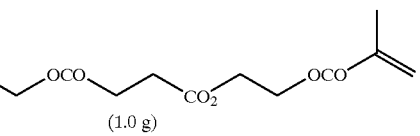 (1.0 g) | $\dfrac{50}{0+50} = 1.0$ |

-continued

| | $\dfrac{a}{b+c}$ |
|---|---|
| X-12 [structure, (0.8 g)] / [structure, (1.2 g)] | $\dfrac{60}{0+40} = 1.5$ |
| X-13 [structure, (1.0 g)] / [structure, (0.2 g)] / [structure, (0.8 g)] | $\dfrac{40}{10+50} = 0.67$ |
| X-14 [structure, (0.8 g)] / [structure, (0.4 g)] / [structure, (0.8 g)] | $\dfrac{40}{20+40} = 0.67$ |
| ex-9 [structure, (0.4 g)] / [structure, (1.6 g)] | $\dfrac{80}{0+20} = 4.0$ |
| ex-10 [structure, (2.0 g)] | $\dfrac{100}{0+0} = \infty$ |

-continued
| | $\frac{a}{b+c}$ |
|---|---|
| ex-11 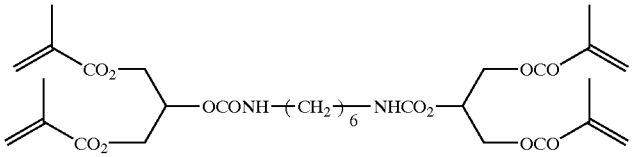 (2.0 g) | $\frac{0}{0+100}=0$ |
| ex-12 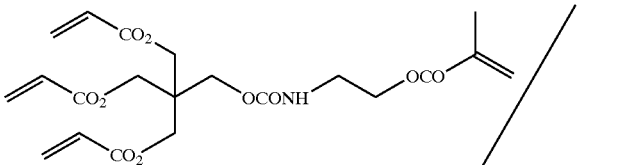 (0.4 g) 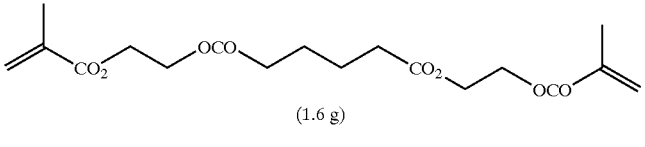 (1.6 g) | $\frac{80}{0+20}=4.0$ |
| ex-13 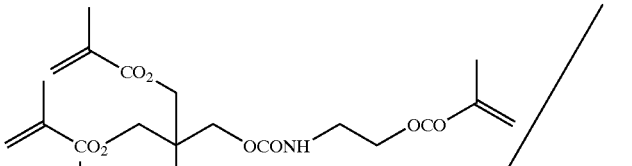 (0.3 g) 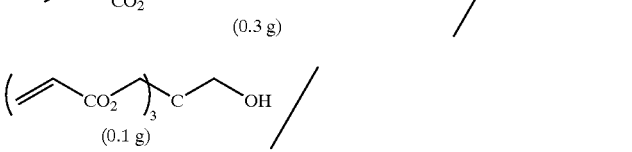 (0.1 g)  (1.6 g) | $\frac{80}{5+15}=4.0$ |
| ex-14 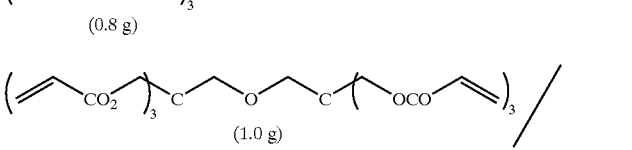 (1.2 g) 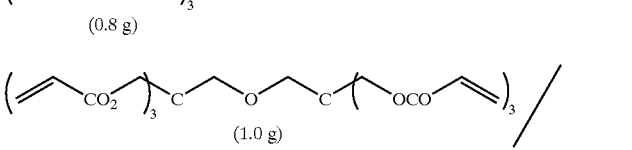 (0.8 g) | $\frac{0}{40+60}=0$ |
| X-15 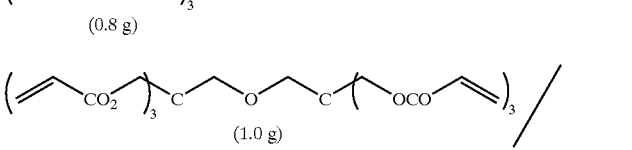 (1.0 g) 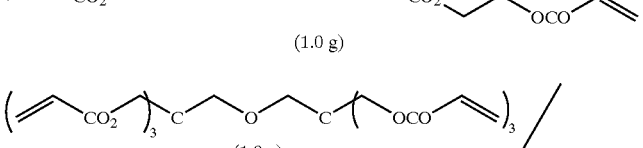 (1.0 g) | $\frac{50}{0+50}=1.0$ |
| X-16 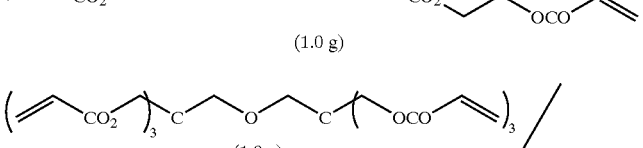 (1.0 g) | $\frac{50}{0+50}=1.0$ |

-continued
|  | $\dfrac{a}{b+c}$ |
|---|---|
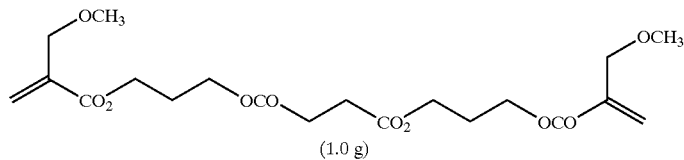
(1.0 g)
X-17 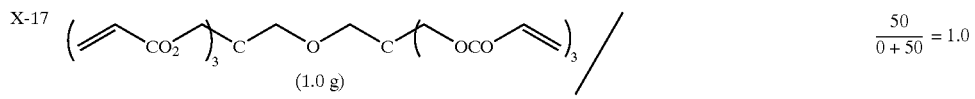
(1.0 g)
$\dfrac{50}{0+50} = 1.0$
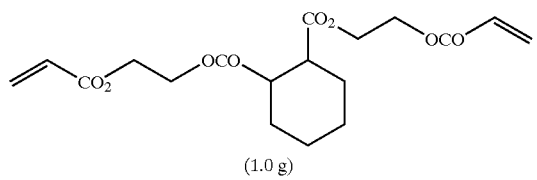
(1.0 g)
X-18 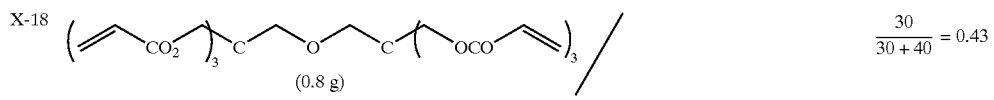
(0.8 g)
$\dfrac{30}{30+40} = 0.43$
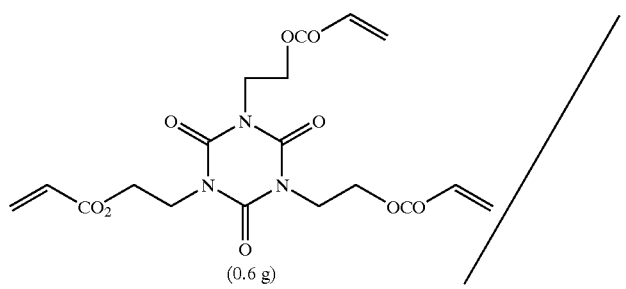
(0.6 g)
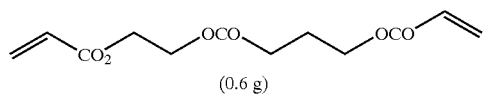
(0.6 g)
X-19 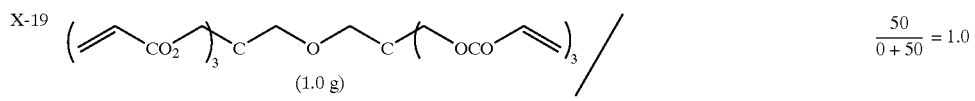
(1.0 g)
$\dfrac{50}{0+50} = 1.0$
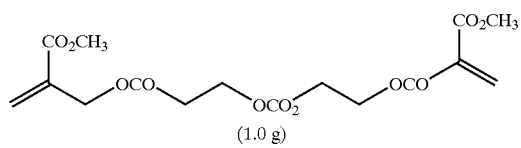
(1.0 g)
ex-15 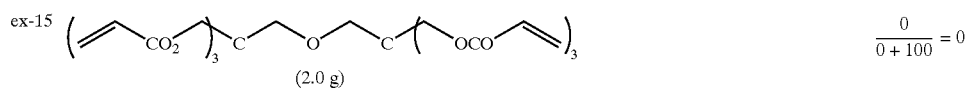
(2.0 g)
$\dfrac{0}{0+100} = 0$
ex-16 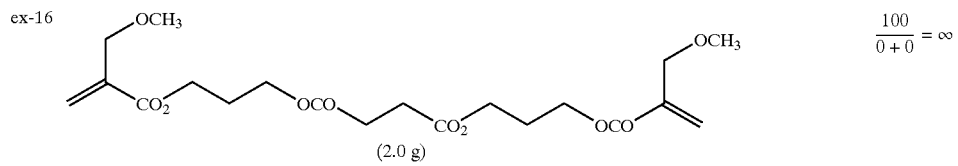
(2.0 g)
$\dfrac{100}{0+0} = \infty$ -continued
| | $\frac{a}{b+c}$ |
|---|---|
| ex-17 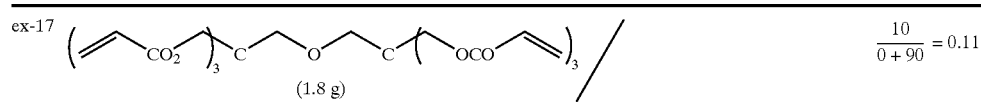 (1.8 g) 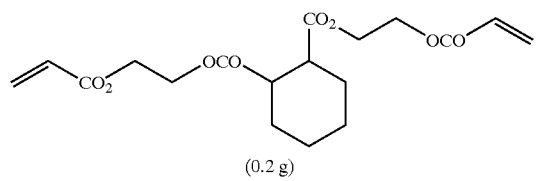 (0.2 g) | $\frac{10}{0+90} = 0.11$ |
| ex-18 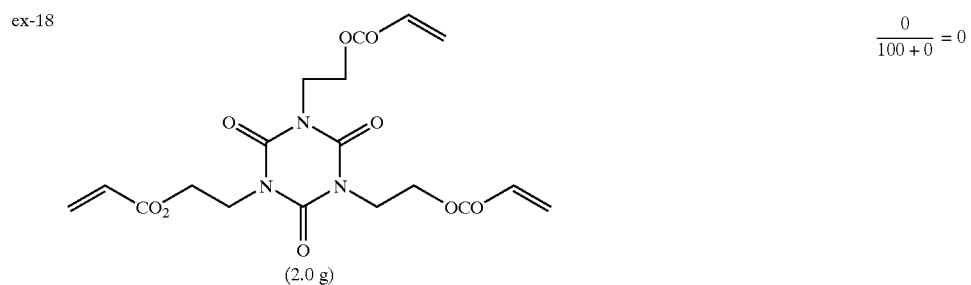 (2.0 g) | $\frac{0}{100+0} = 0$ |
| ex-19 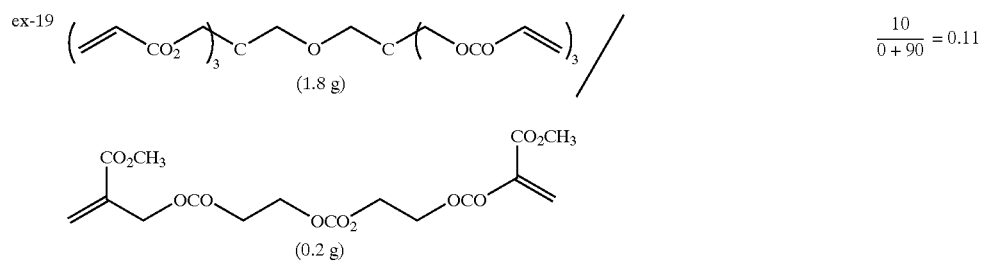 (1.8 g) 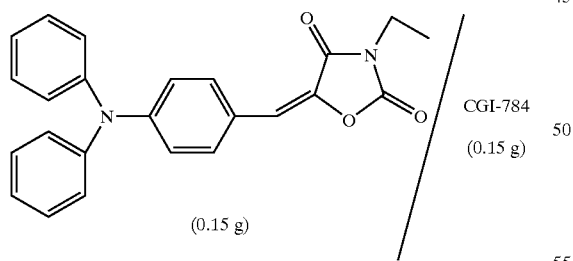 (0.2 g) | $\frac{10}{0+90} = 0.11$ |
-continued
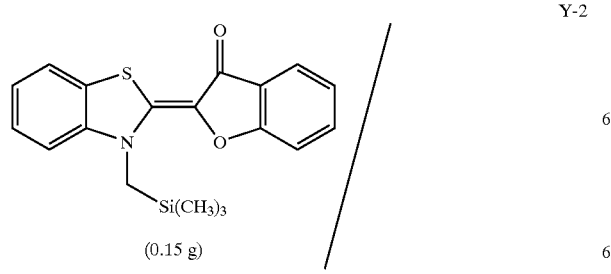
(0.15 g)
Y-1
CGI-784
(0.15 g)
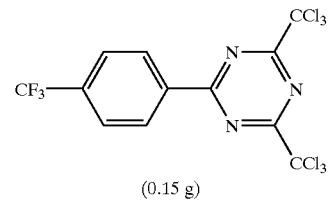
(0.15 g)
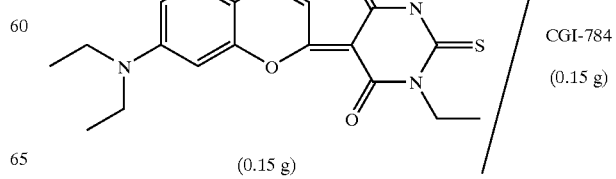
(0.15 g)
Y-2
Y-3
CGI-784
(0.15 g)

-continued
Y-4
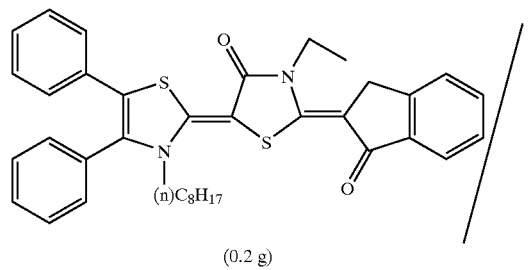
(0.2 g)
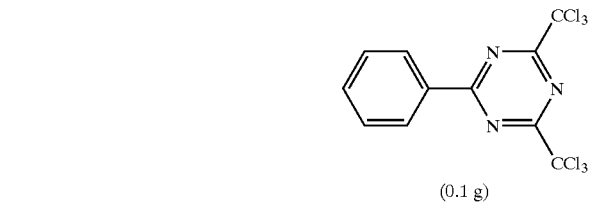
(0.1 g)
Y-5
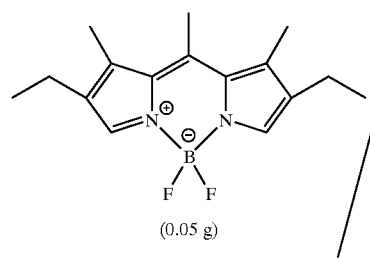
(0.05 g)
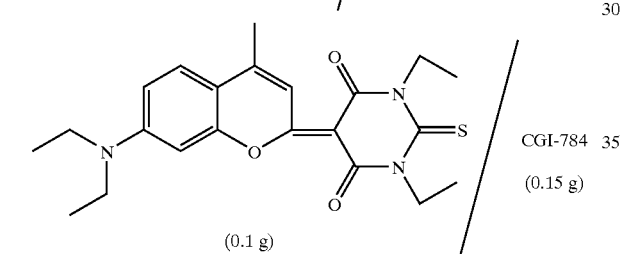
(0.1 g)
Note: CGI-784: manufactured by Ciba Geigy AG
Y-6
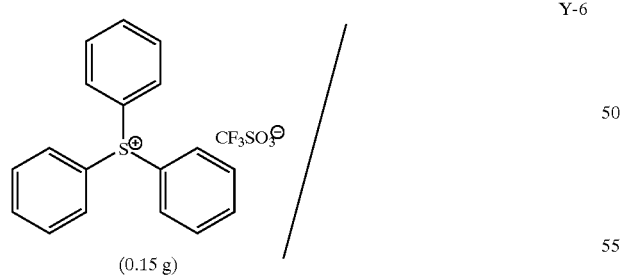
(0.15 g)
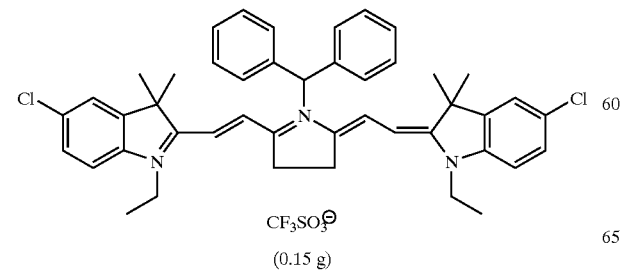
(0.15 g)
-continued
Y-7
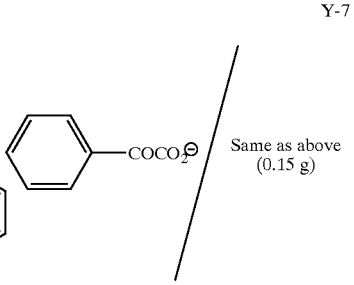
(0.15 g)
Same as above
(0.15 g)
Z-1
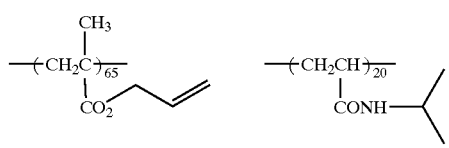
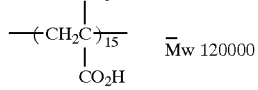 $\overline{M}w\ 120000$
Z-2
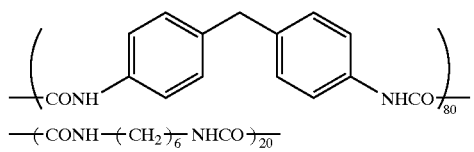
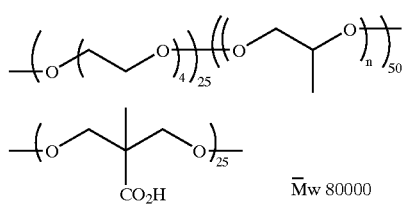
$\overline{M}w\ 80000$
Z-3
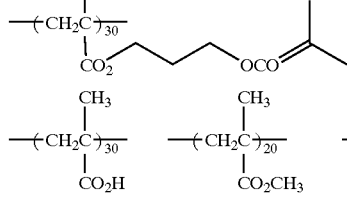
$\overline{M}w\ 100000$
Z-4
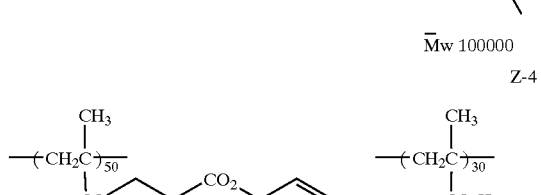
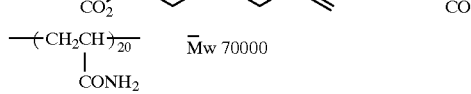 $\overline{M}w\ 70000$
S-1
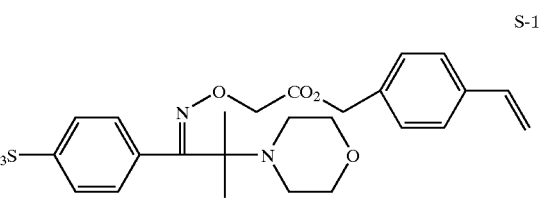

-continued

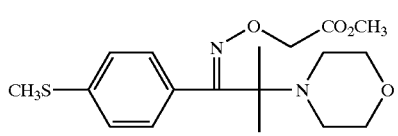

S-2

As is apparent from the results shown in Table B, the lithographic printing plate precursor and plate-making method of printing plate according to the present invention exhibits the high sensitivity, good preservation stability and good printing durability.

As described above, according to the plate-making method of a printing plate of the present invention, the compatibility of high sensitivity and preservation stability can be achieved by using particularly a difunctional crosslinking agent having the specific structure in the specific amount together with a trifunctional crosslinking agent and a polyfunctional crosslinking agent and in addition, the good printing durability is also achieved due to the synergistic effect based on the use of specific developer. Further, a photopolymerizable composition suitable for a printing plate precursor capable of performing direct plate-making based on digital data, for example, from a computer by recording using a solid laser or semiconductor laser radiating an ultraviolet ray, visible light or infrared ray is provided.

<Synthesis of Compound Having Structure Represented by Formula (I)>

(General Synthesis Method)

In general, the compound (crosslinking agent having a structure represented by formula (I)) according to the present invention can be easily synthesized, for example, by Method 1 or Method 2 shown below. In order to explain the general synthesis method in a simpler manner, a case wherein $T^3$, $R^4$, $T^4$, $R^5$ each represent a single bond in formula (c) is described below.

Method 1: Case Wherein $T^1$ and $T^2$ each Represent an Ester Group or a Carbonic Acid Ester Group

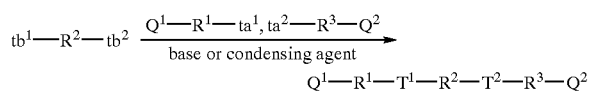

In the above reaction formula, $(ta^1, tb^1)$ and $(ta^2, tb^2)$ each represent a combination of reactive groups reacting with each other to form an ester group or a carbonic acid ester group. Specific examples of the combination include (OH, CO$_2$H), (OH, COCl) and (OH, OCOCl) wherein the groups described in parentheses are in random order.

The base represents an organic base, for example, pyridine or triethylamine or an inorganic base, for example, sodium hydrogen carbonate. The condensing agent represents a dehydration condensing agent, for example, 1,3-dicyclohexylcarbodiimide (DCC).

Method 2: Case Wherein $T^1$ and $T^2$ each Represent a Carbonyl Group

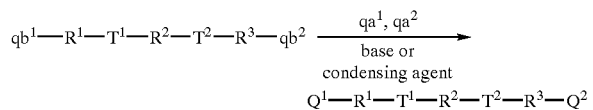

In the above reaction formula, $(qa^1, qb^1)$ and $(qa^2, qb^2)$ each represent a combination of reactive groups reacting with each other to form a radical polymerizable terminal group. Specific examples of the combination include

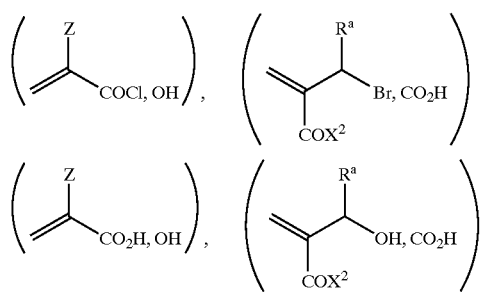

wherein the groups described in parentheses are in random order.

The base represents an organic base, for example, pyridine or triethylamine or an inorganic base, for example, sodium hydrogen carbonate. The condensing agent represents a dehydration condensing agent, for example, 1,3-dicyclohexylcarbodiimide (DCC).

SYNTHESIS EXAMPLE 101

Synthesis of Compound I-1

In a flask were charged 0.2 mols of 2-hydroxyethyl acrylate, 0.2 mols of pyridine, 0.02 mols of 4-dimethylaminopyridine and 200 ml of ethyl acetate. The mixture was cooled at 10° C. and 0.1 mol of succinic chloride was dropwise added thereto over a period of one hour. The temperature of mixture was returned to room temperature, followed by stilling for 3 hours. To the reaction mixture was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 26.7 g (yield of 85%) of the desired Compound I-1. The structure of the compound was confirmed by NMR, MASS and IR.

SYNTHESIS EXAMPLE 102

Synthesis of Compound I-4

In a flask were charged 0.2 mols of 2-hydroxyethyl acrylate, 0.2 mols of pyridine, 0.02 mols of 4-dimethylaminopyridine and 200 ml of ethyl acetate. The mixture was cooled at 10° C. and 0.1 mol of adipic chloride was dropwise added thereto over a period of one hour. The temperature of mixture was returned to room temperature, followed by stilling for 3 hours. To the reaction mixture was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 28.4 g (yield of 83%) of the desired Compound I-4. The structure of the compound was confirmed by NMR, MASS and IR.

SYNTHESIS EXAMPLE 103

Synthesis of Compound I-7

In a flask were charged 0.2 mols of 2-hydroxyethyl acrylate, 0.2 mols of pyridine, 0.02 mols of 4-dimethylaminopyridine and 200 ml of ethyl acetate. The mixture was cooled at 10° C. and 0.2 mols of succinic anhydride was dropwise added thereto over a period of one hour. To the mixture were added 0.2 mols of dicyclohexylcarbodiimide (DCC) and 0.1 mol of ethylene glycol, and the temperature of mixture was returned to room temperature, followed by stilling for 3 hours. The mixture was passed through a silica gel short column. To the filtrate was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 30.9 g (yield of 70%) of the desired Compound I-7. The structure of the compound was confirmed by NMR, MASS and IR.

SYNTHESIS EXAMPLE 104

Synthesis of Compound I-15

In a flask were charged 0.1 mol of 2-carboxyethyl acrylate and 200 ml of ethyl acetate. The mixture was cooled at 10° C. and 0.1 mol of dicyclohexylcarbodiimide (DCC) and 0.1 mol of 2-hydroxyethyl acrylate were added thereto, followed by stirring for one hour. The temperature of mixture was returned to room temperature, followed by stilling for 3 hours. The mixture was passed through a silica gel short column. To the filtrate was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 19.4 g (yield of 80%) of the desired Compound I-15. The structure of the compound was confirmed by NMR, MASS and IR.

SYNTHESIS EXAMPLE 105

Synthesis of Compound I-22

In a flask were charged 0.2 mols of 2-hydroxyethyl methacrylate, 0.2 mols of pyridine, 0.02 mols of 4-dimethylaminopyridine and 200 ml of ethyl acetate. The mixture was cooled at 10° C. and 0.1 mol of succinic chloride was dropwise added thereto over a period of one hour. The temperature of mixture was returned to room temperature, followed by stilling for 3 hours. To the reaction mixture was added 300 ml of water, followed by conducted extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 29.8 g (yield of 87%) of the desired Compound I-22. The structure of the compound was confirmed by NMR, MASS and IR.

SYNTHESIS EXAMPLE 106

Synthesis of Compound I-34

In a flask were charged 0.1 mol of bis(2-hydroxyethyl) ketone, 0.2 mols of pyridine, 0.02 mols of 4-dimethylaminopyridine and 200 ml of ethyl acetate. The mixture was cooled at 10° C. and 0.2 mols of α-acetoxymethylacrylic chloride was dropwise added thereto over a period of one hour. The temperature of mixture was returned to room temperature, followed by stilling for 3 hours. To the reaction mixture was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 30.3 g (yield of 82%) of the desired Compound I-34. The structure of the compound was confirmed by NMR, MASS and IR.

SYNTHESIS EXAMPLE 107

Synthesis of Compound I-39

In a flask were charged 0.1 mol of ethylene glycol, 0.2 mols of triethylamine, 0.02 mols of 4-dimethylaminopyridine and 200 ml of ethyl acetate. To the mixture was added 0.2 mols of succinic anhydride. Then, 0.2 mols of methyl α-bromomethylacrylate was dropwise added thereto over a period of one hour, followed by stilling for 3 hours. To the reaction mixture was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 32.1 g (yield of 70%) of the desired Compound I-39. The structure of the compound was confirmed by NMR, MASS and IR.

SYNTHESIS EXAMPLE 108

Synthesis of Compound I-48

In a flask were charged 0.1 mol of 4-ketopimeric acid, 0.2 mols of triethylamine and 200 ml of ethyl acetate. Then, 0.2 mols of methyl α-bromomethylacrylate was dropwise added thereto over a period of one hour, followed by stilling for 3 hours. To the reaction mixture was added 300 ml of water, followed by conducting extraction. The extracted ethyl acetate layer was washed with an aqueous hydrochloric acid solution, an aqueous sodium chloride solution and an aqueous sodium bicarbonate solution in order, dried over magnesium sulfate and concentrated under a reduced pressure to obtain 29.6 g (yield of 80%) of the desired Compound I-48. The structure of the compound was confirmed by NMR, MASS and IR.

Other compounds of the specific examples described above may be synthesized in the same manner as above.

EXAMPLE 101

Photopolymerizable Composition (Preparation of Support)

A 0.3 mm-thick aluminum plate was etched by dipping it in a 10% by weight aqueous sodium hydroxide solution at 60° C. for 25 seconds, washed with running water, neutralized and cleaned with a 20% by weight aqueous nitric acid solution and then washed with water. The aluminum plate was then subjected to an electrolytic graining treatment in a 1% by weight aqueous nitric acid solution using an alternating current with a sinusoidal waveform at electricity of 300 coulomb/dm$^2$ during the anodic time. Subsequently, the aluminum plate was dipped in a 1% by weight aqueous sodium hydroxide solution at 40° C. for 5 seconds, dipped in a 30% by weight aqueous sulfuric acid solution at 60° C. for 40 seconds to conduct a desmut treatment, and then subjected to an anodic oxidation treatment in a 20% by weight aqueous sulfuric acid solution for 2 minutes at a current density of 2 A/dm$^2$ to form an anodic oxide film having a thickness of 2.7 g/m$^2$. The surface roughness measured was 0.3 μm (the Ra value according to JIS B0601).

On the back surface of the thus-treated aluminum plate, a coating solution for backcoat layer described below was coated by a bar coater and dried at 100° C. for 1 minute, thereby preparing a support having provided thereon the backcoat layer having a dry coating amount of 70 mg/m$^2$.

Sol-Gel Reaction Solution

| Tetraethyl silicate | 50 parts by weight |
|---|---|
| Water | 20 parts by weight |
| Methanol | 15 parts by weight |
| Phosphoric acid | 0.05 parts by weight |

The above components were mixed and stirred, and about 5 minutes later, heat generation occurred. After reacting the mixture for 60 minutes, a solution having the composition shown below was added the reaction mixture to prepare the coating solution for backcoat layer.

| Pyrogallol formaldehyde condensed resin (molecular weight: 2,000) | 4 parts by weight |
|---|---|
| Dimethyl phthalate | 5 parts by weight |
| Fluorine-based surface active agent (N-butylperfluorooctane sulfonamidoethyl acrylate/polyoxyethylene acrylate copolymer, molecular weight: 20,000) | 0.7 parts by weight |
| Methanol silica sol (manufactured by Nissan Chemical Industries, Ltd., 30% by weight in methanol) | 50 parts by weight |
| Methanol | 800 parts by weight |

(Preparation of Photosensitive Layer)

On the above-described aluminum support, a coating solution for photosensitive layer having the photopolymerizable composition shown below was coated and dried at 100° C. for 1 minute to form a photosensitive layer having a dry coating amount of 1.5 g/m$^2$.

Coating Solution for Photosensitive Layer

Compound (X) of the present invention or (2.0-r) g for comparison shown in Table C below

| Photopolymerization Initiator (Y) shown in Table C below | 0.3 g |
|---|---|
| Polymer binder (Z) shown in Table C below | 2.0 g |
| Polymerizable compound (R) shown in Table C below | r g |
| Additive (S) shown in Table C below | 0.4 g |
| Fluorine-based surface active agent (Megafac F-177, manufactured by Dai-Nippon Ink & Chemicals, Inc.) | 0.03 g |
| Thermal polymerization inhibitor (N-Nitrosophenylhydroxylamine aluminum salt) | 0.01 g |
| Pigment dispersion (shown below) | 2.0 g |
| Methyl ethyl ketone | 20 g |
| Propylene glycol monomethyl ether | 20 g |

Composition of Pigment Dispersion

| Pigment Blue 15:6 | 15 parts by weight |
|---|---|
| Allyl methacrylate/methacrylic acid copolymer (copolymerization molar ratio: 83/17) | 10 parts by weight |
| Cyclohexanone | 15 parts by weight |
| Methoxypropyl acetate | 20 parts by weight |
| Propylene glycol monomethyl ether | 40 parts by weight |

(Preparation of Protective Layer)

As shown in Table C below, in some examples, a 3% by weight aqueous solution of polyvinyl alcohol (saponification degree: 98% by mole, polymerization degree: 550) was coated on the photosensitive layer and dried at 100° C. for 2 minutes to prepare a protective layer having a dry coating amount of 2 g/m$^2$.

(Evaluation of Sensitivity)

The evaluation of sensitivity was conducted with each of the photosensitive materials thus prepared using different light sources depending on the exposure wavelength of the photosensitive material. For instance, the exposure was conducted in the air using a semiconductor laser of 400 nm, an FD-YAG laser of 532 nm and a semiconductor laser of 830 nm. Then, the exposed photosensitive material was subjected to development by immersing in a developer having the composition shown below at 25° C. for 10 seconds. From the minimum exposure amount necessary for forming an image, the sensitivity under each exposure condition was calculated in a unit of mJ/cm$^2$. As the value is smaller, the sensitivity is higher. However, since an energy amount per photon varies depending on the exposure wavelength, it is easily understood that the photosensitive material is ordinarily sensitive in a small amount of the above-described exposure as the exposure wavelength is shorter. Thus, the higher sensitivity is obtained when the exposure wavelength used is shorter. Therefore, the comparison of sensitivity under different exposure conditions is meaningless, and it should be noted that the difference of sensitivity between the examples and the comparative examples under the same exposure condition is evaluated in Table D. The results obtained are shown in Table D below.

Composition of Developer

| DP-4 (manufactured by Fuji Photo Film Co., Ltd.) | 65.0 g |
|---|---|
| Water | 880.0 g |
| Lipomine LA (manufactured by Lion Corp.) | 50.0 g |

(Evaluation of Preservation Stability)

Each of the photosensitive material before the laser exposure was allowed to stand under a high temperature condition (60° C.) for 3 days, and then subjected to the laser exposure in the same manner as above. The amount of energy necessary for image formation was determined and an energy ratio between before and after the preservation at a high temperature (energy after high temperature preservation/energy before high temperature preservation) was obtained. The energy ratio of not more than 1.1 is preferable in the production and denotes excellent preservation stability. The results obtained are also shown in Table D below.

TABLE C

| | Photosensitive Material | | | | | |
|---|---|---|---|---|---|---|
| | X | Y | Z | R(r) | S | Light Source (nm) |
| Example | | | | | | |
| 1 | I-4 | Y-1 | Z-1 | none | S-1 | 410 |
| 2 | I-7 | Y-1 | Z-1 | none | none | 410 |
| 3 | I-13 | Y-2 | Z-2 | none | S-1 | 410 |
| 4 | I-18 | Y-2 | Z-2 | none | none | 410 |
| 5 | I-29 | Y-1 | Z-2 | none | S-2 | 410 |
| 6 | I-31 | Y-2 | Z-1 | none | S-3 | 410 |
| 7 | I-4 | Y-2 | Z-2 | R-1 (1.0) | S-2 | 410 |
| 8 | I-7 | Y-2 | Z-1 | R-1 (1.0) | S-1 | 410 |
| Comparative Example | | | | | | |
| 1 | X-1 | Y-1 | Z-1 | none | S-1 | 410 |
| 2 | X-2 | Y-1 | Z-1 | none | none | 410 |
| 3 | X-3 | Y-2 | Z-2 | none | S-1 | 410 |
| 4 | X-4 | Y-2 | Z-2 | none | none | 410 |
| 5 | X-5 | Y-1 | Z-2 | none | S-2 | 410 |
| 6 | X-6 | Y-2 | Z-1 | none | S-3 | 410 |
| 7 | X-1 | Y-2 | Z-2 | R-1 (1.0) | S-2 | 410 |
| 8 | X-2 | Y-2 | Z-1 | R-1 (1.0) | S-1 | 410 |
| Example | | | | | | |
| 9 | I-1 | Y-3 | Z-1 | none | none | 532 |
| 10 | 1-6 | Y-3 | Z-1 | none | none | 532 |
| 11 | 1-20 | Y-4 | Z-1 | none | S-1 | 532 |
| 12 | 1-30 | Y-4 | Z-2 | none | S-2 | 532 |
| 13 | 1-39 | Y-5 | Z-2 | none | S-3 | 532 |
| 14 | 1-51 | Y-5 | Z-1 | none | S-2 | 532 |
| 15 | I-1 | Y-3 | Z-3 | R-1 (1.0) | S-2 | 532 |
| 16 | 1-6 | Y-4 | Z-3 | R-2 (1.0) | S-1 | 532 |
| Comparative Example | | | | | | |
| 9 | X-7 | Y-3 | Z-1 | none | none | 532 |
| 10 | X-8 | Y-3 | Z-1 | none | none | 532 |
| 11 | X-9 | Y-4 | Z-1 | none | S-1 | 532 |
| 12 | X-10 | Y-4 | Z-2 | none | S-2 | 532 |
| 13 | X-11 | Y-5 | Z-2 | none | S-3 | 532 |
| 14 | X-12 | Y-5 | Z-1 | none | S-2 | 532 |
| 15 | X-7 | Y-3 | Z-3 | R-1 (1.0) | S-2 | 532 |
| 16 | X-8 | Y-4 | Z-3 | R-2 (1.0) | S-1 | 532 |
| Example | | | | | | |
| 17 | I-5 | Y-6 | Z-4 | none | none | 830 |
| 18 | I-9 | Y-6 | Z-4 | none | none | 830 |
| 19 | I-22 | Y-6 | Z-5 | none | S-4 | 830 |
| 20 | I-28 | Y-7 | Z-5 | none | S-4 | 830 |
| 21 | I-37 | Y-7 | Z-5 | none | S-5 | 830 |
| 22 | I-45 | Y-8 | Z-4 | none | none | 830 |
| 23 | I-5 | Y-7 | Z-5 | R-3 (1.0) | none | 830 |
| 24 | I-45 | Y-7 | Z-5 | R-3 (1.0) | none | 830 |
| Comparative Example | | | | | | |
| 17 | X-13 | Y-6 | Z-4 | none | none | 830 |
| 18 | X-2 | Y-6 | Z-4 | none | none | 830 |
| 19 | X-14 | Y-6 | Z-5 | none | S-4 | 830 |
| 20 | X-15 | Y-7 | Z-5 | none | S-4 | 830 |
| 21 | X-16 | Y-7 | Z-5 | none | S-5 | 830 |
| 22 | X-17 | Y-8 | Z-4 | none | none | 830 |
| 23 | X-13 | Y-7 | Z-5 | R-3 (1.0) | none | 830 |
| 24 | X-17 | Y-7 | Z-5 | R-3 (1.0) | none | 830 |

TABLE D

| | Evaluation Result | |
|---|---|---|
| | Sensitivity (mJ/cm$^2$) | Preservation Stability (energy ratio) |
| Example | | |
| 1 | 0.05 | 1.05 |
| 2 | 0.06 | 1.05 |
| 3 | 0.05 | 1.1 |
| 4 | 0.06 | 1.1 |
| 5 | 0.06 | 1.1 |
| 6 | 0.07 | 1.1 |
| 7 | 0.05 | 1.1 |
| 8 | 0.05 | 1.1 |
| Comparative example | | |
| 1 | 0.2 | 2.5 |
| 2 | 0.2 | 3.0 |
| 3 | 0.2 | 2.0 |
| 4 | 0.2 | 2.0 |
| 5 | 0.2 | 2.5 |
| 6 | 0.15 | 1.5 |
| 7 | 0.2 | 2.5 |
| 8 | 0.3 | 2.5 |
| Example | | |
| 9 | 0.1 | 1.0 |
| 10 | 0.1 | 1.05 |
| 11 | 0.15 | 1.0 |
| 12 | 0.1 | 1.05 |
| 13 | 0.15 | 1.05 |
| 14 | 0.1 | 1.1 |
| 15 | 0.15 | 1.05 |
| 16 | 0.1 | 1.1 |
| Comparative example | | |
| 9 | 0.3 | 1.5 |
| 10 | 0.3 | 1.5 |
| 11 | 0.2 | 2.0 |
| 12 | 0.3 | 1.5 |
| 13 | 0.2 | 1.2 |
| 14 | 0.2 | 1.3 |
| 15 | 0.5 | 1.5 |
| 16 | 0.5 | 1.5 |
| Example | | |
| 17 | 110 | 1.1 |
| 18 | 100 | 1.0 |
| 19 | 120 | 1.0 |
| 20 | 110 | 1.0 |
| 21 | 100 | 1.1 |
| 22 | 110 | 1.0 |
| 23 | 100 | 1.0 |
| 24 | 100 | 1.1 |
| Comparative example | | |
| 17 | 200 | 2.0 |
| 18 | 250 | 1.5 |
| 19 | 150 | 1.5 |
| 20 | 200 | 1.5 |
| 21 | 200 | 1.3 |
| 22 | 200 | 1.3 |
| 23 | 150 | 2.0 |
| 24 | 150 | 1.3 |

Compounds shown in Table C:
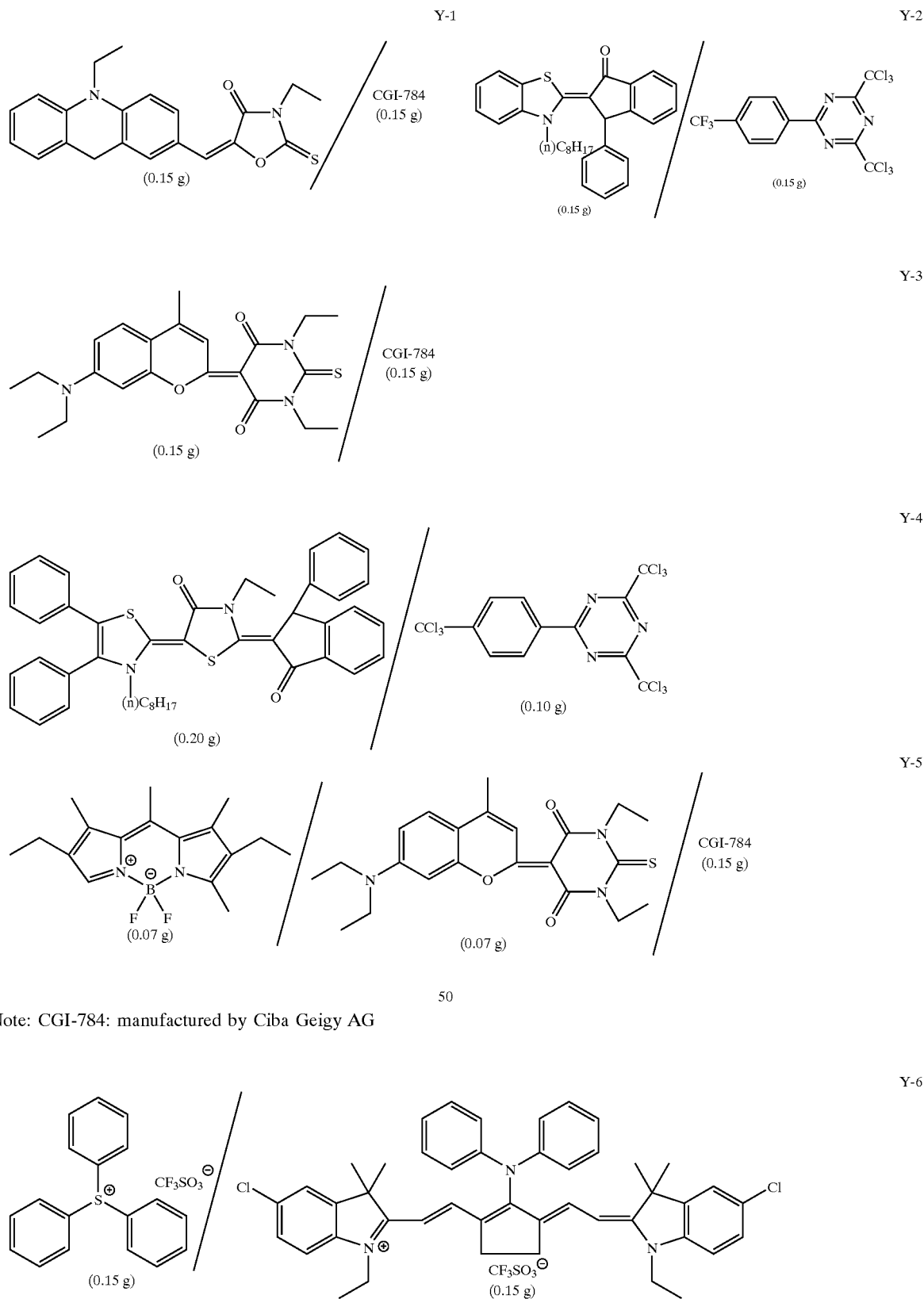
Note: CGI-784: manufactured by Ciba Geigy AG -continued
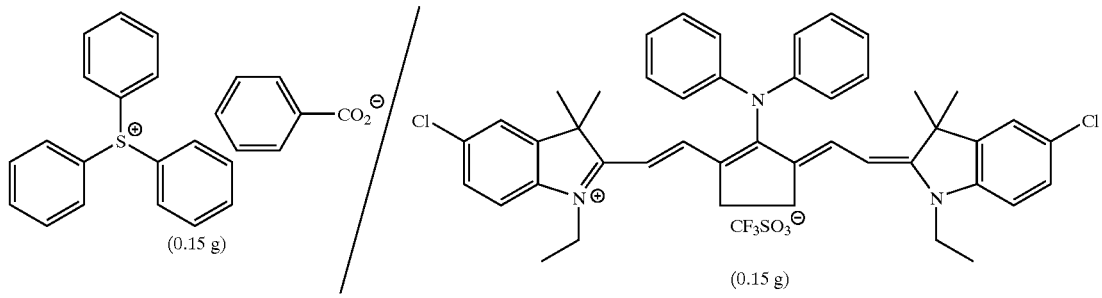
Y-7
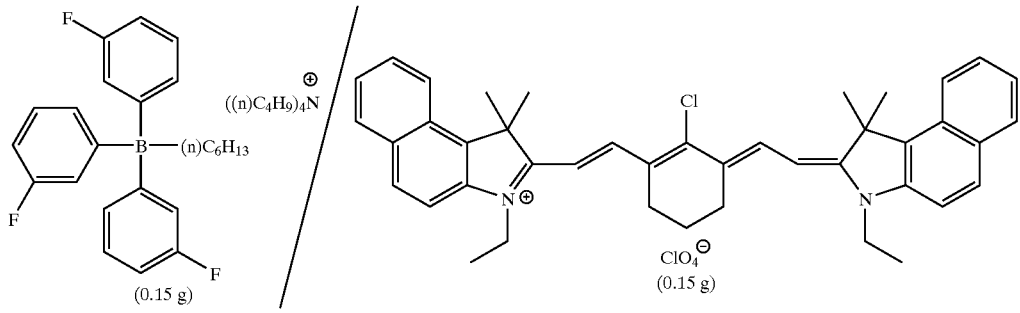
Y-8
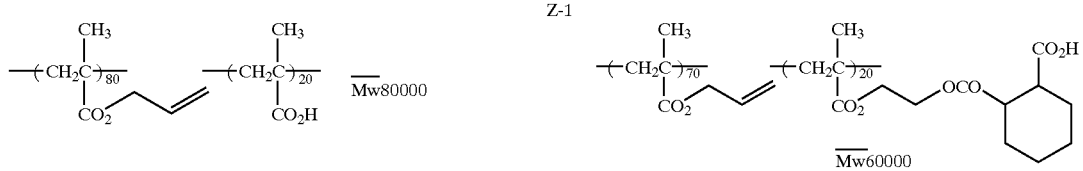
Z-1  Z-2
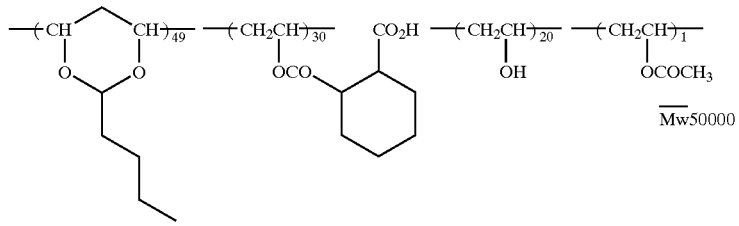
Z-3
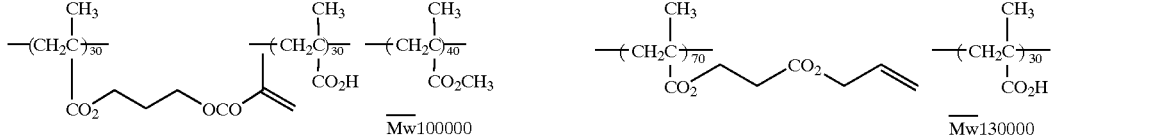
Z-4  Z-5
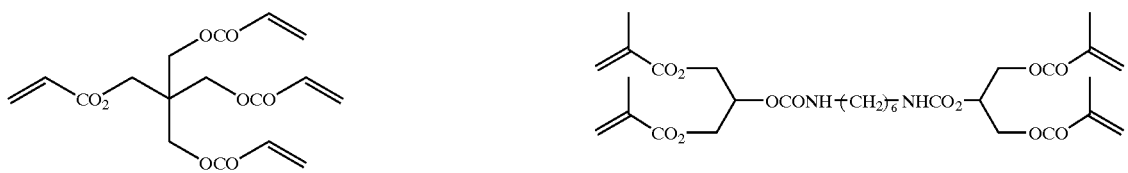
R-1  R-2
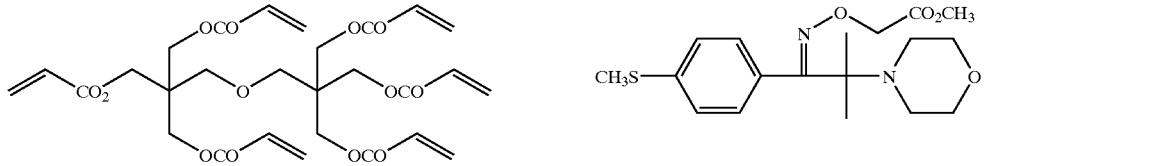
R-3  S-1

-continued
S-2
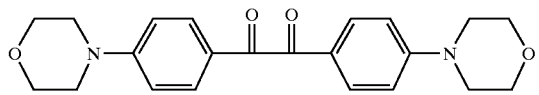
S-3
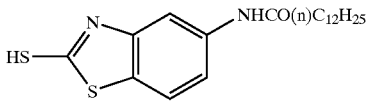
S-4
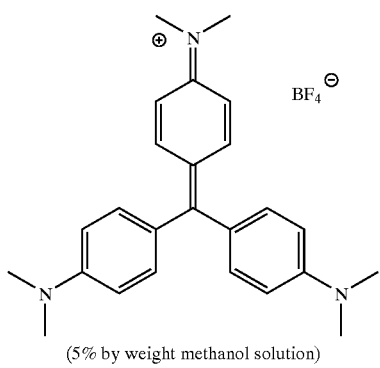
(5% by weight methanol solution)
S-5
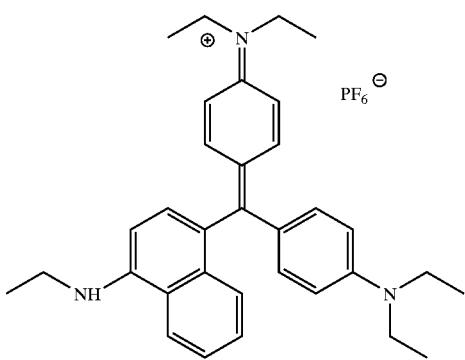
(5% by weight methanol solution)
X-1
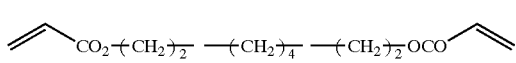
X-2
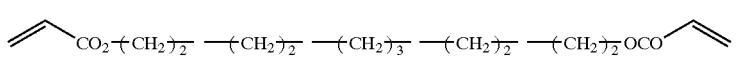
X-3
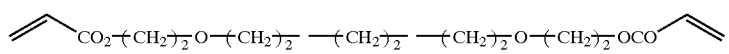
X-4
X-5
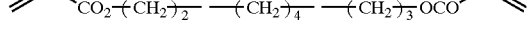
X-6
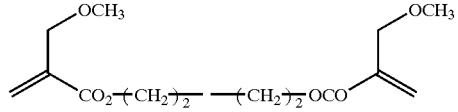
X-7
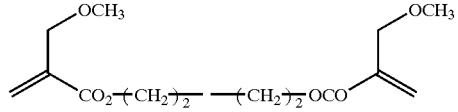
X-8
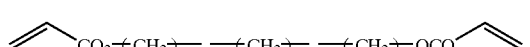
X-9
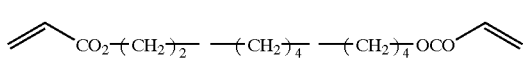
X-10
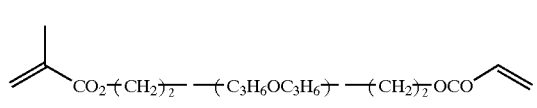
X-11
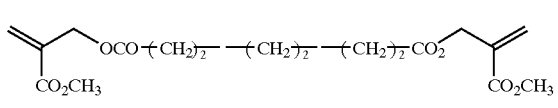
X-12
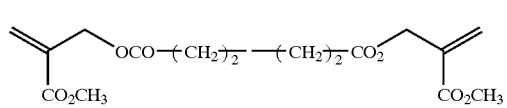
X-13
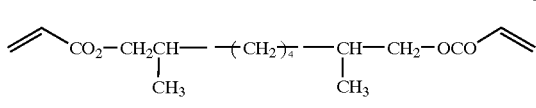
X-14
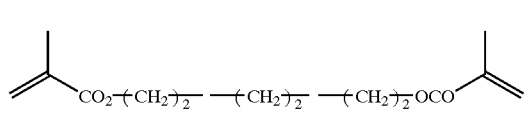
X-15
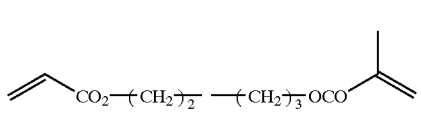
X-16
X-17
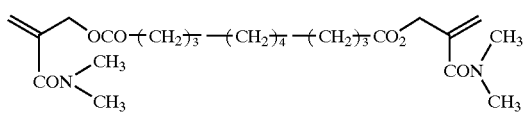

As is apparent from the results shown in Table D, the lithographic printing plate precursor using the photopolymerizable composition according to the present invention exhibits the high sensitivity and good preservation stability.

As described above, the photopolymerizable composition containing the difunctional crosslinking agent represented by formula (I) according to the present invention can splendidly satisfy both high sensitivity and excellent preservation stability, among a photo-radical polymerizable composition that is promising in image forming techniques due to the highest sensitivity. Further, a photopolymerizable composition suitable for a printing plate precursor capable of performing direct plate-making based on digital data, for example, from a computer by recording using a solid laser or semiconductor laser radiating an ultraviolet ray, visible light or infrared ray is provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A plate-making method of a printing plate comprising exposing a printing plate precursor comprising an aluminum support provided thereon with a photosensitive layer comprising a photopolymerizable composition containing (i) a crosslinking agent having two ethylenic polymerizable groups and (ii) a crosslinking agent having three or more ethylenic polymerizable groups to a laser having a wavelength of from 350 to 1,200 nm, and development processing the exposed printing plate precursor with an alkali developer having a pH of not more than 12.5 wherein the alkali developer contains an inorganic alkali agent and a nonionic compound represented by the following formula (20):

$$A\text{-}W \qquad (20)$$

wherein A represents a hydrophobic organic group having a log P of A-H of not less than 1.5; and W represents a nonionic hydrophilic group having a log P of W-H of less than 1.0.

2. A plate-making method of a printing plate comprising exposing a printing plate precursor having a photosensitive layer comprising a photopolymerizable composition containing (i) a crosslinking agent having two ethylenic polymerizable groups, (ii) a crosslinking agent having three ethylenic polymerizable groups and (iii) a crosslinking agent having 4 to 8 ethylenic polymerizable groups and satisfying a ratio of the crosslinking agents represented by formulae (A) and (B) shown below, and development processing the exposed printing plate precursor with an alkali developer having a pH of not more than 12.5.

$$a+b+c=100 \qquad (A)$$

$$0.4 \leq a/(b+c) \leq 3.0 \qquad (B)$$

wherein a represents % by weight of the crosslinking agent of (i), b represents % by weight of the crosslinking agent of (ii), and c represents % by weight of the crosslinking agent of (iii).

3. A plate-making method of a printing plate comprising exposing a printing plate precursor having a photosensitive layer comprising a photopolymerizable composition containing (i) a crosslinking agent having two ethylenic polymerizable groups and (ii) a crosslinking agent having three or more ethylenic polymerizable groups, and development processing the exposed printing plate precursor with an alkali developer having a pH of not more than 12.5, wherein the crosslinking agent of (i) is a compound represented by the following formula (I):

wherein $Q^1$ and $Q^2$ each independently represent a group represented by formula (a) or (b) shown below, and R represents a linking group represented by formula (c) shown below:

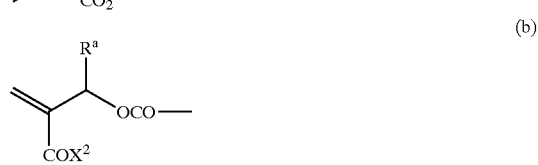

$$\text{-}R^1\text{-}T^1\text{-}R^2\text{-}T^2\text{-}R^3\text{-}T^3\text{-}R^4\text{-}T^4\text{-}R^5\text{-} \qquad (c)$$

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —$CO_2$—, —CO—, —$OCO_2$— or a single bond, provided that all of $T^1$ to $T^4$ do not represent single bonds, and $R^a$ and $R^b$ each independently represent a hydrogen atom or a hydrocarbon group.

4. The plate-making method of a printing plate as claimed in claim 2, wherein the crosslinking agent of (i) is a compound represented by the following formula (I):

$$Q^1\text{-}R\text{-}Q^2 \qquad (I)$$

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—).

5. The plate-making method of a printing plate as claimed in claim 4, wherein $Q^1$ and $Q^2$ in formula (I) each independently represent a group represented by formula (a) or (b) shown below, and R in formula (I) represents a linking group represented by formula (c) shown below:

-continued

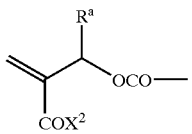
(b)

$-R^1-T^1-R^2-T^2-R^3-T^3-R^4-T^4-R^5-$ (c)

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —CO$_2$—, —CO—, —OCO$_2$— or a single bond, provided that all of $T^1$ to $T^4$ do not represent single bonds, and $R^a$ and $R^b$ each independently represent a hydrogen atom or a hydrocarbon group.

6. The plate-making method of a printing plate as claimed in claim 3, wherein the photopolymerizable composition further comprises a photopolymerization initiator.

7. The plate-making method of a printing plate as claimed in claim 6, wherein the photopolymerization initiator is a compound selected from (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

8. The plate-making method of a printing plate as claimed in claim 3, wherein the photopolymerizable composition further comprises a linear organic high molecular polymer.

9. The plate-making method of a printing plate as claimed in claim 3, wherein the photopolymerizable composition further comprises a sensitizing dye.

10. The plate-making method of a printing plate as claimed in claim 3, wherein the printing plate precursor has a protective layer on the photosensitive layer.

11. The plate-making method of a printing plate as claimed in claim 3, wherein the printing plate precursor is exposed using a laser as a light source of the exposure.

12. The plate-making method of a printing plate as claimed in claim 3, wherein the alkali developer is a non-silicate type developer.

13. A plate-making method of a printing plate comprising exposing a printing plate precursor having a photosensitive layer comprising a photopolymerizable composition containing (i) a crosslinking agent having two ethylenic polymerizable groups and (ii) a crosslinking agent having three or more ethylenic polymerizable groups, and development processing the exposed printing plate precursor with an alkali developer having a pH of not more than 12.5, wherein the crosslinking agent of (i) is a compound represented by the following formula (I):

$$Q^1\text{-R-}Q^2 \qquad (I)$$

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—) wherein the alkali developer contains an inorganic alkali agent and a nonionic compound represented by the following formula (20):

$$\text{A-W} \qquad (20)$$

wherein A represents a hydrophobic organic group having a log P of A-H of not less than 1.5; and W represents a nonionic hydrophilic group having a log P of W-H of less than 1.0.

14. A plate-making method of a printing plate comprising exposing a printing plate precursor having a photosensitive layer comprising a photopolymerizable composition containing (i) a crosslinking agent having two ethylenic polymerizable groups and (ii) a crosslinking agent having three or more ethylenic polymerizable groups, and development processing the exposed printing plate precursor with an alkali developer having a pH of not more than 12.5, wherein the alkali developer contains an inorganic alkali agent and a nonionic compound represented by the following formula (20):

$$\text{A-W} \qquad (20)$$

wherein A represents a hydrophobic organic group having a log P of A-H of not less than 1.5; and W represents a nonionic hydrophilic group having a log P of W-H of less than 1.0.

15. The plate-making method of a printing plate as claimed in claim 14, wherein the photopolymerizable composition further comprises a photopolymerization initiator.

16. The plate-making method of a printing plate as claimed in claim 15, wherein the photopolymerization initiator is a compound selected from (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

17. The plate-making method of a printing plate as claimed in claim 4, wherein the photopolymerizable composition further comprises a linear organic high molecular polymer.

18. The plate-making method of a printing plate as claimed in claim 14, wherein the photopolymerizable composition further comprises a sensitizing dye.

19. The plate-making method of a printing plate as claimed in claim 14, wherein the printing plate precursor has a protective layer on the photosensitive layer.

20. The plate-making method of a printing plate as claimed in claim 14, wherein the printing plate precursor is exposed using a laser as a light source of the exposure.

21. The plate-making method of a printing plate as claimed in claim 14, wherein the alkali developer is a non-silicate type developer.

22. The plate-making method of a printing plate as claimed in claim 1, wherein the crosslinking agent of (i) is a compound represented by the following formula (I):

$$Q^1\text{-R-}Q^2 \qquad (I)$$

wherein $Q^1$ and $Q^2$ each represent a radical polymerizable terminal group, and R represents a divalent hydrocarbon linking group containing at least one member selected from the group consisting of an ester linking group (—OC(=O)—), a carbonic acid ester linking group (—OC(=O)O—) and a carbonyl linking group (—C(=O)—).

23. The plate-making method of a printing plate as claimed in claim 22, wherein $Q^1$ and $Q^2$ in formula (I) each independently represent a group represented by formula (a) or (b) shown below, and R in formula (I) represents a linking group represented by formula (c) shown below:

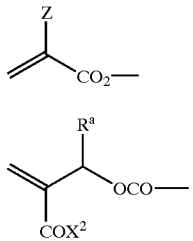

(a)

(b)

-$R^1$-$T^1$-$R^2$-$T^2$-$R^3$-$T^3$-$R^4$-$T^4$-$R^5$- (c)

wherein Z represents H, $CH_3$, $CHR^bX^1$, $X^1$ and $X^2$ each independently represent a substituted oxy group, a substituted amino group or a substituted thio group, $R^1$ to $R^5$ each independently represent an aliphatic hydrocarbon linking group which may contain an oxygen atom or a single bond, provided that all of $R^1$ to $R^5$ do not represent single bonds, $T^1$ to $T^4$ each independently represent —OCO—, —$CO_2$—, —CO—, —$OCO_2$— or a single bond, provided that all of $T^1$ to $T^4$ do not represent single bonds, and $R^a$ and $R^b$ each independently represent a hydrogen atom or a hydrocarbon group.

24. The plate-making method of a printing plate as claimed in claim 1, wherein the photopolymerizable composition further comprises a photopolymerization initiator.

25. The plate-making method of a printing plate as claimed in claim 4, wherein the photopolymerization initiator is a compound selected from (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

26. The plate-making method of a printing plate as claimed in claim 1, wherein the photopolymerizable composition further comprises a linear organic high molecular polymer.

27. The plate-making method of a printing plate as claimed in claim 1, wherein the photopolymerizable composition further comprises a sensitizing dye.

28. The plate-making method of a printing plate as claimed in claim 1, wherein the printing plate precursor has a protective layer on the photosensitive layer.

29. The plate-making method of a printing plate as claimed in claim 1, wherein the printing plate precursor is exposed using a laser as a light source of the exposure.

30. The plate-making method of a printing plate as claimed in claim 1, wherein the alkali developer is a non-silicate type developer.

31. The plate-making method of a printing plate as claimed in claim 3, wherein the printing plate precursor comprises an aluminum support provided thereon with the photosensitive layer.

* * * * *